United States Patent
Yoshioka et al.

[11] Patent Number: 5,835,963
[45] Date of Patent: Nov. 10, 1998

[54] PROCESSOR WITH AN ADDRESSABLE ADDRESS TRANSLATION BUFFER OPERATIVE IN ASSOCIATIVE AND NON-ASSOCIATIVE MODES

[75] Inventors: Shinichi Yoshioka, Kodaira; Susumu Narita, Kokubunji; Ikuya Kawasaki, Kodaira; Saneaki Tamaki, Higashimurayama, all of Japan

[73] Assignee: Hitachi, Ltd., Tokyo, Japan

[21] Appl. No.: 524,791

[22] Filed: Sep. 7, 1995

[30] Foreign Application Priority Data

| Sep. 9, 1994 | [JP] | Japan | 6-241992 |
| Mar. 20, 1995 | [JP] | Japan | 7-087555 |
| Aug. 25, 1995 | [JP] | Japan | 7-240873 |

[51] Int. Cl.$^6$ ................................................ G60F 12/02
[52] U.S. Cl. ................................. 711/207; 365/49
[58] Field of Search ........................ 395/416, 417, 395/450; 365/49; 711/206, 207, 123

[56] References Cited

U.S. PATENT DOCUMENTS

| 4,580,240 | 4/1986 | Watanabe | 364/900 |
| 5,299,147 | 3/1994 | Holst | 365/49 |
| 5,375,216 | 12/1994 | Moyer | 395/450 |
| 5,454,091 | 9/1995 | Sites | 395/413 |
| 5,539,892 | 7/1996 | Reininger | 395/417 |
| 5,606,687 | 2/1997 | Mehring | 395/466 |

FOREIGN PATENT DOCUMENTS

| 529217 A1 | 3/1993 | European Pat. Off. | G06F 12/08 |
| 8809008 | 11/1988 | WIPO | G06F 12/08 |

*Primary Examiner*—Tod R. Swann
*Assistant Examiner*—Christopher Chow
*Attorney, Agent, or Firm*—Loudermille & Associates

[57] ABSTRACT

A data processor supporting associative writing and comprising an associative memory and a central processing unit, the associative memory being furnished in the address space managed by the central processing unit. Any of the entries in the memory is accessed when the address of the entry in question in the address space is designated. With associative writing supported, data is allowed to be written to the designated address if the searched address information retained in the entry at the designated address matches the corresponding information held in the write data upon comparison. The write data is inhibited from being written to the designated address in case of a mismatch between the two kinds of information.

32 Claims, 34 Drawing Sheets

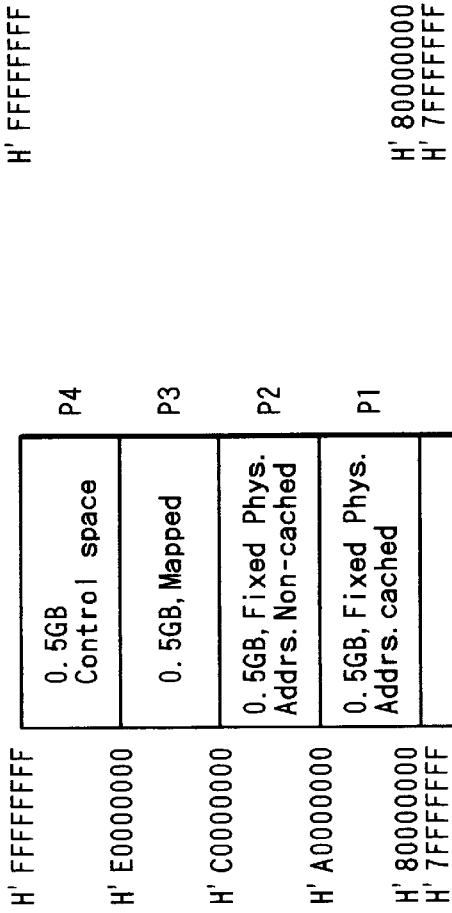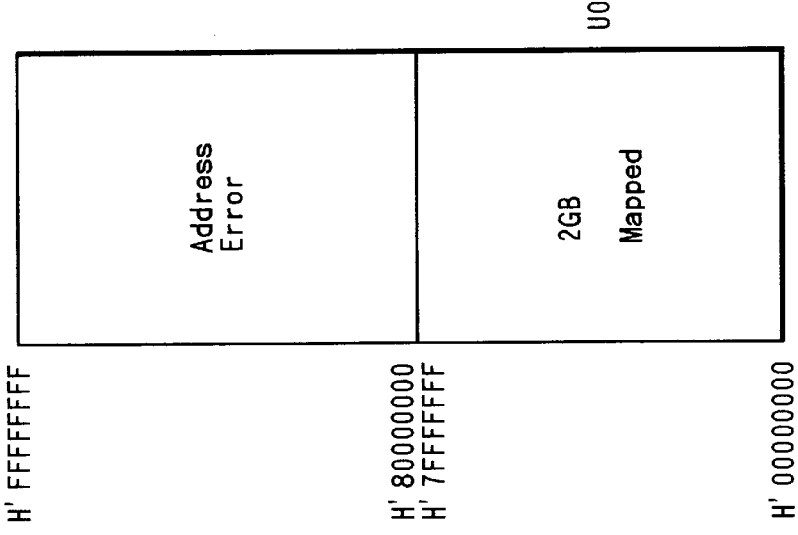

FIG. 4

LOGICAL ADDRESS (PAGE SIZE 1KB)

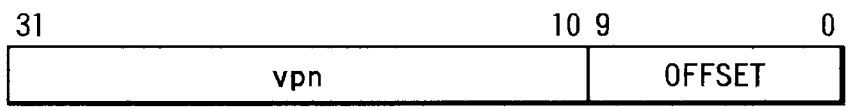

LOGICAL ADDRESS (PAGE SIZE 4KB)

TLB ENTRY

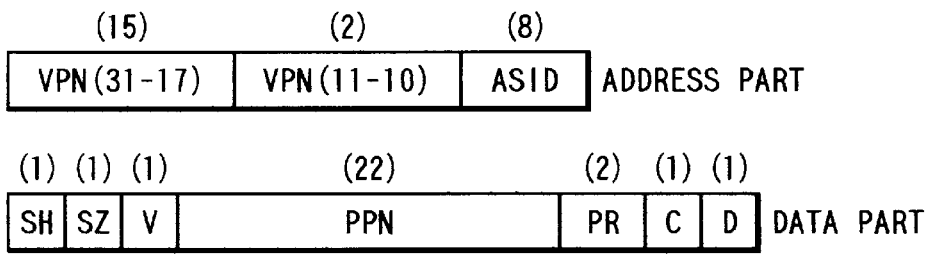

```
vpn, VPN : Virtual Page Number
ASID     : Address Space Identifier
PPN      : Physical Page Number
V        : Valid; 1=valid, 0=invalid
SH       : Share status bit
           ; 0=page not shared between processes
           ; 1=page shared between processes
D        : Dirty bit, indicates if the page has been written to,
           1=written to, 0=not written to
C        : Cacheable bit
           ; 1=cacheable, 0=non-cacheable
PR       : Protection key field, 2-bit field encoded to define
           the access rights to the page
SZ       : Page size bit
           ;1=4-KB page, 0=1-KB page
```

CACHE ENTRY

V : Valid bit, indicates if entry is valid
; 1=valid, 0=invalid

Addrs.Tag : Bits 31-10 of the physical address of the entry.

U : Update bit, indicates if cache line has been written to ; 1=written to, 0=not written to L : LRU field, encoded in accordance with least-recentry-used algorithm for entry replacement.

FIG. 12

Memory mapped CACHE (1) ACCESS TO THE ADDRESS ARRAY a. ADDRESS FORMAT

READ ACCESS: `31 | 11110000 | 23 - 12 | W | 10 ENTRY 3 | - | 0`

WRITE ACCESS: `31 | 11110000 | 23 - 12 | W | 10 ENTRY 3 | A | 0` b. DATA FORMAT: `31 TAG(31-10) 9 LRU 3 | - | U | V 0`

(2) ACCESS TO THE DATA ARRAY (COMMON TO READ AND WRITE)

a. ADDRESS FORMAT: `31 | 11110001 | 23 - 12 | W | 10 ENTRY 3 | LS | 0` b. DATA FORMAT: `31 DATA 0`

FIG. 14

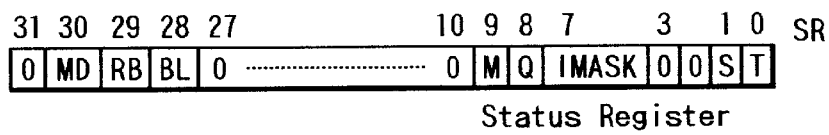

Status Register

| | |
|---|---|
| T bit | : Indicating a carry, borrow, overflow, or underflow |
| S bit | : Used by the MAC instruction |
| IMASK | : 4-bit field indicating the interrupt request mask level |
| M & Q bits | : Used by the DIV0 U/S and DIV1 instructions |
| RB | : Register bank bit, used to define the general-purpose registers in privileged mode. A logic one designates R0~R7(BANK1) and R8~R15 are accessed as general-purpose register, and R0~R7(BANK0) are only accessed by LDC/STC instructions; and A logic zero designates R0~R7(BANK0) and R8~R15 are accessed as general-purpose register, and R0~R7(BANK1) are only accessed by LDC/STC instructions |
| BL | : Block bit, used to mask exceptions in privileged mode, as follows;<br>BL=1, exceptions are masked (not accepted)<br>BL=0, exceptions are accepted |
| MD | : Processor Operation Mode bit, indicates the processor operation mode, as follows;<br>1=Privileged mode<br>0=User mode |

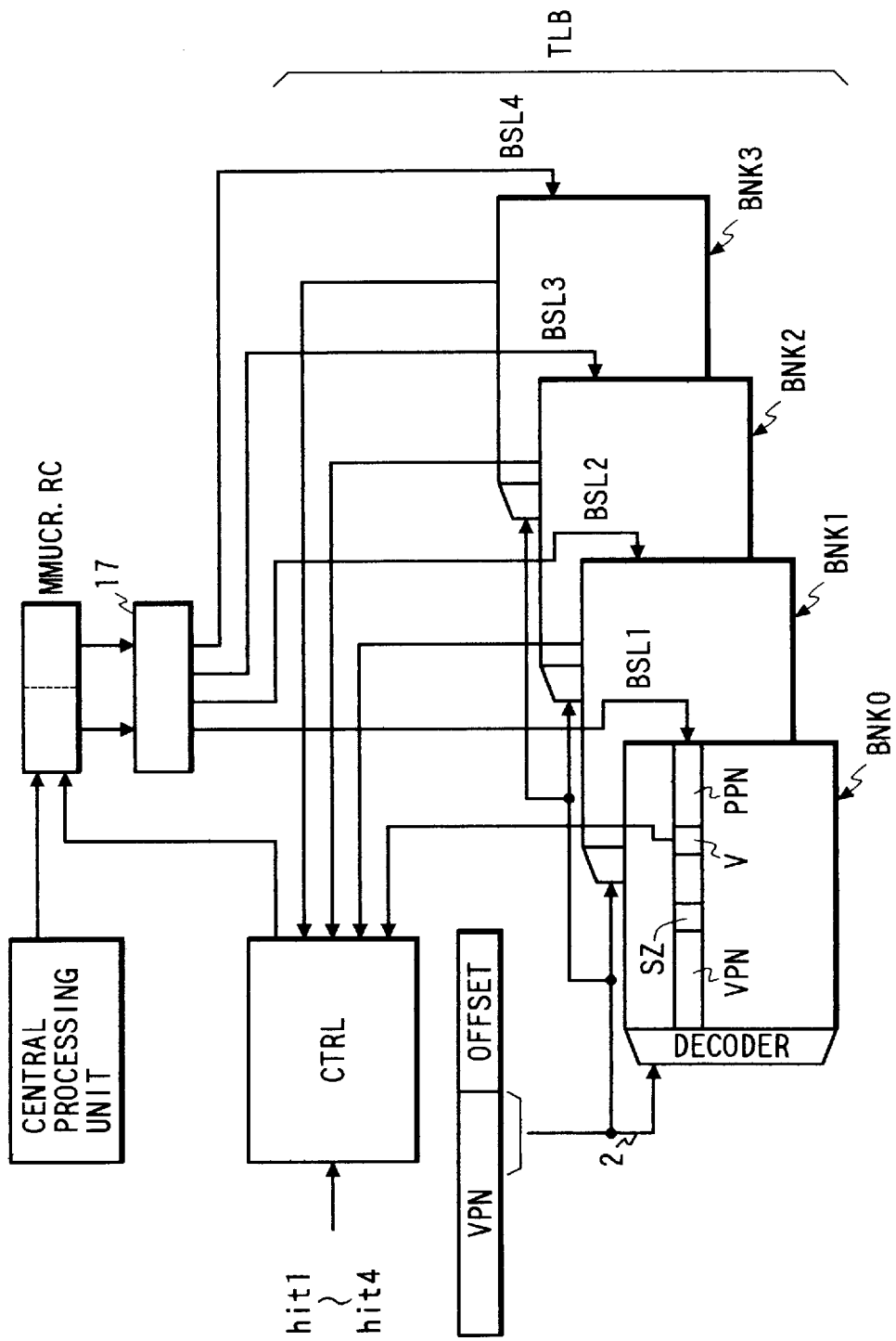

FIG. 19

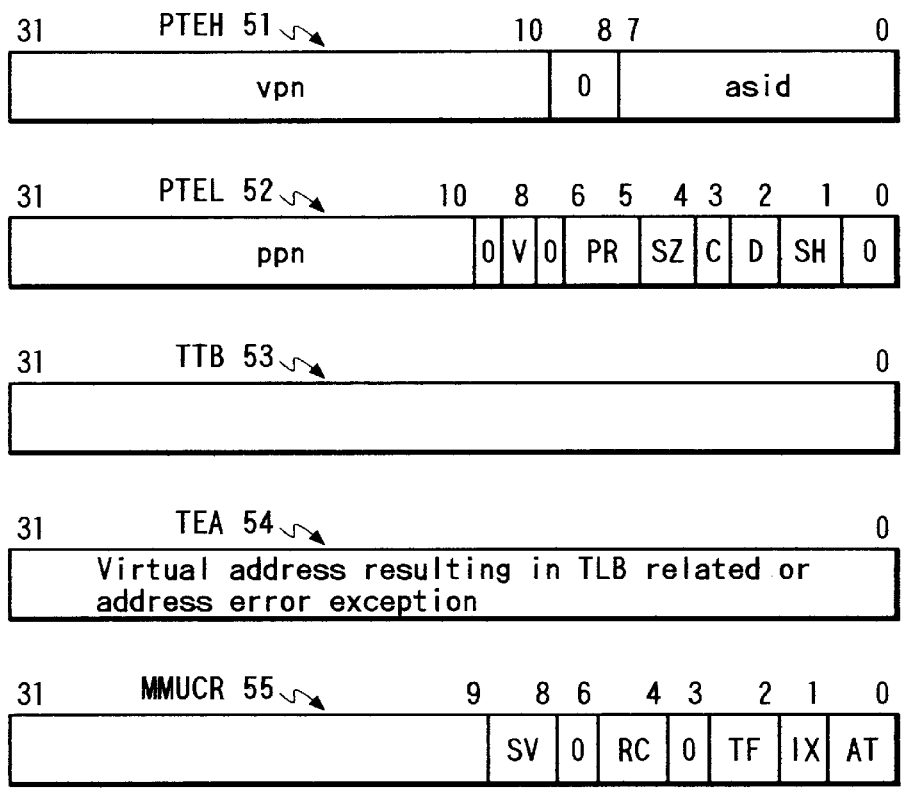

- AT : Address Translation bit ; 1=enable, 0=disamele
- TF : TLB Flush bit ; 1=Flush TLB, 0=no operation and always should be read as 0.
- RC : Random counter field, a 2-bit counter incremented by one every TLB miss by the processor. Software can set required value to this field.
- IX : Index mode bit ; a logic one designates that bits 4-0 of the ASID and bits 16-12 of the VPN are used to index the TLB. a logic zero designates that bits 16-12 of the VPN are used to index the TLB.
- SZ : page size bit ; 1=4-KB page, 0=1-KB page
- SV : Single virtual bit ; 1=single virtual support, 0=Multiple virtual support

FIG. 21

ACCESS RIGHT

| PR | ALLOWED ACCESS | | REMARKS |
|---|---|---|---|
| | PRIVILEGED MODE | USER MODE | |
| 00 | READ ONLY | NO ACCESS | PRIVILEGED MODE ONLY |
| 01 | READ/WRITE | NO ACCESS | |
| 10 | READ ONLY | READ ONLY | USER WRITE FAULT |
| 11 | READ/WRITE | READ/WRITE | NORMAL ACCESS |

SUB-FLOW OF TLB CONTROL
; TLB INDEX

SUB-FLOW OF TLB CONTROL; PROTECTION asid: ADDRESS SPACE IDENTIFIER IN PTEH AT THE TIME OF ACCESS

ASID: ADDRESS SPACE IDENTIFIER READ FROM TLB

SUB-FLOW OF TLB CONTROL
; PHYSICAL ADDRESS GENERATION pa = PHYSICAL ADDRESS
va = LOGICAL ADDRESS
PPN = PHYSICAL PAGE NUMBER READ FROM TLB

SUB-FLOW OF TLB CONTROL;
DESIGNATION BY HARDWARE OF
TLB SET FOR REPLACEMENT

FIG. 31

SINGLE VIRTUAL STORAGE VS MULTIPLE VIRTUAL STORAGE

|  | SINGLE VIRTUAL STORAGE | MULTIPLE VIRTUAL STORAGE |
|---|---|---|
| LOGICAL SPACE | DIVIDED FOR USE BY INDIVIDUAL PROCESSES | SHARED BY ALL PROCESSES |
| TRANSLATION INFORMATION | ONE PIECE OF INFORMATION COMMON TO ALL PROCESSES | INDIVIDUAL INFORMATION FOR EACH PROCESS |
| PROTECTION (USER MODE) | PAGE SHARED ; AS PER PR<br>PAGE NOT SHARED ; THE PAGE FOR THE CURRENT PROCESS IS ACCESSED AS PER THE PR. THE PAGE FOR ANY OTHER PROCESS IS PROTECTED AGAINST ACCESS. | AS PER PR |
| PROTECTION (PRIVILEGED MODE) | AS PER PR | AS PER PR |

PR : PROTECTION INFORMATION INCLUDED IN THE ADDRESS TRANSLATION IN THE TLB OR MEMORY

FIG. 32(A)
MULTIPLE VIRTUAL STORAGE
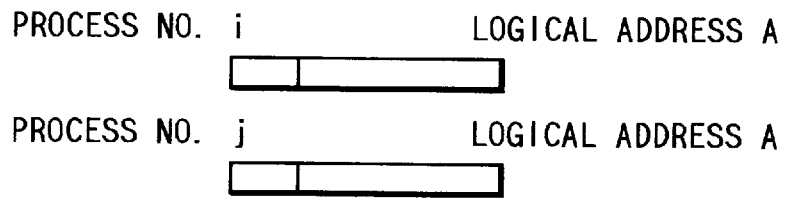
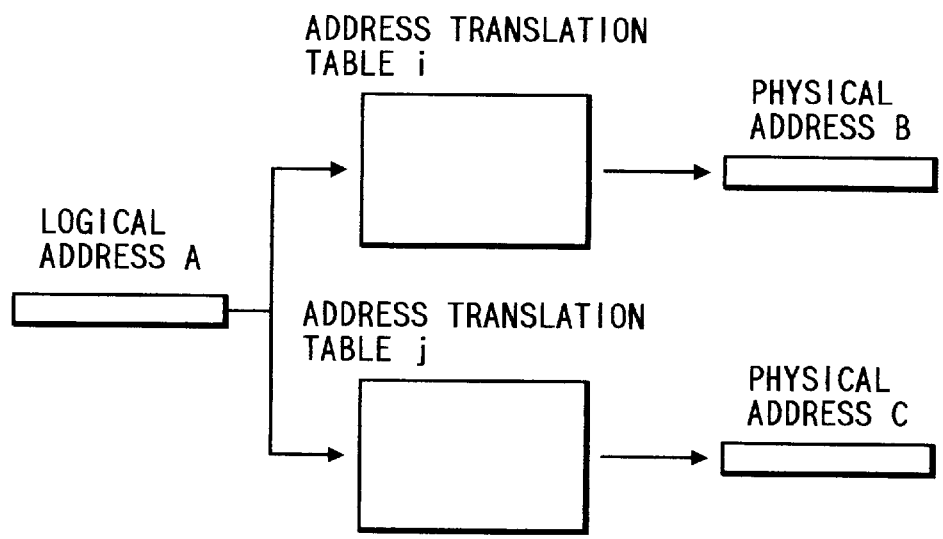
FIG. 32(B)
SINGLE VIRTUAL STORAGE
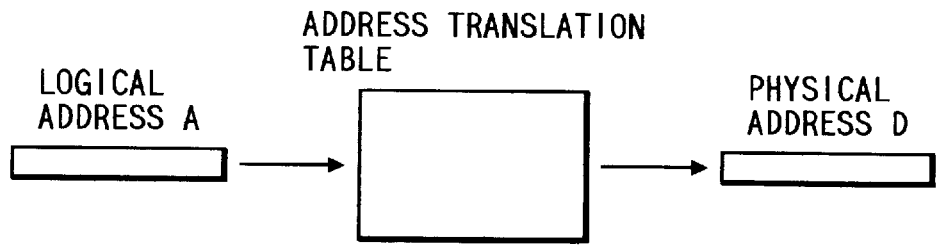

PROCESSOR WITH AN ADDRESSABLE ADDRESS TRANSLATION BUFFER OPERATIVE IN ASSOCIATIVE AND NON-ASSOCIATIVE MODES

BACKGROUND OF THE INVENTION

The present invention relates to a data processor comprising a cache memory and an address translation buffer. More particularly, the invention relates to a data processor such as a microcomputer incorporating techniques whereby common data transfer instructions are allowed to access the cache memory and address translation buffer and whereby the data storage capacity of the cache memory is increased in excess of a virtual storage minimum page size.

In applications where the operating system (OS) performs memory management without users becoming aware of a real memory environment, the data processor running under that OS needs to support an address translation feature. The address translation feature is a feature that translates into a physical address each logical address generated by a central processing unit (CPU) in implementing virtual storage. There exists the so-called address translation look-aside buffer (TLB) that retains logical-physical address translation pairs whereby the address translation feature is executed at high speed. Conventionally, the TLB is incorporated in the data processor along with the CPU. The address translation buffer is composed illustratively of an associative buffer memory that holds recently used logical-physical address translation pairs. In order to improve the hit rate of the associative buffer memory, the so-called set associative memory with a plurality of sets of banks may be adopted. In the event of a TLB miss in the address translation buffer, a new entry pertaining to the miss is added to the buffer. Then valid bits representing entries are referenced to see if the entry in each of the indexed banks is valid. If an invalid entry exists, that entry is replaced. If the check on the valid bits reveals that all entries are valid, relevant entries are updated according to appropriate logic such as LRU (least recently used) logic. As outlined, the address translation buffer requires executing write access operations for entry update and read access operations for valid bit verification in addition to the usual address translation of an associative memory. Each of these access operations must be carried out by designating the relevant entry in each of the banks.

With the large-capacity, low-speed memory illustratively made up of a DRAM, it is required to reduce the frequency of access thereto in order to raise the speed of data access operations thereon. The requirement is being met extensively by a conventional technique whereby the data expected to be used frequently by that memory is held in a cache memory composed of a small-capacity, high-speed memory such as an SRAM. Such a cache memory, too, may be furnished as an associative buffer memory holding recently used data paired with address information indicating the locations of the data. The hit rate of the cache memory may be boosted by building the memory as a set associative memory with a plurality of sets of banks. In the event of a miss in the cache memory, a new entry pertaining to that miss is added to the memory. At this point, valid bits representing entries are referenced to see if the entry of each of the indexed banks is valid. If an invalid entry is found to exist, that entry is replaced. If all entries are found to be valid, appropriate entries are updated in accordance with predetermined logic such as LRU logic. As outlined, the associative cache memory also requires executing write access operations for entry update and read access operations for valid bit verification in addition to the usual associative operation. Each of these access operations must also be carried out by designating the relevant entry in each of the banks.

The cache memory may be regarded as a primary storage, and the main memory as a secondary memory. In this setup, the data shared by the two memories must be consistent therebetween. Where a cache memory entry is updated upon a hit during a write access operation, the content of the entry is written back to the secondary memory in one of two methods: write through method and write back method. The write through method involves updating the cache memory while writing the applicable data to the secondary memory at the same time. Under the write back method, after the cache memory is updated during a write access operation, the updated memory content is written back to the external memory at a subsequent cache miss that causes the entry to be replaced by a new entry. According to the write back method, the address of the entry write back destination must be generated using two kinds of information: physical page address information contained in the address tag of what is known as a cache line to be written back, and logical address information pertaining to the cache miss.

The associative buffer memory is described illustratively in a Japanese publication "Ultra High-Speed MOS Devices" published by Baifu-Kan Ltd., on Feb. 10, 1986 (pp. 287–288).

The operations for invalidating entries in an associative memory such as an address translation buffer and a cache memory are different from associative operations. If the invalidating operations are implemented by resorting to dedicated instructions, the types of the instruction codes employed are bound to increase. A greater number of instruction code types in use means an increasing number of the bits dedicated to the instruction codes. This requires enlarging the scope of instruction decoder logic for decoding the instructions in the CPU.

SUMMARY OF THE INVENTION

The inventors of the present invention thus found it necessary to deal effectively with constraints of the microcomputer architecture calling for shorter instruction words. The requirement would be met, it occurred to the inventors, by having the address translation buffer and cache memory accessed for write and read operations thereto and therefrom using common data transfer instructions such as the MOV instruction.

The inventors of the present invention also studied the relationship between the page size of virtual storage and the data storage capacity per bank (i.e., per way or per set) of the cache memory. In an associative operation, the data storage capacity of a single bank determines the number of address bits needed to select a cache line in the cache memory and to select unit data for access from an entry of the selected cache line. This means that the remaining bits in an access address signal other than the address bits above are subject to a compare operation with entry address tags. At this point, if the data storage capacity of a single bank is less than the page size, an address tag always includes a physical page address. Conversely, if the page size is less than the data storage capacity of one bank, each address tag need not include the entire physical page address in view of the associative operation of the cache memory. In such cases, under the write back method, the address of the destination to which to write the entry for replacement by a new entry must make use of the information of the address tag for the entry in question. Thus in a cache memory wherein the data storage capacity of a single bank is greater than the minimum page size supported, the inventors found, the attempt to ensure write back operations requires getting the address tag of each cache entry to include a physical page address applicable to the minimum page size.

It is therefore an object of the present invention to provide a data processor for getting common data transfer instructions such as the MOV instruction to access associative memories (cache memory, address translation buffer) included in the cache unit and address translation unit, whereby entries are invalidated.

It is another object of the present invention to provide a data processor for ensuring write back operations where the data storage capacity of a single bank in a set associative cache memory is greater than the logical page size.

Other objects, features and advantages of the present invention will become apparent in the following specification and accompanying drawings.

Major aspects of the invention disclosed herein are outlined as follows:

A data processor according to one aspect of the invention comprises a CPU and a set associative address translation unit. The set associative address translation unit includes an associative memory acting as an address translation buffer and a controller for performing associative data write operations. The associative memory accommodates address translation entries and is located in the address space managed by the CPU, wherein an entry is made accessible when the applicable address in the address space is designated. The controller permits writing of data to the designated address in the address space when there is a match between searched address information held by the entry at the designated address and the corresponding information held by the write data; the controller inhibits writing of data in case of a mismatch.

A data processor according to another aspect of the invention comprises a CPU and a set associative cache unit. The set associative cache unit includes an associative memory acting as a cache memory and a controller for performing associative data write operations. The associative memory accommodates as entries address tags and the information corresponding thereto, and is located in the address space managed by the CPU, wherein an entry is made accessible when the applicable address in the address space is designated. The controller permits writing of data to the designated address in the address space when there is a match between searched address information held by the entry at the designated address and the corresponding information held by the write data; the controller inhibits writing of data in case of a mismatch.

In considering the writing of test pattern data in device test mode to its associative memory, the address translation unit or cache unit is allowed to determine whether or not to carry out the associative write operation. If the associative data write operation is not selected, the writing of data to the designated address is effected irrespective of the match or mismatch between searched address information held by the entry at the designated address and the corresponding information held by the write data. An address format may be adopted in which to locate a control bit in an appropriate field of the access address in the associative memory, the control bit being used to determine whether or not to select the associative data write operation.

A data processor according to a further aspect of the invention supports virtual storage by incorporating a set associative cache memory having a plurality of banks. In each bank, logical addresses are each indexed partially and physical addresses are each held in an address tag as searched address information. The cache memory is controlled by a write back method for writing the data of the updated entry to a secondary memory. Where the data storage capacity of each of the multiple banks is greater than the page size for address translation, write back operations are still guaranteed by the address tag having all bits of the physical page address corresponding to the entry in question. Upon search for the sake of implementing an associative operation, part of each address tag is used as searched address information. Upon a write back operation, all bits of the address tag are used to designate the physical page address of the destination to which to write back the data. For example, as shown in FIG. 11, suppose that one of the banks constituting the cache memory has a data storage capacity of 2 kilobytes (4 bytes×4×128). In that case, to designate unit data for access requires using low-order 11 bits (bits 10-0) out of a 32-bit logical address. The address for an associative compare operation is composed of bits 31-11. If the page size is 4 kilobytes, a page address is made of bits 31-12. If the page size is 1 kilobytes, a page address is designated by bits 31-10. With those cases taken into account, the address tag TAG has a physical page address PPN (bits 31-10) for the one-kilobyte page size. For a write back operation, the PPN (bits 31-10) in question is utilized unmodified as the physical page number representing the write back destination.

With the above constitution implemented, the address array of the cache memory CACHE-M is mapped in H'F0**** (H' means hexadecimal and an asterisk may be any number), the cache memory being an associative memory in the cache unit; the data array of the cache memory is mapped in H'F1**; the address array of the address translation buffer TLB is mapped in H'F2**, the TLB acting as an associative memory in the address translation unit; and the data array of the TLB is mapped in H'F3**, as shown in FIG. 1. The address format is determined so that the asterisk-filled part selects a line and a bank. The controller of the cache memory CACHE-M and address translation buffer TLB has logic circuits for receiving an address in that format and selecting the relevant bank and line accordingly. Given an address in the above format, any line of any bank may be addressed as desired for any address array and data array in both the cache memory CACHE-M and the address translation buffer TLB. This scheme makes it possible for the cache memory CACHE-M and address translation buffer TLB to be accessed by use of common data transfer instructions such as the MOV instruction that is included in almost every instruction set. In FIG. 1**, the cache memory CACHE-M or address translation buffer TLB is illustratively accessed for a read operation as follows: the address information for designating the target address from which to read data is first stored in a register R1 in the predetermined address format. Then executing a data transfer instruction MOV @R1, R0 causes the relevant data to be transferred from the target address in the cache memory CACHE-M or address translation buffer TLB to a register R0; the source address from which the relevant data is transferred is the target address held in the register R1. The cache memory CACHE-M or address translation buffer TLB is accessed for a write operation as follows: the address information for designating the target address to which to write data is first stored in the register R1 in the predetermined address format. Then executing a data transfer instruction MOV R0, @R1 causes the relevant data to be written to the address designated by the register R1 in the cache memory CACHE-M or address translation buffer TLB; the data written to the target address is retrieved from the register R0.

To support associative write operations requires that searched address information be checked as a condition for determining whether or not to permit the write operation apart from the usual designation of the address. This ensures the unfailing invalidation of entries.

To make associative write operations non-selectable provides the basis for carrying out a device test on the associative memory, the device test involving writing predetermined logical value data to the memory and then reading the data therefrom to see if the same logical value data is read out. For example, in FIG. 1, the associative write operation is selected when an association bit A included in an address is found to be a logical 1; the associative write operation is not selected when the association bit A is found to be a logical 0.

Where the data storage capacity of each of the banks constituting a cache memory is greater than a page size, the invention proposes the use of an address tag field with a size large enough to accommodate all bits of a physical page address corresponding to the page size in question. That is, physical address information is retained in the address tag field in excess of the number of bits necessary for an address compare operation. Although there is no need to include the entire physical page address in the address tag from the viewpoint of associative operations on the cache memory, the inventive scheme meets the requirement of generating an entry write destination address by use of the address tag information for the entry in question, the destination address being one to be replaced by a new entry under the write back method. These features make it possible to accomplish both the address compare operation and the write back operation on indexed cache entries in the face of an increasing data storage capacity of the cache memory as well as variable logical page sizes.

BRIEF DESCRIPTION OF THE DRAWINGS

FIGS. 3 (A) and 3 (B) are mapping charts showing a typical address space of the embodiment;

FIG. 4 is a view of logical address formats having variable page sizes and TLB entries associated therewith;

FIG. 12 is a view of formats for addresses and data in a memory-mapped cache memory;

FIG. 14 is a view of a status register;

FIG. 18 is a schematic view depicting how the bank for TLB entry replacement is determined as desired on a software basis;

FIG. 19 is a view of various control registers for an address translation buffer;

FIG. 21 is a table listing various kinds of access right which are defined by a protection bit PR for storage protection;

FIG. 31 is a table listing overall differences between single virtual storage and multiple virtual storage;

FIGS. 32 (A) and 32 (B) are views illustrating single and multiple virtual storage conceptually;

DESCRIPTION OF THE PREFERRED EMBODIMENTS

Component Modules of the Microcomputer

Figure 1:
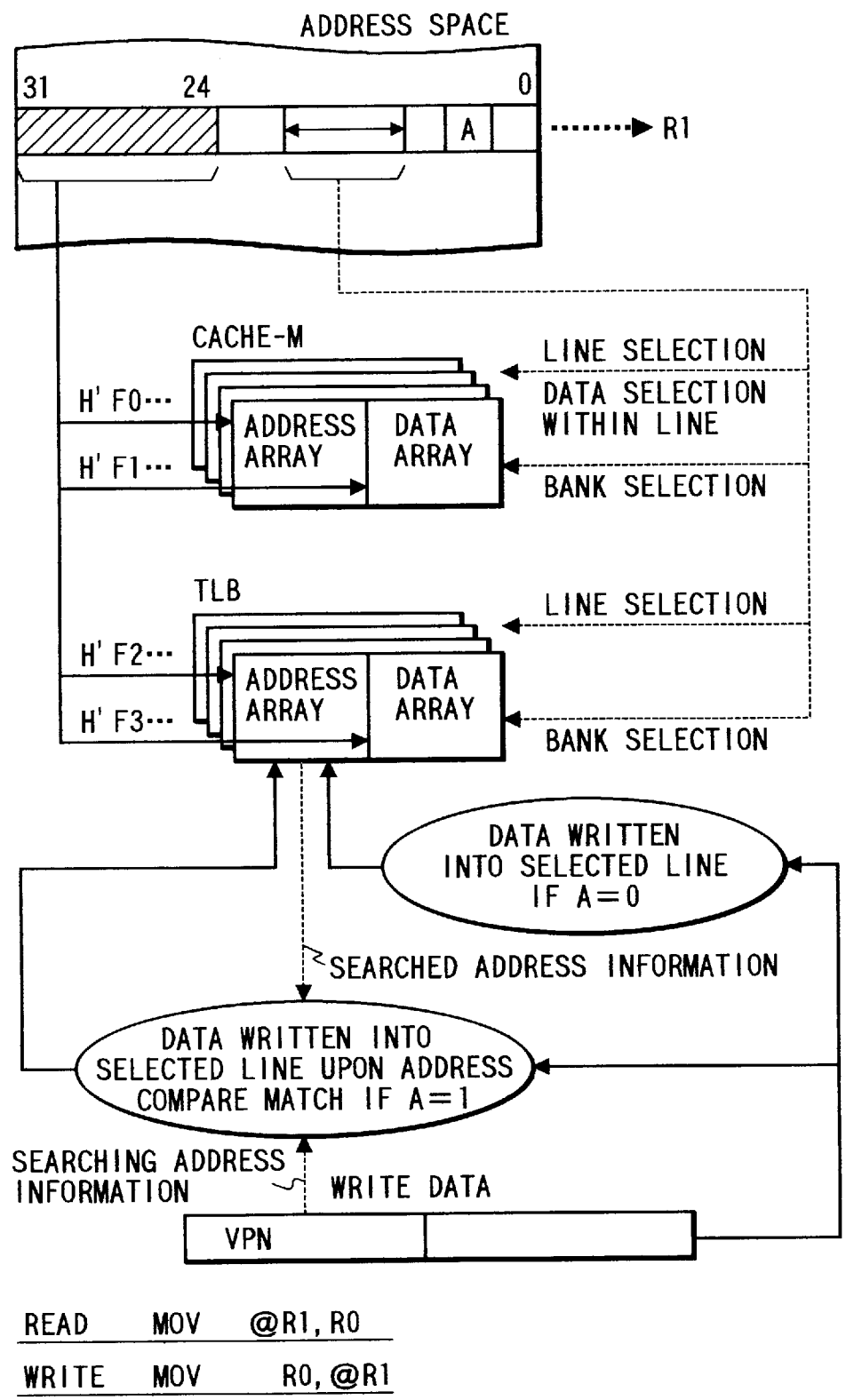
FIG. 1 is a schematic view of an example involving a cache memory and an address translation buffer being memory-mapped.
Figure 2:
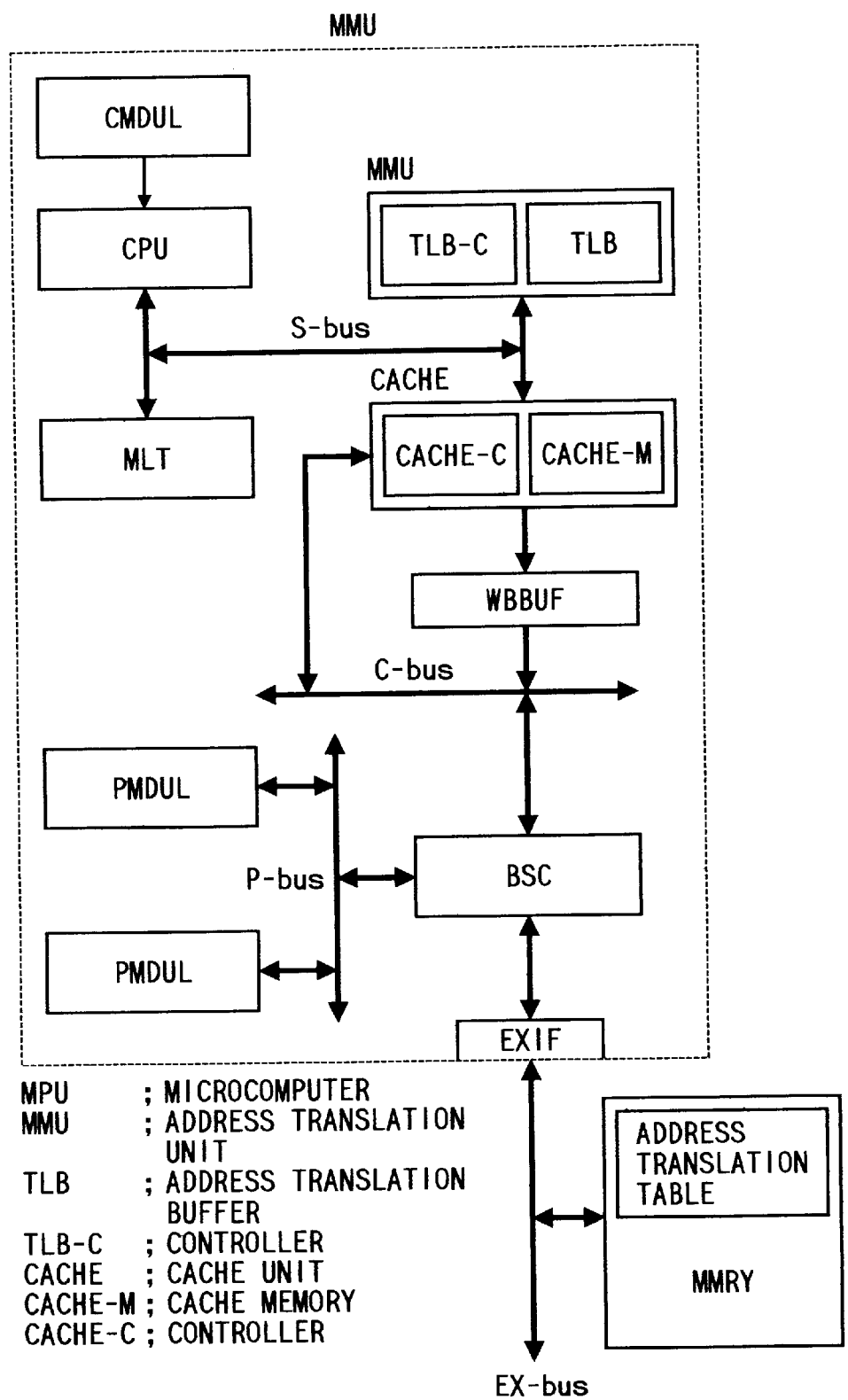
FIG. 2 is a block diagram of a microcomputer practiced as an embodiment of the invention.

FIG. 2 is a block diagram of a microcomputer MPU practiced as one embodiment of the invention. The microcomputer MPU is formed by known semiconductor integrated circuit fabricating techniques on a single semiconductor substrate illustratively made of single crystal silicon. The microcomputer MPU has, and is not limited by, a three-bus structure comprising a system bus (S-bus), a cache bus (C-bus) and a peripheral bus (P-bus). The three buses are each equipped with signal lines for dealing with data, address and control signals. The system bus (S-bus) is connected to a central processing unit CPU, a multiplier MLT, a cache unit CACHE and an address translation unit (also called a memory management unit or MMU). The cache unit CACHE is connected to the cache bus (C-bus) which in turn is connected to a write back buffer WBBUF and a bus state controller BSC. The bus state controller BSC, connected to an external bus (EX-bus) via an I/O circuit EXIF, controls interface between the cache bus (C-bus) and an external memory MMRY connected to the external bus (EX-bus). When a cache miss occurring in the cache unit CACHE requires the cache entry to be replaced, the write back buffer WBBUF temporarily accommodates the data to be written back to the external memory, thereby giving priority to the writing to the cache memory of the data pertaining to the cache miss in question. The output of the write back buffer WBBUF is connected to the cache bus (C-bus). The bus state controller BSC controls bus access operations to a peripheral module PMDUL connected to the peripheral bus (P-bus). A clock module CMDUL generates a clock signal as the reference according to which the microcomputer MPU operates.

Figure 13:
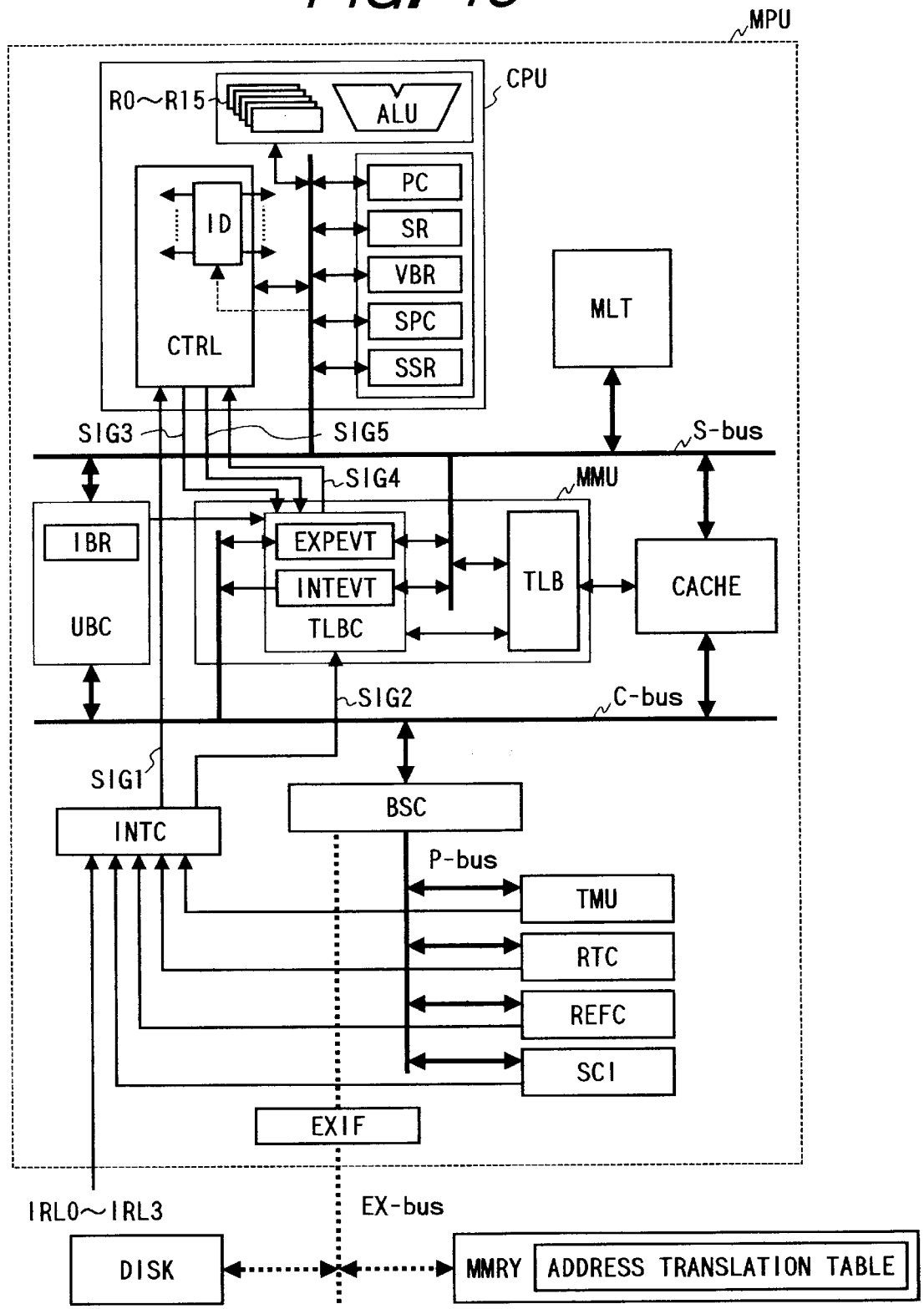
FIG. 13 is a more detailed block diagram of the microcomputer embodying the invention.

FIG. 13 is a more detailed block diagram of the microcomputer MPU of FIG. 2 embodying the invention. In FIG. 13, the clock module CMDUL is omitted, the write back buffer WBBUF is included in the cache unit CACHE, and the bus state controller BSC contains a peripheral adapter PADP. The peripheral module PMDUL of FIG. 2 is implemented in FIG. 13 in the form of a timer TMU, a real time clock RTC, a serial communication interface SCI and a refresh controller REFC. FIG. 13 includes an interrupt controller INTC and a user break controller UBC, both omitted in FIG. 13.

In FIG. 13, the system bus (S-bus) is connected to the central processing unit CPU, multiplier MLT, cache unit CACHE, memory management unit MMU and user break controller UBC. The cache bus (C-bus) is connected to the cache memory CACHE, memory management unit MMU, instruction break controller UBC and bus state controller BCS. The peripheral bus (P-bus), coupled to the bus state controller BSC, is connected to such built-in peripheral modules as the timer TMU, the real time clock RTCD that continues to act as a clock even if the supply of the clock signal to the central processing unit CPU is halted, the refresh controller REFC, and the serial communication interface SCI. The bus state controller BSC may be connected to the external bus (EX-bus) via the I/O circuit EXIF. The external bus (EX-bus) is connected to the external memory MMRY and an auxiliary storage device DISK. The bus state controller BSC controls the starting of bus cycles for the built-in peripheral modules and for external equipment, and controls other bus-related operations.

The interrupt controller INTC receives interrupt requests not only from the built-in peripheral modules but also from an external interrupt terminal IRL0–IRL3 of multiple bits. In accordance with the priority level in force, the interrupt controller INTC arbitrates the received requests and feeds the central processing unit CPU with an interrupt signal SIG1. At the same time, the interrupt controller INTC supplies the memory management unit MMU with a signal SIG2 notifying the latter of the cause of the accepted interrupt request. Given the interrupt signal SIG1, the central processing unit CPU supplies the memory management unit MMU with a signal SIG3 acknowledging that the interrupt is accepted. In response, the memory management unit MMU sets the cause of the interrupt in a cause register INTEVT. Using the interrupt cause set in the cause register INTEVT, the central processing unit CPU branches to the appropriate interrupt handling.

The microcomputer MPU embodying the invention divides the logical address space into units called logical pages, and supports in units of these pages virtual storage for translating logical addresses into physical addresses. The memory management unit MMU includes an address translation buffer TLB and an address translation buffer controller TLB-C. The address translation buffer TLB stores as TLB entries logical page numbers paired with physical page numbers for address translation. Using the address translation buffer TLB, the address translation buffer controller TLB-C translates into a physical address each logical address output by the central processing unit CPU. In the event of a TLB miss, the TLB entry corresponding to the logical address in question is read by the controller TLB-C from an address translation table (page table) in the external memory MMRY. The address translation buffer TLB is illustratively composed of a four-way set associative cache memory. When exceptions such as a TLB miss related to address translation occur, the controller TLB-C sets the cause of the exception in question to a cause register EXPEVT. At the same time, the controller TLB-C sends to the central processing unit CPU a signal SIG4 notifying the latter that the exception (e.g., TLB miss) occurred in connection with address translation. In response, the central processing unit CPU may or may not have recourse to the cause set in the cause register EXPEVT in directly branching to the relevant exception handling.

The central processing unit CPU uses 32-bit addresses to support illustratively a four-gigabyte logical address space. In FIG. 13, the circuit block of the central processing unit CPU indicates, among others, an operation part represented by general-purpose registers R0 through R15 and an arithmetic and logic unit ALU, a group of control registers including a program counter PC to be described later, and a control part CTRL that fetches and decodes instructions and controls instruction execution procedures and various operations. An instruction decoder ID in the control part generates various control signals by decoding the instructions fetched by the central processing unit CPU. When fetching an instruction from the external memory MMRY and getting the instruction decoder ID to decode the fetched instruction, the central processing unit CPU performs data processing as described by the instruction in question. In FIG. 13, a signal SIG5 generically represents all signals sent from the central processing unit CPU to the memory management unit MMU as well as the signal notifying the latter of the internal state of the CPU.

The cache unit CACHE comprises, and is not limited by, a cache memory CACHE-M acting as a four-way set associative memory and its controller CACHE-C. The cache memory CACHE-M is indexed by use of part of each logical address. That is, the tag of each entry retains a physical address. The indexed tag is compared with each physical address of which the corresponding logical address is translated by the address translation buffer TLB. A check is then made to see if the result of the compare operation is a miss or a hit. In the event of a cache miss, the data or instruction pertaining to the miss is read from the external memory MMRY. The data or instruction thus read is retained as a new cache entry in the cache memory CACHE-M.

The user break controller UBC is furnished to reinforce the debugging function of the embodiment. This controller checks to see if the state of the system bus (S-bus) matches the break condition in question. In the event of a match, the user break controller UBC generates a break interrupt to the central processing unit CPU. The user break controller UBC includes an instruction break address register IBR that has an instruction address or other data set therein as the break condition. Before the start of debugging or emulation, the central processing unit CPU executes the relevant service routine to set beforehand in the instruction break address register IBR a desired instruction break condition such as the first address or operand address of the instruction to be interrupted for a break. When the internal state of the microcomputer MPU matches the instruction break condition, there occurs an instruction break exception, to be discussed later. Break-point control is effected in this manner inside the microcomputer MPU.

In addition to the general-purpose registers R0 through R15 of 32 bits each, the central processing unit CPU comprises such system and control registers as the program counter PC, a status register SR, a vector base register VBR, a save program counter SPC and a save status register SSR. The program counter points to the start address of the current instruction. The save status register SSR is a register in which to save the current value of the status register SR. The save program counter SPC is a register in which to save the address of the instruction to be executed by the central processing unit CPU after recovery from the exception that occurred. That is, when an exception occurs, the value of the program counter PC is saved into the save program counter SPC at the appropriate timing. The vector base register VBR retains the base address (vector table base address) of a vector region for exception handling.

As shown in FIG. 14, the status register SR comprises a T bit indicating a carry, borrow or overflow in an operation; an S bit used for memory access control; a four-bit mask field IMASK indicating the mask level for an interrupt request; M and Q bits used for divide operations; a register bank bit RB used to designate the general-purpose registers R0 through R15 for bank assignments; a block bit BL; a processor operation mode bit MD; and a zero bit field. The block bit BL is used to mask exceptions in privileged mode. When set to 1, the block bit BL specifies that exceptions are to be masked; when set to 0, the block bit BL specifies that exceptions are to be accepted. When set to 1, the mode bit MD indicates privileged mode; when set to 0, the mode bit MD indicates user mode. The mode bit MD is set either to 0 or to 1 by executing an appropriate instruction. In user mode, the M, Q, S and T bits may each be set or cleared using dedicated instructions. All other bits may be read or written only in privileged mode. The writing of data to the control registers such as the status register SR is enabled by use of a control load instruction LDC; the reading of data from the control registers is enabled using a control store instruction STC. The two instructions are part of the system control instructions or privileged instructions in use.

Address Space of the Microcomputer

The central processing unit CPU of the microcomputer MPU embodying the invention utilizes 32-bit addresses so that the MPU supports a four-gigabyte (GB) logical address space. The logical addresses may be expanded by use of an address space identifier (process number; asid). FIGS. 3 (A) and 3 (B) are mapping charts showing the address space of the embodiment. In the figures, the areas marked as "mapped" are subject to address translation that utilizes the address translation buffer TLB. The area ranging from H'FFFFFFFF to H'80000000 is accessible in privileged mode; an attempt to access this area in user mode results in an address error. The area marked as P4 is a control space in which a peripheral control register, the address translation buffer TLB and cache memory CACHE-M are mapped. Areas P1 and P2 are areas in which the corresponding physical addresses are fixed and which are not subject to address translation utilizing the address translation buffer TLB. The logical addresses of these areas P1 and P2 are each translated into a physical address, with a constant added to or retracted from the logical address to be translated. Thus when the area P1 or P2 is accessed in privileged mode, there occurs no exception such as a TLB miss related to address translation. It should be noted that the area P2 is not subject to caching operations involving the cache memory CACHE. On the other hand, the area P1 is subject to caching operations.

The logical address space is divided into units called logical pages. Logical addresses are translated into physical addresses in units of these logical pages. The microcomputer MPU embodying the invention supports two logical page sizes: 4 KB (kilobytes) and 1 KB. This satisfies a relational condition specific to the embodiment. The condition requires that the maximum logical page size (=4 KB) be given by multiplying the minimum size (=1 KB) by 2 to the n-th power, and that the number of banks (=4) in the address translation buffer TLB be equal to or greater than the result of the multiply operation above. As depicted in FIG. 4, each logical address generated by the central processing unit CPU when the logical page size is 1 KB comprises 32 bits (from bit 0 to bit 31). Of these bits, bits 0–9 constitute an offset field, and bits 10–31 make up a logical page number (logical page address) vpn. When the logical page size is 4 KB, bits 0–11 form an offset field, and bits 12–31 constitute a logical page number vpn (logical page address).

TLB Entries

Page table entries for virtual storage each include descriptions about the correspondence between a logical page number VPN and a physical page number PPN, about the attribute of access, and about other factors. The page table entries are generated on a software basis and stored in the address translation table in the external memory MMRY shown in FIGS. 2 and 13. Part of the page table entries are held in the address translation buffer TLB of the address translation unit MMU. As shown in FIG. 4 in detail, the format of the entries (i.e., TLB entries) retained in the address translation buffer TLB is divided into two parts: an address part placed expediently in the address array TA-ary, and a data part held in the data array TD-ary. The address part comprises logical page number information VPN (bits 31-17) and VPN (bits 11-10), and a space number ASID (made of 8 bits). The data part includes a share status bit SH (1 bit), a size bit SZ (1 bit), a valid bit V (1 bit) indicating whether or not the entry is valid, a physical page number PPN (22 bits) corresponding to the logical page number, a protection field PR (2 bits) for storage protection, a cacheable bit C (1 bit), and a dirty bit D (1 bit). The logical page number information held in the address part is composed of bits 10–11 and bits 17–31 within the 32-bit logical address format, wherein the bits for indexing are excluded from the information. In the format, the two-segment information is depicted as VPN (11-10) and VPN (31-17). The share status bit SH indicates whether or not the page in question is shared by a plurality of processes. When set to 0, the share status bit SH indicates that the page is not shared between processes; when set to 1, the bit SH indicates that the page is shared between processes. The space number ASID is used to define a logical page as belonging to a specific process. For that reason, the space number is also called a process number. The protection field PR represents data encoded to define the access right to a given page. The bit combination in the protection field PR defines the access right. The size bit SZ designates the logical page size. When set to 1, the size bit SZ designates the 4-KB page size; when set to 0, the size bit SZ designates the 1-KB page size.

In this specification, lower-case reference characters "vpn," "ppn" and "asid" represent a logical page number, a physical page number and a process number, respectively, for use in access. These reference characters should be distinguished from upper-case reference characters VPN, PPN and ASID representing respectively a logical page number, a physical page number and a processor number for use in the entries of the address translation buffer TLB and cache memory CACHE-M or in the page table entries.

Supporting a Plurality of Page Sizes

Figure 6:
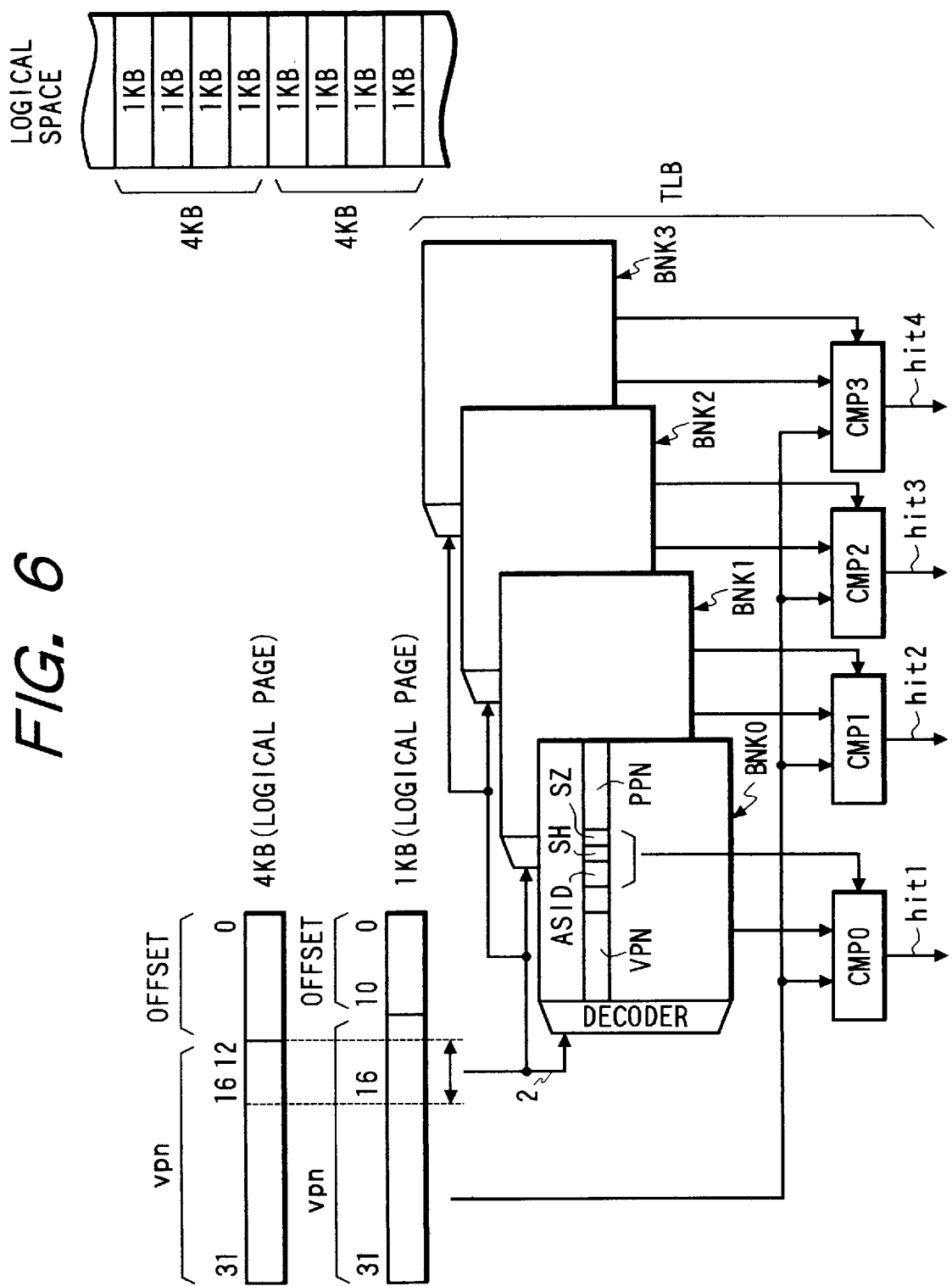
FIG. 6 is a schematic view of an address translation buffer for supporting a plurality of page sizes.

As shown in FIGS. 4 and 19, the address translation table entries (i.e., page table entries) and TLB entries each have the size bit SZ. The size bit SZ allows the logical page size to be varied from one page to another. The four-way set associative address translation buffer TLB is shared between a plurality of logical page sizes that may be set variably. The microcomputer MPU embodying the invention supports two logical page sizes, 1 KB and 4 KB. The way to designate an index address IDX for the address translation buffer TLB is common to the two logical page sizes. As illustrated in FIG. 6, the central processing unit CPU generates a 32-bit logical address in which bits 12–16 (i.e., vpn) are used as the index to the address translation buffer TLB. Because the index address comprises five bits, up to 32 entries may be retained per bank (way). Since the address translation buffer TLB has four banks BNK0 through BNK3, up to four entries may be furnished per index address. With the page size set at 4 KB, the index address comprises five bits (vpn; 16-12) counted from the least significant bit of the logical page number vpn in question. This means that when the page size is 4 KB, each bank may hold up to 32 entries (128 entries in total) for a given logical page number. When the page size is 1 KB, on the other hand, the two bits (vpn; 11-10) counted from the least significant bit of the logical page number vpn in question are not used for the index. Where the logical page size is 1 KB and a given bank is indexed, the indexed entry points to one of four logical page numbers (each having a page size of 1 KB) selected by the five-bit index address. The two bits (10–11) not used for the index are employed to designate one of the four selected logical page numbers. Thus if there is only one bank, only one entry is assigned to four continuous logical pages. With this embodiment, the maximum logical page size is given by multiplying the minimum logical page size by 2 to the n-th power, and the number of banks is at least equal to the result of that multiply operation. Specifically, the minimum logical page size is 1 KB, and the maximum logical page size is 4 KB (=2 multiplied by 2) which is also the number of banks (4 banks). In this manner, approximately as in the case of the 4-KB page size, the address translation buffer TLB as a whole may accommodate 128 entries of any logical page numbers, each entry amounting to the 1-KB page size. But there is a constraint: the logical page numbers corresponding to the entries held in each bank must be provided in units of 4 KB. This constraint has no effect on the hit rate of the address translation buffer TLB as long as the logical page numbers of the entries held by the TLB are continuous. If the logical page numbers are dispersed, the hit rate is somewhat affected. In the latter case, however, the adverse effect is reduced considerably by address-mapping 1-KB logical pages in units of 2 KB; the detrimental effect is removed completely if the 1-KB logical pages are address-mapped in units of 4 KB. For example, suppose that 1-KB page size translation information is set (written) to the address translation buffer TLB. In that case, each of the four banks (BNK0, BNK1, BNK2, BNK3) sets, respectively to four entries designated by a five-bit index address, translation information in effect when the two bits vpn (11-10) are "00," translation information in effect when the two bits are "01," translation information in effect when the two bits are "10," and translation information in effect when the two bits are "11." This arrangement prevents deterioration of the hit rate.

As discussed with reference to FIG. 24, the number of bits for address compare operations for the hit-or-miss judgment must be varied in accordance with the logical page size. When the logical page size is 1 KB, the bits vpn (11-10) must be compared with the bits VPN (11-10), differently from the case of the logical page size being 4 KB. The address translation buffer TLB has the storage areas VPN (bits 31-17) and VPN (bits 11-10) covering all bits that may be compared, and also has a 22-bit storage area for accommodating the physical page number PPN. In the address translation buffer TLB, the data part of each entry has the size bit SZ indicating the logical page size supported. Depending on the value of the size bit SZ, the address translation buffer TLB varies the number of the bits used to perform address compare operations for the hit-or-miss judgment. As described with reference to FIG. 24, when the size bit SZ is set to 1 (logical page size =4 KB), the bits VPN (31-17) are compared with the corresponding bits in the logical address; when the size bit SZ is set to 0 (logical page size=1 KB), the bits VPN (31-17) and VPN (11-10) are compared with the corresponding bits in the logical address. Hit signals hit1 through hit4 indicate respectively "hit" judgments made in the banks BNK0 through BNK3. These signals are used to find a TLB hit or miss.

As outlined, where the total storage capacity of the real memory in the system is limited, the microcomputer MPU selectively supporting a plurality of page sizes adopts a relatively small logical page size so as to readily meet the demand for boosting memory utilization factor in each process. In such cases, the maximum logical page size is determined by multiplying the minimum logical page size by 2 to the n-th power, and the number of banks for the set associative address translation buffer TLB is at least equal to the result of that multiply operation. With these conditions met, the address translation buffer TLB accommodates in principle the entries of any logical page numbers, whether or not the methods for designating the index address are unified into one for the maximum logical page size, and whether or not the selected logical page size is maximum or minimum. Where relevant information is provided to indicate the size of the logical page corresponding to a given logical page number and where that size is used to vary the number of the bits for address compare operations for the high-or-miss judgment, it is easy to utilize the logical page size to vary the bit count and bit positions of the information to be compared for associative search through the address translation buffer TLB. When the address translation buffer TLB supporting a plurality of page sizes is constituted by a set associative cache memory, the TLB thus implemented requires a chip area and a power consumption level about half as wide and half as high as the comparable buffer made of a CAM (content addressable memory).

Component Modules of the Address Translation Unit

Figure 5:
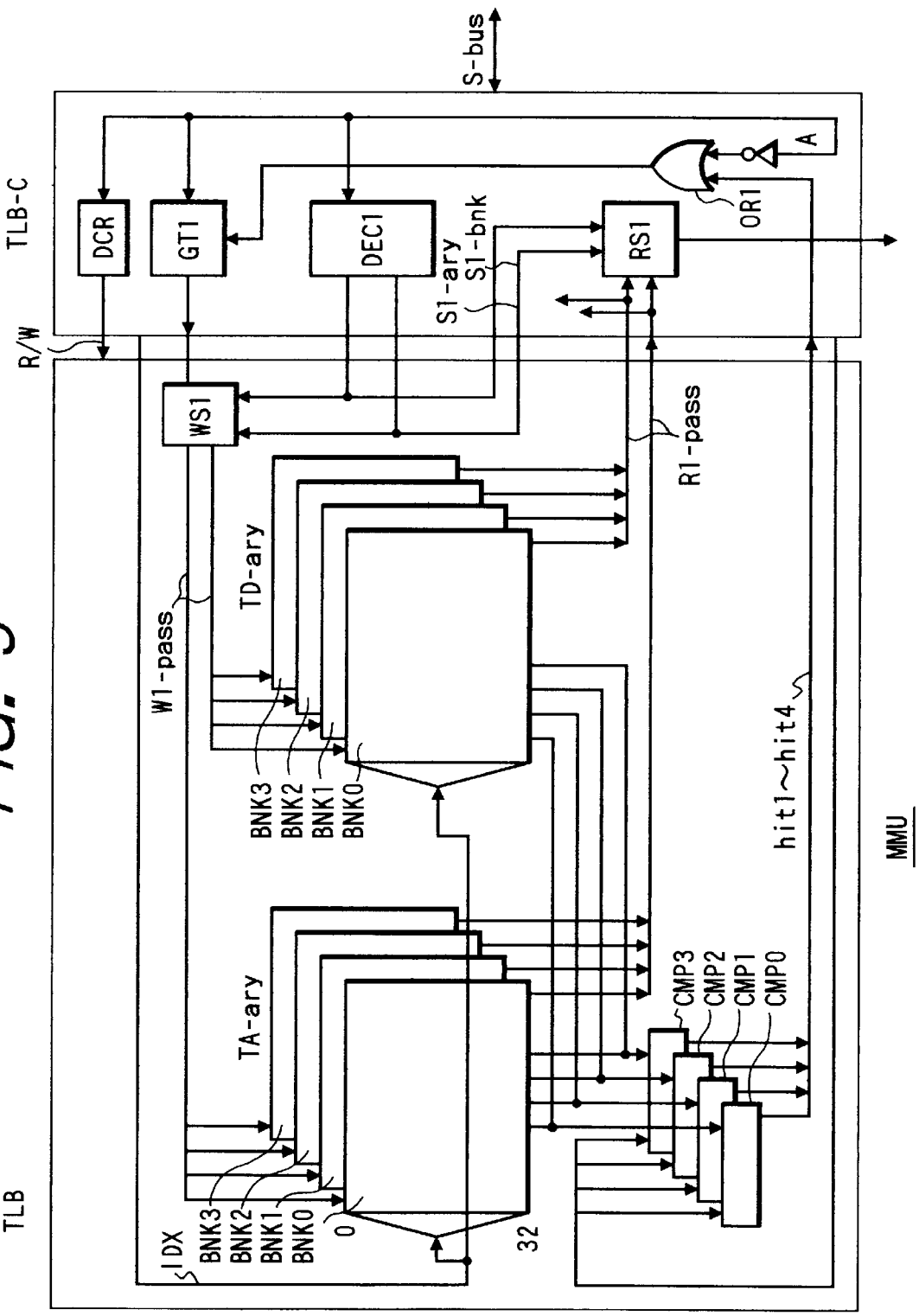
FIG. 5 is a block diagram of a typical address translation unit.

FIG. 5 is a block diagram of a typical address translation unit MMU. The address translation buffer TLB is composed illustratively of an SRAM (static random access memory)

having four banks (also called ways) BNK0 through BNK3 to implement a four-way set associative scheme. Each of the banks BNK0 through BNK3 is divided into an address array TA-ary and a data array TD-ary. The address array TA-ary stores the address part of TLB entries (including information about the logical page numbers used as the address tag to be compared with the logical page address). The data array TD-ary retains the data part of TLB entries (including information about the physical page corresponding to the address tag). Each TLB entry is so accommodated as to extend over both the address array TA-ary and the data array TD-ary. Each of the banks BNK0 through BNK3 comprises 32 TLB entries. Thus to select one entry from each bank requires using a five-bit index address IDX. The index address IDX is commonly supplied to the banks BNK0 through BNK3 of the address array TA-ary and data array TD-ary. The TLB entries selected in the banks BNK0 through BNK3 based on the index address IDX are fed to the controller TLB-C via a read path R1-pass. From the indexed TLB entries, the address tag for judging a TLB miss or hit is supplied to comparators CMP0 through CMP3 for each of the banks. For each bank, the comparators CMP0 through CMP3 compare the address tag with the logical page address. The result of the compare operation per bank is reported to the controller TLB-C (TLB controller) by use of hit signals hit1 through hit4.

Upon receipt of the TLB entry information thus read and the hit signals hit1 through hit4, the TLB controller TLB-C accordingly performs relevant processing regarding the TLB miss or hit. In the event of a TLB hit, the TLB controller TLB-C generates a physical address by adding the offset of the logical address to the physical page number included in the TLB entry pertaining to the hit. If a TLB miss is detected, a TLB miss exception occurs. Then a new TLB entry pertaining to the miss is loaded from the external memory MMRY, and address translation is executed again. When the entry in question needs to be replaced, the bank for the entry replacement is determined according to random or LRU (least recently used) logic.

When a new TLBN entry is to be loaded or invalidated as mentioned above, it is necessary to designate a bank for access to a memory part TLB-M therein. This feature is implemented by the address translation buffer TLB permitting an addressing access operation, to be described below.

As a hardware constitution for the addressing access to the address translation buffer TLB, the controller TLB-C in FIG. 5 comprises a write selector circuit WS1, a write control gate GT1, a read selector circuit RS1, an address decoder DEC1 and an OR gate OR1. A write path W1-pass connects the write selector circuit WS1 to the banks BNK0 through BNK3 of the address array TA-ary and data array TD-ary. The write selector circuit WS1 selects one of the banks of the address array TA-ary or data array TD-ary by use of an array selection signal S1-ary and a bank selection signal S1-bnk, given as decoding signals by the address decoder DEC1. With the bank selected, the write selector circuit WS1 supplies it with write data. The control gate GT1 feeds the write selector circuit WS1 with externally supplied write data. When the output of the OR gate OR1 is driven High, the control gate GT1 sends the write data to the write selector circuit WS1. Therefore, when an association bit A, to be described later, is driven High, the write control gate GT1 is opened provided one of the hit signals hit1 through hit4 is brought High. When the association bit A is driven Low, the write control gate GT1 is opened irrespective of the levels of the hit signals hit1 through hit4. The read selector circuit RS1 receives data that is indexed in the address array TA-ary and data array TD-ary and read out onto the read pass R1-pass. Using the array selection signal S1-ary and bank selection signal S1-bnk from the address decoder DEC1, the read selector circuit RS1 allows the read data from one of the banks of the address array TA-ary or data array TD-ary to be output externally. The write selector circuit WS1 is enabled when a write operation is ordered, and the read selector circuit RS1 is made operable when a read operation is ordered. The write or read order is output by the central processing unit CPU along with a logical address. In address translation operations for translating logical addresses into physical addresses, the information indexed in the banks BNK0 through BNK3 does not pass through the read selector circuit RS1; the information is instead utilized by control logic circuits, not shown, in the controller TLB-C to control the process of translation into physical addresses.

Addressing Access to the TLB

The address translation buffer TLB is mapped in the above-mentioned P4 area of the logical space. Write and read operations to and from the P4 area are enabled by having a common data transfer instruction such as the MOV instruction designating a desired address (memory mapped TLB). The address array TA-ary is mapped from H'F2000000 to H'F2FFFFFF, and the data array TD-ary from H'F3000000 to H'F3FFFFFF. As shown in FIG. 3 (A), the P4 area (H'E0000000–H'FFFFFFFF) is made accessible in privileged mode in which the operating system and system program run.

Figure 7:
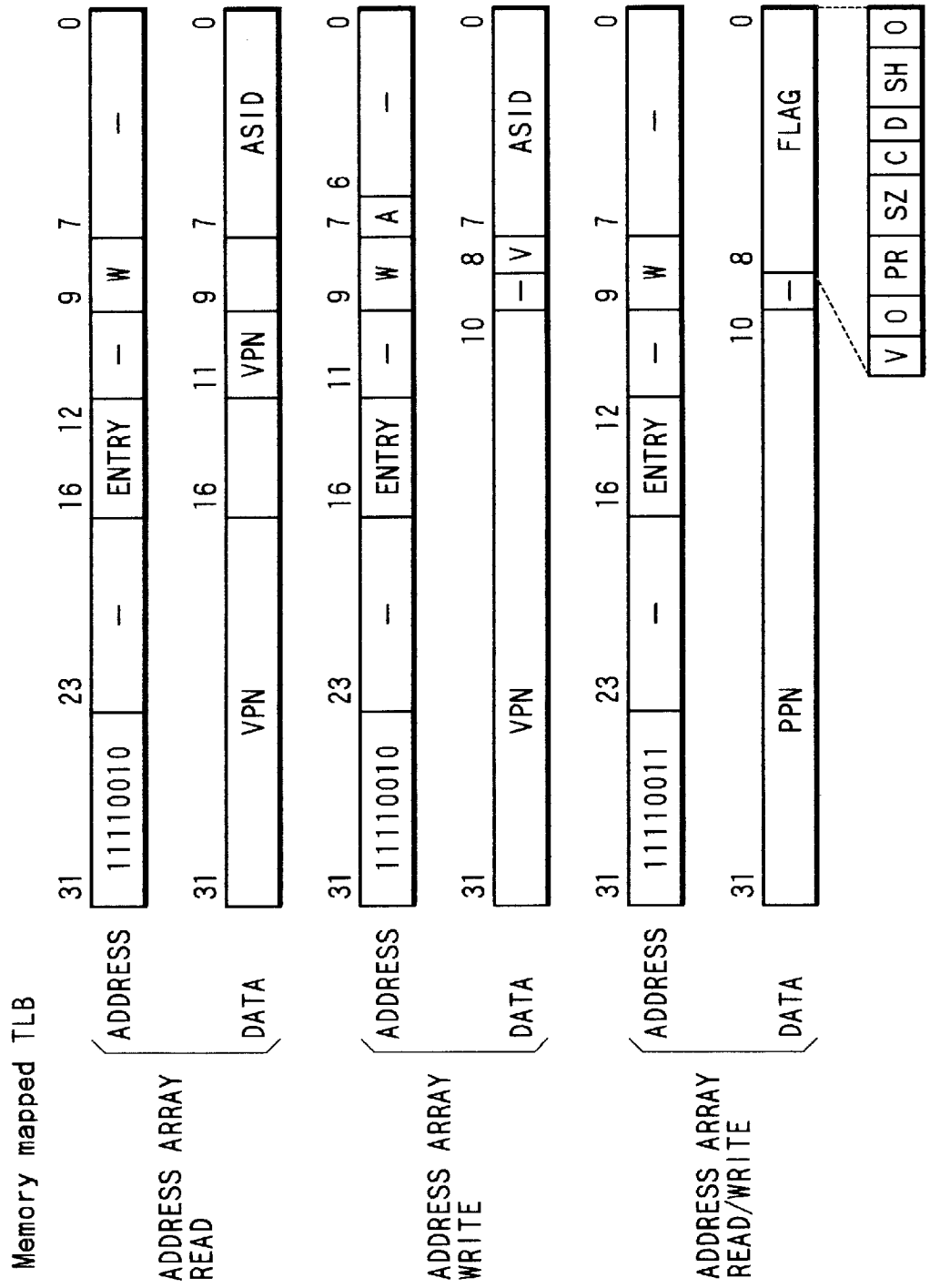
FIG. 7 is a view of formats for addresses and data in a memory-mapped address translation buffer.

FIG. 7 shows address formats for designating the address to be accessed in the address translation buffer TLB. The read/write address bits 31-24 for the address array TA-ary are H'F2 (11110010), and the read/write address bits 31-24 for the data array TD-ary are H'F3 (11110011). The formats allow the controller TLB-C of the address translation unit MMU to recognize an addressing access operation to the data array TD-ary or address array TA-ary. The bank (way) to be accessed is designated by a two-bit field W (bits 9-8). The entry for each bank is designated by a five-bit field ENTRY (bits 16-12). Using such information including H'F2 or H'F3 (bits 31-24) of the access logical address, the controller TLB-C designates an address array TA-ary or a data array TD-ary based on the signal S1-ary. In accordance with the signal S1-bnk corresponding to the bank-designating bit field W, the controller TLB-C designates one bank. And according to the index address IDX corresponding to the entry-designating bit field ENTRY, the controller TLB-C designates one TLB entry in the bank. The settings above make it possible to address the desired entry in the desired bank of the data array TD-ary or address array TA-ary.

A more detailed description follows with reference to FIG. 5. The logical address on the system bus (S-bus) is also fed to the address decoder DEC1 in FIG. 5. The address decoder DEC1 detects H'F2 or H'F3 (bits 31-24) in the logical address, as shown in the formats of FIG. 7. The detection allows the address decoder DEC1 to recognize the addressing access operation to the address translation buffer TLB. A command decoder DCR generates a read/write signal R/W by decoding an S-bus command output by the central processing unit CPU. Whether the access is a read or a write operation is determined by the read/write signal R/W output by the command decoder DCR. As indicated by the address and data formats in FIG. 7, the data ordered to be read from the address array constitutes logical page number information VPN (31-17), VPN (11-10) and a space number ASID given as the address tag. The data ordered to be written to the address array comprises a valid bit V in addition to logical page number information VPN (31-17), VPN (11-10) and a space number ASID given as the address tag. In the earlier discussion with reference to FIG. 4, the valid bit V was shown furnished in the data array TD-ary. In the write operation to the address array TA-ary, the valid bit V is also written to the data array TD-ary, as designated by a control signal part contained in the control signal S1-bnk. The V bit is included so that the entry in question may be invalidated by simply writing data to the address array. The data ordered to be read from the data array and the data to be written thereto both constitute PPN, V, PR, SZ, C, D and SH.

Figure 8:
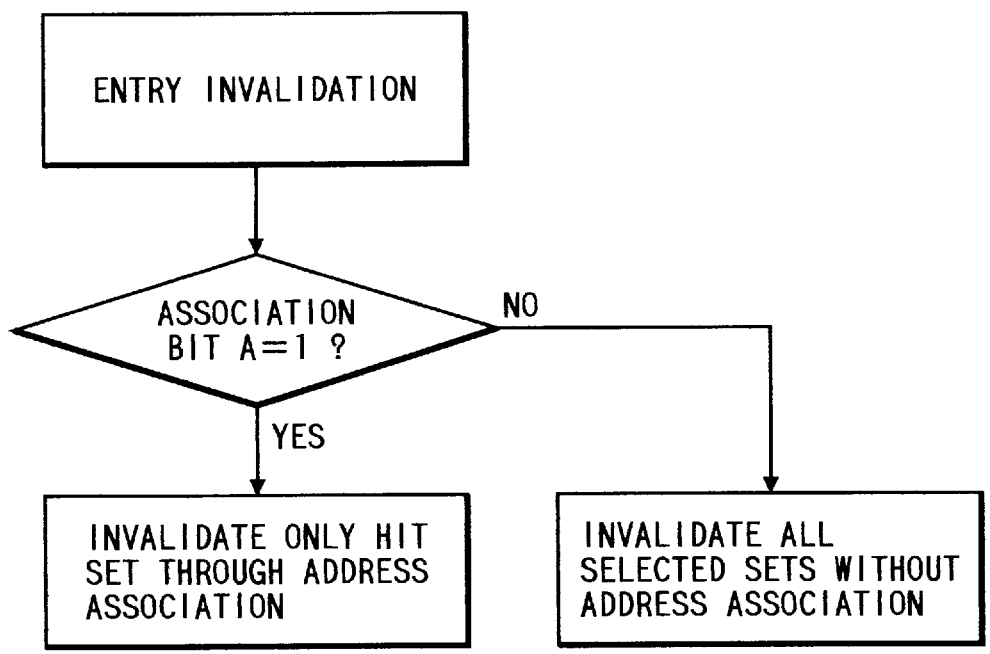
FIG. 8 is a flowchart of steps for entry invalidation.

In particular, where the address array TA-ary is accessed for a data write operation thereto, bit 7 is assigned an association bit A as shown in FIG. 7. The association bit A designates whether or not the write operation is to be carried out by association (illustratively by way of comparing the logical page number with the address tag). When set to 1, the association bit A permits writing of data to the entry in question provided the result of the address compare operation is a hit (data will not be written in the event of a miss). When set to 0, the association bit A permits writing of data to the entry selected by the address without having an address compare operation performed. The address to be compared upon an associative write operation to the address array TA-ary designated by the association bit A being 1 comprises two kinds of information: the logical page number VPN included in the write data, and the logical page number VPN held in the indexed entry. Such an associative write operation is utilized illustratively to reset the valid bit V to 0 in order to invalidate specific TLB entries. FIG. 8 shows typical steps for invalidating entries. When the association bit A is set to 1, the output of the OR gate OR1 is held Low unless and until one of the hit signals hit1 through hit4 is brought to the hit level (High), as depicted in FIG. 5. This allows the write data to be fed to the write selector circuit WS1 only after the address compare operation results in a hit. In a non-associative write operation designated by the association bit A being set to 0, the write control gate GT1 is opened regardless of the result of the address compare operation. Thus the non-associative write operation is illustratively employed simply to update the address array TA-ary in device tests.

The read access operation to the address-mapped address translation buffer TLB discussed above is carried out by use of data transfer instructions such as the MOV instruction. The instruction is described illustratively as MOV @R1, R0, where @R1 represents the source address. A desired address is set in the appropriate register R1 using the format illustrated in FIG. 7. R0 represents the destination register. Executing the above instruction MOV @R1, R0 causes the address translation buffer TLB to be accessed for reading data therefrom, as in the case of other memories accessible by the MOV instruction. The read data is transferred to the register R0. The access to the address translation buffer TLB for writing data thereto is also performed likewise. For the write operation, the instruction is typically described as MOV R0, @R1, where @R1 represents the destination address. A desired address is set in the appropriate register R1 using the format shown in FIG. 7. R0 is the source register that retains the write data. Executing the instruction MOV R0, @R1 causes the address translation buffer TLB to be accessed for writing the data thereto, as in the case of other memories accessible by the MOV instruction. The write instruction may be carried out on condition that the address information includes the association bit A being 1, and that the write data comprises the logical page number of the VPN of the entry to be invalidated as well as the valid bit V being 0. In that case, the write operation is effectively carried out only if the address compare operation results in a TLB hit (the entry in question is invalidated); the write operation is not performed in the event of a TLB miss (the entry in question is not invalidated).

When the address translation buffer TLB is mapped in the address space and is made addressable as described, access operations to the TLB are performed by use of common data transfer instructions such as the MOV instruction that is included in almost all instruction sets. Because dedicated instructions are not needed to access the address translation buffer TLB, the types of instruction codes may be reduced and the instruction words may be shortened. In other words, with no need to adopt dedicated instructions to access the address translation buffer TLB, it is possible to suppress increases in the scale of logic circuits constituting the instruction decoder ID for decoding instructions inside the central processing unit CPU. It is also easy to deal with the architectural requirements of the microcomputer calling for a reduced instruction word length. For example, if the microcomputer MPU embodying the invention adopts 16-bit fixed length instructions, the instruction codes are regarded as a valuable resource because the codes are relatively short. Thus when the address translation buffer TLB is mapped in the address space and is made addressable, the scheme requires only limited changes in the hardware of the instruction decoder ID, with no need to add any new instruction code. Because the address format for the write access operation to the address array TA-ary includes the association bit A designating an associative write operation if desired, it is easy to deal with two different kinds of processing demands: for invalidating TLB entries that inherently require address compare operations, and for updating TLB entries with no need for address compare operations as in the case of device tests.

Cache Entries

Figure 9:
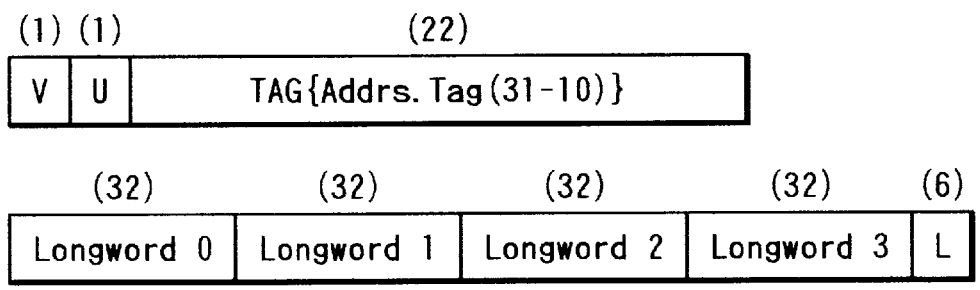
FIG. 9 is a schematic view of a typical cache entry.

FIG. 9 is a schematic view of a typical entry structure in the cache memory CACHE-M. The address part includes a 22-bit address tag (bits 31-10) TAG, a valid bit V indicating if the entry in question is valid (valid when V=1; invalid when V=0), an update bit U indicating if the cache entry in question is updated (updated when U=1; not updated when U=0), and a six-bit LRU field L (having data encoded therein in accordance with the LRU algorithm for cache entry replacement). The data part has four 32-bit long-word data fields (16 bytes).

Component Modules of the Cache Unit

Figure 10:
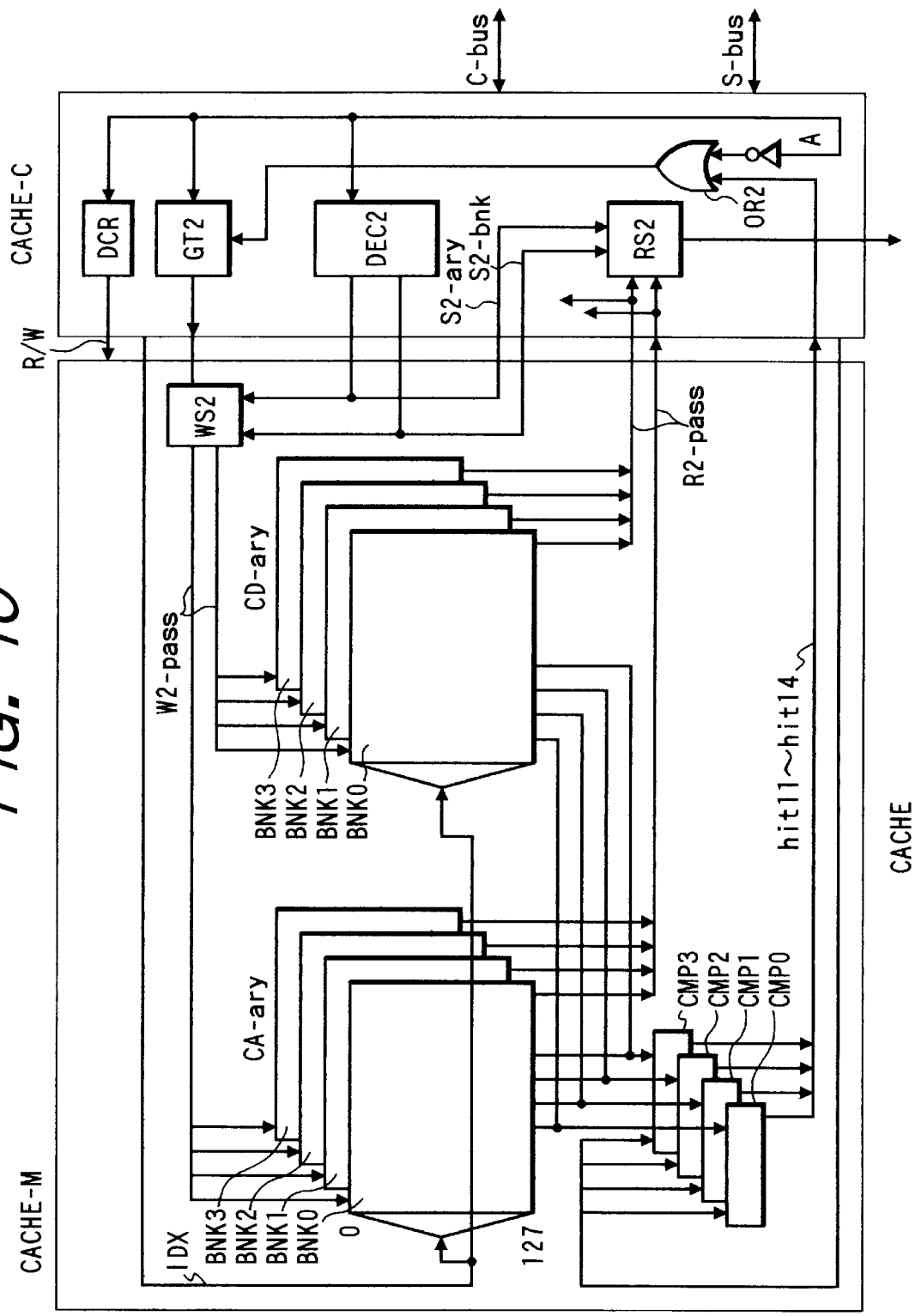
FIG. 10 is a block diagram of a typical cache unit.

FIG. 10 is a block diagram of the cache unit CACHE. The cache memory CACHE-M is constituted illustratively by an SRAM comprising four banks (or ways) BNK0 through BNK3 for implementing the four-way set associative scheme. The banks BNK0 through BNK3 are divided into two arrays: an address array CA-ary for storing the address part of cache entries, and a data array CD-ary for accommodating the data part of the cache entries. Each cache entry is so accommodated as to extend over both the address array CA-ary and the data array CD-ary. Each of the banks BNK0 through BNK3 comprises 128 cache entries. Thus to select one entry from each bank requires using a seven-bit index address IDX. Because each cache entry accommodates 16 bytes of data, the index address is made up of bits 10-4 in the logical address. The index address IDX is supplied commonly to the banks BNK0 through BNK3 of the address array CA-ary and data array CD-ary. Bits 3-0 of the logical address are regarded as information for designating 16-byte data in units of bytes.

Figure 11:
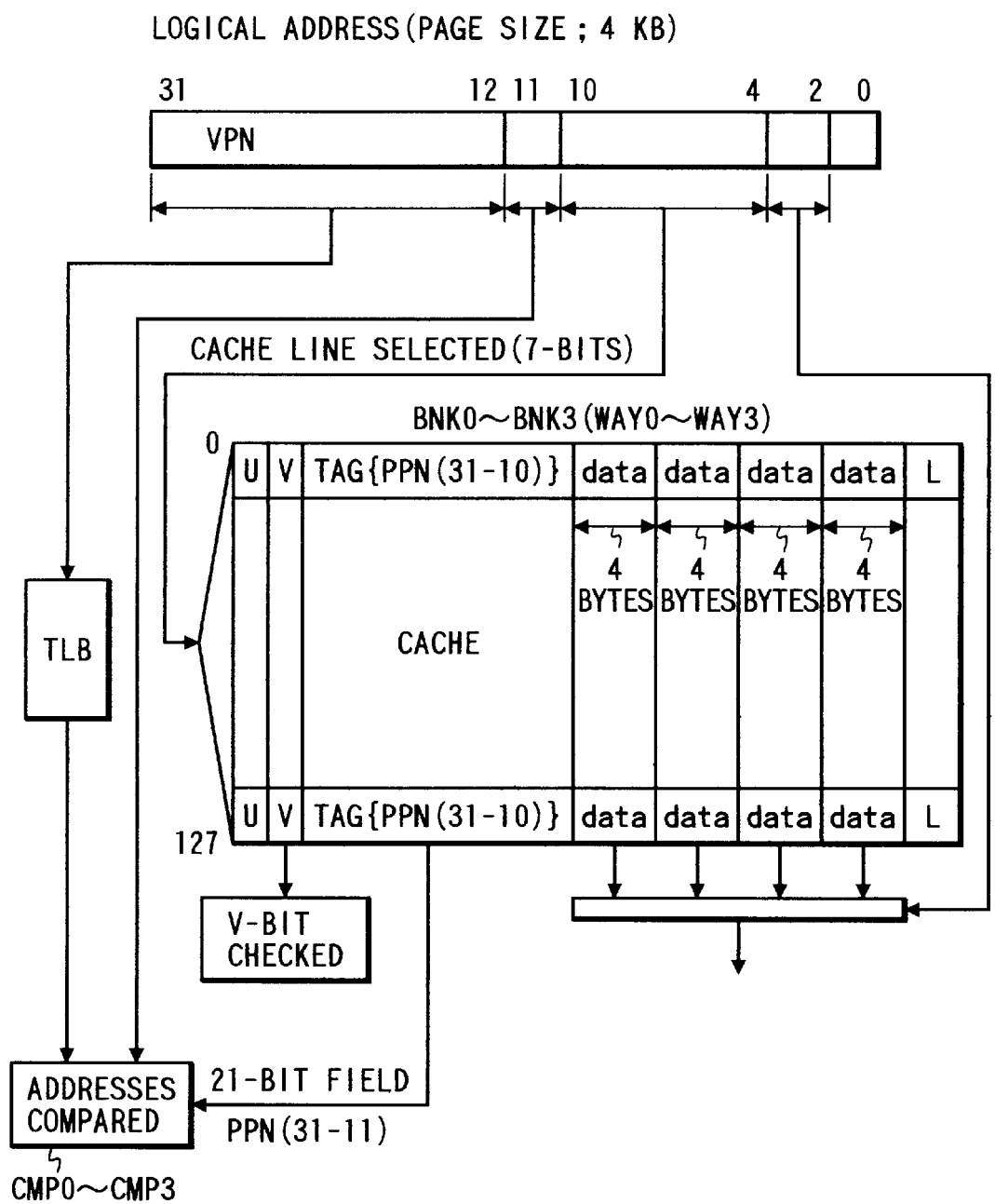
FIG. 11 is a schematic view showing how a cache line is selected in a cache memory.

The cache memory CACHE-M has a data storage capacity of about 2 KB (16 bytes×128) per bank, or 8 KB in total (2 KB×4). When the page size is 4 KB, the cache entry address tag TAG is compared with bits 31-11 (ppn) of the physical address that combines bit 11 of the logical address (most significant bit of the logical address offset) with the physical page number (ppn) given by the address translation unit MMU translating the logical address page number (bits 31-12; vpn). When the page size is 1 KB, the cache entry address tag TAG is compared with bits 31-11 (ppn) of the physical page number (ppn) given by the address translation unit MMU translating the logical address page number (bits 31-10; vpn). Bit 10 of the physical address constituting part of the address tag TAG is not utilized in the address compare operation above. That bit is employed, as will be described later, mostly for generating a write back address. The address compare operation is carried out by comparators CMP0 through CMP3 for each of the configured banks. The result of the address compare operation is fed to the controller CACHE-M by use of hit signals hit11 through hit14. FIG. 11 is a schematic view showing how cache entries are selected when the page size is 4 KB.

In FIG. 10, the cache controller CACHE-C receives the cache entry information read out as described and the hit signals hit11 through hit14, and performs processing accordingly on the cache miss or hit. For example, if the compare operation involving the address tag TAG results in a match during a read access operation, a check is made on the valid bit V. If the valid bit is found to be 1, a cache hit is detected. In that case, of the 16-byte data constituting the entry in question, the four-byte data corresponding to bits 2–3 of the logical address is output onto the cache bus (C-bus). If the compare operation involving the address tag TAG results in a mismatch during a read access operation or if the valid bit V in the selected entry is 0, a cache miss is detected. This starts an external bus cycle causing the target data to be read from the external memory MMRY and loaded as a new cache entry. The cache line to be replaced by the new entry is selected illustratively by hardware using the LRU algorithm. If the update bit U is found to be 1 in the entry of the cache line to be replaced, that entry is stored into the write back buffer WBBUF prior to the replacement. With the entry replacement completed, the entry is written back to the relevant address in the external memory MMRY. This arrangement is intended to preserve data consistency between the cache memory CACHE-M and the external memory MMRY. After the write operation, the new cache entry has its update bit U set to 1 if the replacement stems from a write error, and leaves the update bit U at 0 if the replacement is attributed to a read error.

The cache memory CACHE-M is indexed in the same manner for write access as for read access. In the event of a cache hit, the write data is written to the cache entry pertaining to the hit while the update bit U in the cache entry in question is set to a logical 1 at the same time. If a cache miss is detected during a write access operation, the write data is written to a new cache line. If the update bit U is found to be 1 in the entry of the cache line to be replaced, that entry is stored into the write back buffer WBBUF prior to the replacement. With the entry replacement completed, the entry is written back to the relevant address in the external memory MMRY. The update bit U in the new cache entry following the replacement is set to a logical 1.

When a new cache entry is to be loaded, when any cache entry is to be invalidated, or when data is to be written or read to or from the update bit U, it is necessary to designate a bank and to gain access to the cache memory CACHE-M.

These requirements are dealt with by the cache memory CACHE-M permitting addressing access thereto, as described below.

As a hardware constitution for the addressing access to the cache memory CACHE-M, the controller CACHE-C in FIG. 10 comprises a write selector circuit WS2, a write control gate GT2, a read selector circuit RS2, an address decoder DEC2 and an OR gate OR2. A write path W2-pass connects the write selector circuit WS2 to the banks BNK0 through BNK3 of the address array CA-ary and data array CD-ary. The write selector circuit WS2 selects one of the banks of the address array CA-ary or data array CD-ary by use of an array selection signal S2-ary and a bank selection signal S2-bnk, given as decoding signals by the address decoder DEC2. With the bank selected, the write selector circuit WS2 supplies it with write data. The control gate GT2 feeds the write selector circuit WS2 with externally supplied write data. When the output of the OR gate OR2 is driven High, the control gate GT2 sends the write data to the write selector circuit WS2. Therefore, when the association bit A, to be described later, is driven High, the write control gate GT2 is opened provided one of the hit signals hit11 through hit14 is brought High. When the association bit A is driven Low, the write control gate GT2 is opened irrespective of the levels of the hit signals hit11 through hit14. The read selector circuit RS2 receives data that is indexed in the address array CA-ary and data array CD-ary and read out onto the read pass R2-pass. Using the array selection signal S2-ary and bank selection signal S2-bnk from the address decoder DEC2, the read selector circuit RS2 allows the read data from one of the banks of the address array CA-ary or data array CD-ary to be output externally. The write selector circuit WS2 is enabled when a write operation is ordered, and the read selector circuit RS2 is made operable when a read operation is ordered. The write or read order is output by the central processing unit CPU along with a logical address. In cache operations, the information indexed in the banks BNK0 through BNK3 does not pass through the read selector circuit RS2; the information is instead utilized by control logic circuits, not shown, in the controller CACHE-C to control cache misses and hits.

Considering the Address Tag for Write Back Operation

The cache unit CACHE in the microcomputer MPU embodying the invention adopts the so-called write back scheme (also known as the copy back scheme). Under this scheme, that content of the cache memory CACHE-M which was updated during a write access operation is written back to the external memory MMRY when the entry in question is to be replaced by a new entry upon a cache miss. If the update bit U is found to be 1 in the entry to be replaced by a new one, that entry is written back to the external memory MMRY. The write address for the write back operation needs to be generated using two kinds of information: information of the address tag TAG for the cache line to be written back, and the logical address information (particularly the offset in the logical address) pertaining to the cache miss.

With this embodiment, the data storage capacity per bank of the cache memory CACHE-M is 2 KB as mentioned above. The addresses for the embodiment are byte-based addresses. To index the cache memory CACHE-M to designate one item of long-word data (4 bytes) in a bank requires using bits 0–10 of a logical address. Bits 11–31 of the logical address are used for an address compare operation on the address tag TAG. In other words, to carry out an address compare operation requires that bits 31-11 of the physical address be retained in the address tag TAG. In this connection, the microcomputer MPU embodying the invention may have its page size set variably for 1 KB or 4 KB. When the page size is 1 KB (smaller than the data storage capacity of a single bank), the page number is specified by bits 31-10 of the address. Therefore, to perform a write back operation when the page size is 1 KB requires the use of a physical page address defined at least by bits 31-10 of a physical address. If this information is not found in the address tag TAG, it is difficult to specify the address to which to write back data. For this reason, a cache entry has a field in which all bits of the physical page number corresponding to the minimum page size supported by the microcomputer MPU are retained as an address tag TAG. For an address compare operation on indexed entries, bits 31-11 of the physical address in the address tag TAG are used (bit 10 is not usable for both the 1 KB and the 4 KB page size). Bits 31-10 of the physical address in the field of the address tag TAG are used to generate the address to which to write back data. When the page size is 1 KB, all bits 31-10 of the physical address in the address tag in question are used; when the page size is 4 KB, bits 31-12 of the physical address are used.

When the page size is smaller than the data storage capacity of a single bank in the cache memory CACHE-M, the embodiment utilizes the field of an address tag TAG large enough to accommodate all bits of the physical page corresponding to the page size in question. Physical address information is held in the field in excess of the number of the bits necessary for the address compare operation. These features constitute a cache memory that is necessary and sufficient to meet the requirements of both the address compare and the write back operation on the indexed cache entries.

Addressing Access to the Cache Memory

As with the address translation buffer TLB, the cache memory CACHE-M is mapped in the above-mentioned P4 area of the logical space. Write and read operations to and from the P4 area are enabled by having a common data transfer instruction such as the MOV instruction designating a desired address (memory mapped cache). The address array CA-ary is mapped from H'F0000000 to H'F0FFFFFF, and the data array CD-ary from H'F1000000 to H'F1FFFFFF. As shown in FIG. 3 (A), the P4 area (H'E0000000–H'FFFFFFFF) is made accessible in privileged mode in which the operating system and system program run.

FIG. 12 shows address formats for designating the address to be accessed in the cache memory CACHE-M. The read/write address bits 31-24 for the address array CA-ary are H'F0 (11110000), and the read/write address bits 31-24 for the data array CD-ary are H'F1 (11110001). The formats allow the controller CACHE-C of the cache unit CACHE to recognize an addressing access operation to the data array CD-ary or address array CA-ary. The bank (way) to be accessed is designated by a two-bit field W (bits 12-11). The entry for each bank is designated by a seven-bit field ENTRY (bits 10-4). Using such information including H'F0 or H'F1 (bits 31-24) of the access logical address, the controller CACHE-C designates an address array CA-ary or a data array CD-ary based on the signal S2-ary. In accordance with the signal S2-bnk corresponding to the bank-designating bit field W, the controller CACHE-C designates one bank. And according to the index address IDX corresponding to the entry-designating bit field ENTRY, the controller CACHE-C designates one cache entry (cache line) in the bank. The settings above make it possible to address the desired entry in the desired bank of the data array CD-ary or address array CA-ary.

A more detailed description follows with reference to FIG. 10. The logical address on the system bus (S-bus) is also fed to the address decoder DEC2 in FIG. 10. The address decoder DEC2 detects H'F0 or H'F1 (bits 31-24) in the logical address, as shown in the formats of FIG. 12. The detection allows the address decoder DEC2 to recognize the addressing access operation to the cache memory CACHE-M. The command decoder DCR generates a read/write signal R/W by decoding an S-bus command output by the central processing unit CPU. Whether the access is a read or a write operation is determined by the read/write signal R/W output by the command decoder DCR. As indicated by the address and data formats in FIG. 12, the write or read data to or from the address array constitutes the address tag TAG (bits 31-10), an LRU field, a U bit and a V bit. The V bit is included so that the entry in question may be invalidated by simply writing data to the address array. The write or read data to or from the data array is 16-byte date.

In particular, where the address array CA-ary is accessed for writing data thereto, bit 3 of the address is assigned the association bit A as shown in FIG. 12. The association bit A designates whether or not the write operation is to be carried out by association (i.e., by way of performing the above-described address compare operation). When set to 1, the association bit A permits writing of data to the entry in question provided the result of the address compare operation is a hit (data will not be written in the event of a miss). When set to 0, the association bit A permits writing of data to the entry selected by the address without having an address compare operation performed. The address to be compared upon an associative write operation to the address array designated by the association bit A is the address tag TAG contained in the write data. Such an associative write operation is utilized illustratively to reset the valid bit V to 0 in order to invalidate specific cache entries. FIG. 8 shows typical steps for invalidating entries. Upon access to the data array CD-ary, bits 3-2 of the address are assigned a long-word select bit field LS. In two bits, the long-word select bit field LS designates the long-word data to be accessed. When the association bit A is set to 1, the output of the OR gate OR2 is held Low unless and until one of the hit signals hit11 through hit14 is brought to the hit level (High), as depicted in FIG. 10. This allows the write data to be fed to the write selector circuit WS2 only after the address compare operation results in a hit. In a non-associative write operation designated by the association bit A being set to 0, the write control gate GT2 is opened regardless of the result of the address compare operation. Thus the non-associative write operation is illustratively employed simply to update the address array CA-ary in device tests.

The read access operation to the address-mapped cache memory CACHE-M discussed above is carried out by use of data transfer instructions such as the MOV instruction. The instruction is described illustratively as MOV @R1, R0, where @R1 represents the source address. A desired address is set in the appropriate register R1 using the format illustrated in FIG. 12. R0 represents the destination register. Executing the above instruction MOV @R1, R0 causes the cache memory CACHE-M to be accessed for reading data therefrom, as in the case of other memories accessible by the MOV instruction. The read data is transferred to the register R0. The access to the cache memory CACHE-M for writing data thereto is also performed likewise. For the write operation, the instruction is typically described as MOV R0, @R1, where @R1 represents the destination address. A desired address is set in the appropriate register R1 using the format shown in FIG. 12. R0 is the source register that retains the write data. Executing the instruction MOV R0, @R1 causes the cache memory CACHE-M to be accessed for writing the data thereto, as in the case of other memories accessible by the MOV instruction. The write instruction may be carried out on condition that the address information includes the association bit A being 1, and that the write data comprises the address tag TAG of the entry to be invalidated as well as the valid bit V being 0. In that case, the write operation is effectively carried out only if the address compare operation results in a cache hit (the entry in question is invalidated); the write operation is not performed in the event of a cache miss (the entry in question is not invalidated).

When the cache memory CACHE-M is mapped in the address space and is made addressable as described, access operations to the cache memory are performed by use of common data transfer instructions such as the MOV instruction that is included in almost all instruction sets. Because dedicated instructions are not needed to access the cache memory CACHE-M, the types of instruction codes may be reduced and the instruction words may be shortened. In other words, with no need to adopt dedicated instructions to access the cache memory CACHE-M, it is possible to suppress increases in the scale of logic circuits constituting the instruction decoder ID for decoding instructions inside the central processing unit CPU. It is also easy to deal with the architectural requirements of the microcomputer calling for a reduced instruction word length. For example, if the microcomputer MPU embodying the invention adopts 16-bit fixed length instructions, the instruction codes are regarded as a valuable resource because the codes are relatively short. Thus when the cache memory CACHE-M is mapped in the address space and is made addressable, the scheme requires only limited changes in the hardware of the instruction decoder ID, with no need to add any new instruction code. Because the address format includes the association bit A designating an associative write operation if desired, it is easy to deal with two different kinds of processing demands: for invalidating cache entries that inherently require address compare operations, and for updating cache entries with no need for address compare operations as in the case of device tests.

Figure 15:
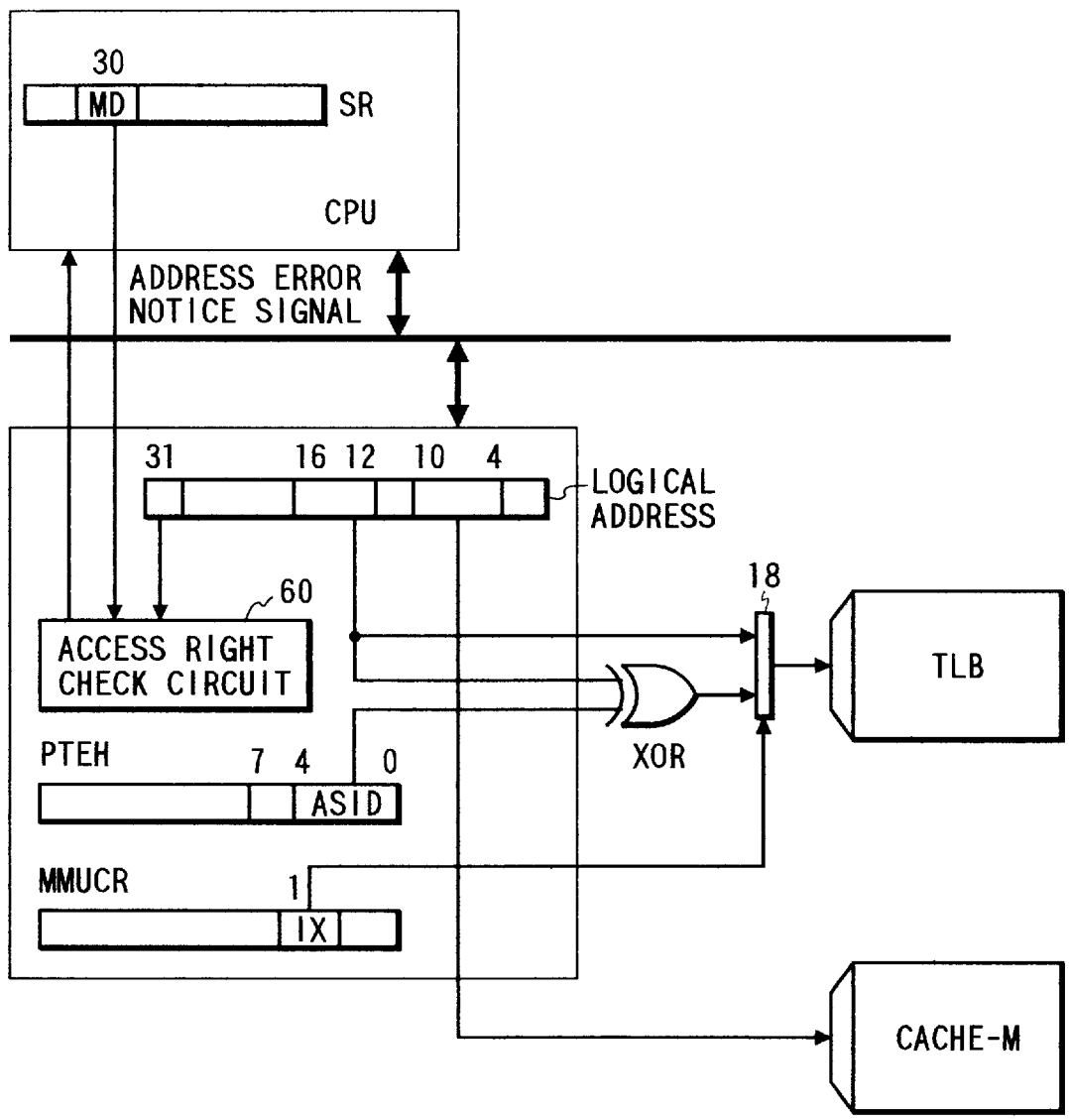
FIG. 15 is a schematic view depicting how the access right is checked in an addressing access operation to an address translation buffer and a cache memory.
Figure 17:
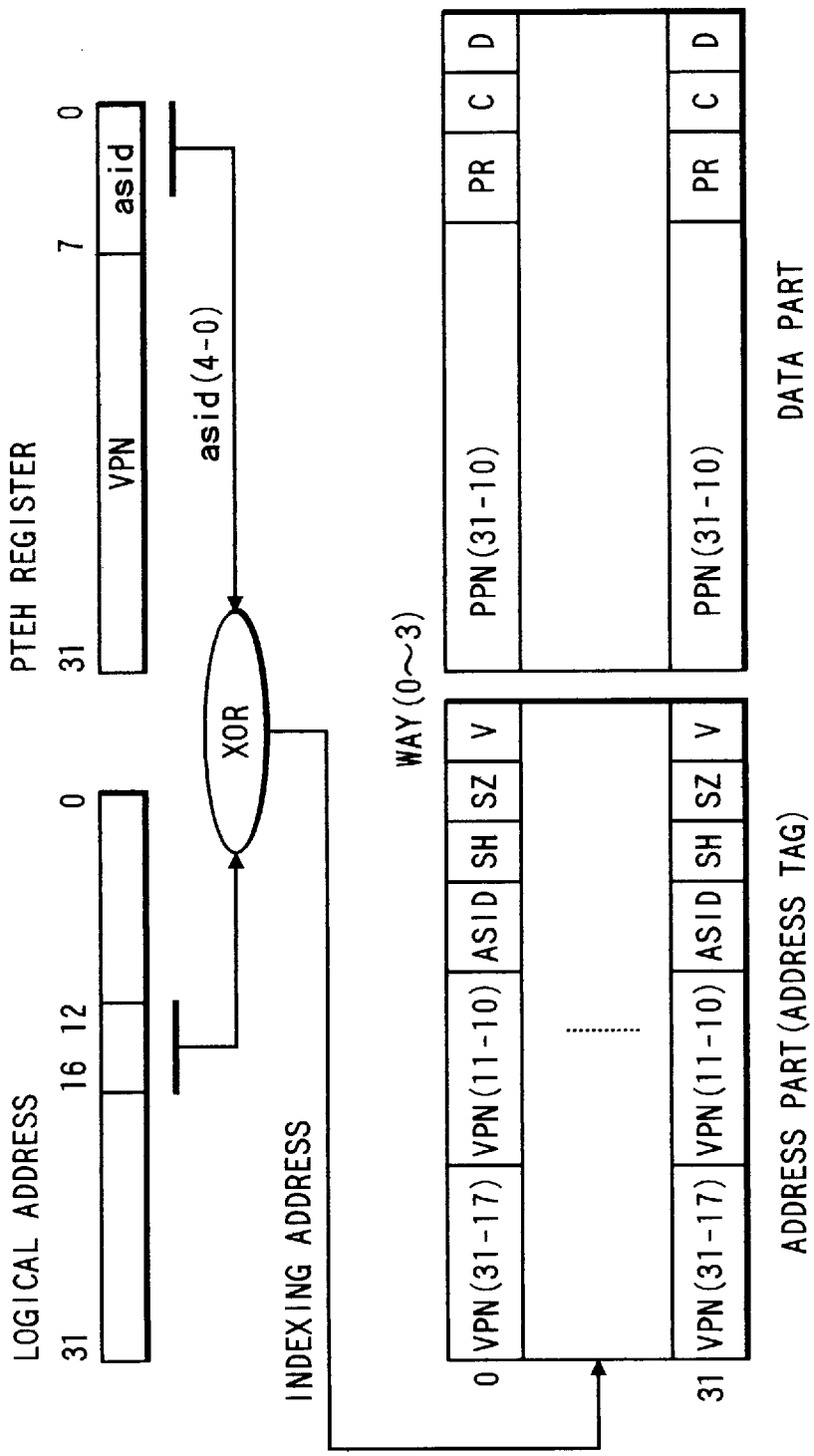
FIG. 17 is a schematic view showing how an address translation buffer is indexed by use of part of a logical page address and part of a process number.

FIG. 15 is a block diagram showing that addressing access operations to the cache memory CACHE-M and address translation buffer TLB are made possible only in the privileged mode of the central processing unit CPU. In FIG. 15, control of the access to the cache memory CACHE-M and address translation buffer TLB is shown centering on the indexing thereto. The address translation buffer TLB is supplied with bits 16-12 of the logical address. In the addressing access operation to the TLB, these bits correspond to the bank-designating bit field ENTRY of the address format for the addressing access operation in FIG. 7. The cache memory CACHE-M is fed with bits 10-4 of the logical address. In the addressing access operation to the CACHE-M, these bits correspond to the bank-designating bit field ENTRY of the address format for the addressing access operation in FIG. 12. As evident from the memory map of FIG. 3, an access right check circuit 60 checks the high-order 4 bits of the logical address to see if the logical address in question falls within the areas P1 through P4 that may be accessed only in privileged mode. Receiving the mode bit MD, the access right check circuit 60 checks to see if the logical address has a privilege fault (i.e., an attempt to access the areas P1 through P4 in user mode). If a privilege fault is detected, the access right check circuit 60 notifies the central processing unit CPU of an address error. In response, the central processing unit CPU interrupts the current instruction execution and branches to exception handling. Because the cache memory CACHE-M and address translation buffer TLB are mapped in the P4 area as shown in FIGS. 7 and 17, the addressing access operation to that area is made possible in privileged mode alone. In FIG. 15, the registers PTEH and MMUCR are part of the control registers included in the cache controller CACHE-C. XOR stands for an exclusive-OR circuit, and reference numeral 18 denotes a selector circuit. These components will be described in connection with another embodiment, to be described later.

In the description above, the microcomputer MPU embodying the invention is designed to support a plurality of page sizes. In another embodiment of the invention, the microcomputer may supplement the above feature with functions for supporting a plurality of indexing methods, for enhancing the degree of freedom in replacing TLB entries, and for supporting both simple and multiple virtual storage. The supplementary functions of the second embodiment will be discussed below with reference to FIGS. 16 through 33.

Figure 20:
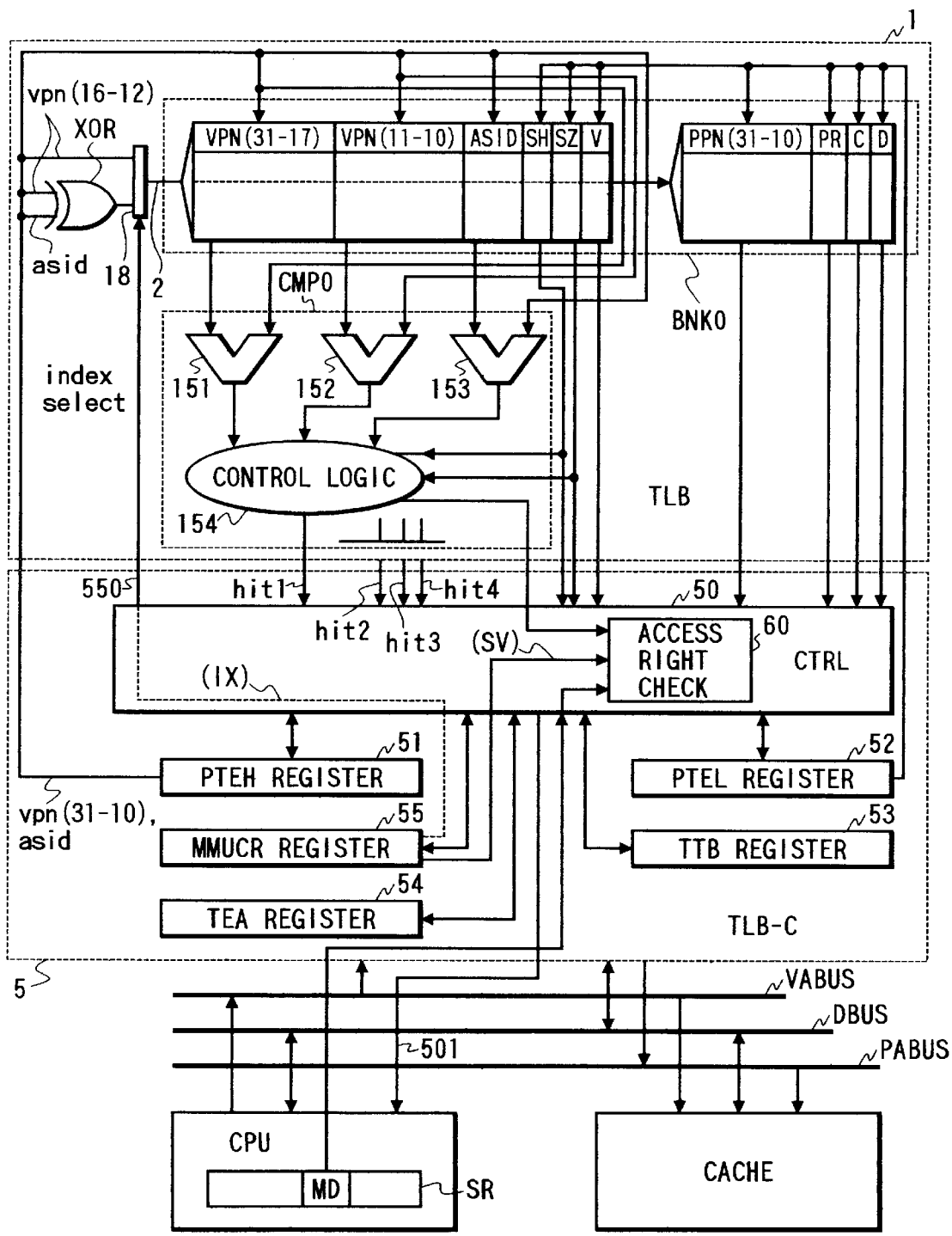
FIG. 20 is a block diagram of another microcomputer embodying the invention, with its memory management unit depicted specifically in detail.

FIG. 20 is a block diagram of a microcomputer practiced as the second embodiment of the invention, with its memory management unit MMU depicted specifically in detail. The microcomputer of FIG. 20 is formed, but not limited, by known semiconductor integrated circuit fabrication techniques on a single semiconductor substrate illustratively made of single crystal silicon. FIG. 20 includes as major circuit blocks a logical bus address VABUS, a physical address bus PABUS, a data bus DBUS, a central processing unit CPU, a cache unit CACHE, an address translation buffer TLB acting as a buffer memory, and a TLB controller TLB-C. The central processing unit CPU fetches an instruction from a program memory, not shown, performs data processing in accordance with the description of the fetched instruction, outputs a logical address onto the logical address bus VABUS if external access is needed, and places data onto the data bus DBUS for a data input/output operation. The cache unit CACHE is designed as, but not limited to, a four-way set associative memory unit. The indexing to banks is effected by use of part of the logical address supplied from the logical address bus VABUS. The entry tag retains a physical address. An indexed tag has its logical address translated by the address translation buffer TLB for comparison with the physical address to be output onto the physical address bus PABUS. The compare operation results in the judgment of a cache miss or hit.

The microcomputer as embodied above divides the logical address space into units called logical pages, and supports virtual storage for translating logical addresses into physical ones in units of these pages. The address translation buffer TLB holds as TLB entries logical-physical address translation pairs each combining a logical page number VPN with the physical page number PPN corresponding thereto. Using the address translation buffer TLB, the TLB controller TLB-C translates into a physical address each logical address output by the central processing unit CPU. The address translation buffer TLB is composed of a four-way set associative cache memory with four banks having index addresses commonly furnished therebetween. To avoid complicating the illustration, FIG. 20 shows only one representative bank BNK0. In practice, however, there exist other banks BNK1 through BNK3 of the same type as the bank BNK0 in the direction of the depth of FIG. 20, as indicated in FIG. 6. The address translation feature supporting the above-described virtual storage is constituted by the address translation buffer TLB, the TLB controller TLB-C, the central processing unit CPU, and the system program or operating system for address translation and memory protection.

The address space of the microcomputer practiced as the second embodiment is the same as that already discussed with reference to FIGS. 3 (A) and 3 (B). There are two methods for setting the microcomputer in privileged mode: (1) by generating an exception or interruption, and (2) by executing a privileged mode setting instruction (TRAPA). Upon access to the address translation buffer TLB and cache memory CACHE described with reference to FIGS. 5 and 10, the microcomputer is set in privileged mode by use of the method (2) above but not limited thereby. Alternatively, it is possible to access the address translation buffer TLB and cache memory CACHE with the microcomputer set in privileged mode using the method (1) above. Privileged mode, in which the central processing unit CPU can execute all instructions and access all registers, is distinguished from user mode in which the CPU is inhibited from executing instructions that would seriously affect the system and from accessing the registers and memory areas under system control, and is allowed to execute specific instructions alone and to access only specific registers and memory areas. That is, the CPU in privileged mode may perform on the address space an access operation that would be regarded as an address error in user mode and may execute privileged instructions or system control instructions which cannot be executed in user mode. The central processing unit CPU is put in privileged mode when, illustratively, the mode bit MD is set to 1; the CPU is placed in user mode when the mode bit MD is set to 0.

As with the first embodiment, the microcomputer of the second embodiment supports two logical page sizes: 4 KB and 1 KB. Likewise, the maximum logical page size (=4 KB) is determined by multiplying the minimum logical page size (=1 KB) by 2 to the n-th power, and the number of banks for the address translation buffer TLB is at least equal to the result of that multiply operation. With the second embodiment, the relationship between the logical page size on the one hand, and the offset and logical page number (logical page address) on the other is as described earlier with reference to FIG. 4. Regardless of the page size being 4 KB or 1 KB, the indexing to the address translation buffer TLB is effected using information in the low-order 5 bits of a logical page address with a page size of 4 KB (i.e., bits 12–16 of the 32-bit logical address). The entries accommodated in the address translation buffer TLB are the same as those discussed above in connection with FIG. 4.

The conceptual difference between single virtual storage and multiple virtual storage will now be described with reference to FIGS. 32 (A) and 32 (B). Multiple virtual storage involves qualifying or extending each logical address with a process number asid where each of a plurality of processes has individual address translation information covering the entire logical space. In contrast, single virtual storage involves not qualifying or extending each logical address with the process number asid where a plurality of processes are each assigned exclusively part of the logical address space and where each process has address translation information about the logical address space assigned thereto. Because a plurality of processes are each assigned exclusively part of the logical address space in a single virtual storage setup, that part of the logical address space which is assigned to each process has its own address translation information, as shown in FIG. 32 (*b*). This means that there exists only one address translation table. With the single address translation table in use, a given logical address A is translated uniquely into its corresponding physical address D. In a multiple virtual storage setup, a plurality of processes are assigned parts of the logical address space in a mutually overlapping manner. It follows that the address information for each process must be contained in a separate address translation table. Specifically, a given logical address A may be translated into different physical addresses B and C through the use of different address translation tables i and j. The process to which the logical address A to be translated belongs is identified by the process number of the address. As shown in FIG. 32 (A), with multiple virtual storage in use, the address translation tables i and j correspond to the process numbers i and j respectively. Each process number may be regarded as an identification number for each of a plurality of processes utilizing (i.e., accessing) the same logical address space.

In FIG. 20, the TLB controller TLB-C has a control circuit (CTRL) 50, a page table entry high-order (PTEH) register 51, a page table entry low-order (PTEL) register 52, a translation table base (TTB) register 53, a TLB exception address (TEA) register 54, and a control (MMUCR) register 55. As will be explained later with reference to FIG. 34, these registers are subject to direct read/write operations by the central processing unit CPU. The registers 51 through 53 may also be accessed directly by the central processing unit CPU.

Figure 16:
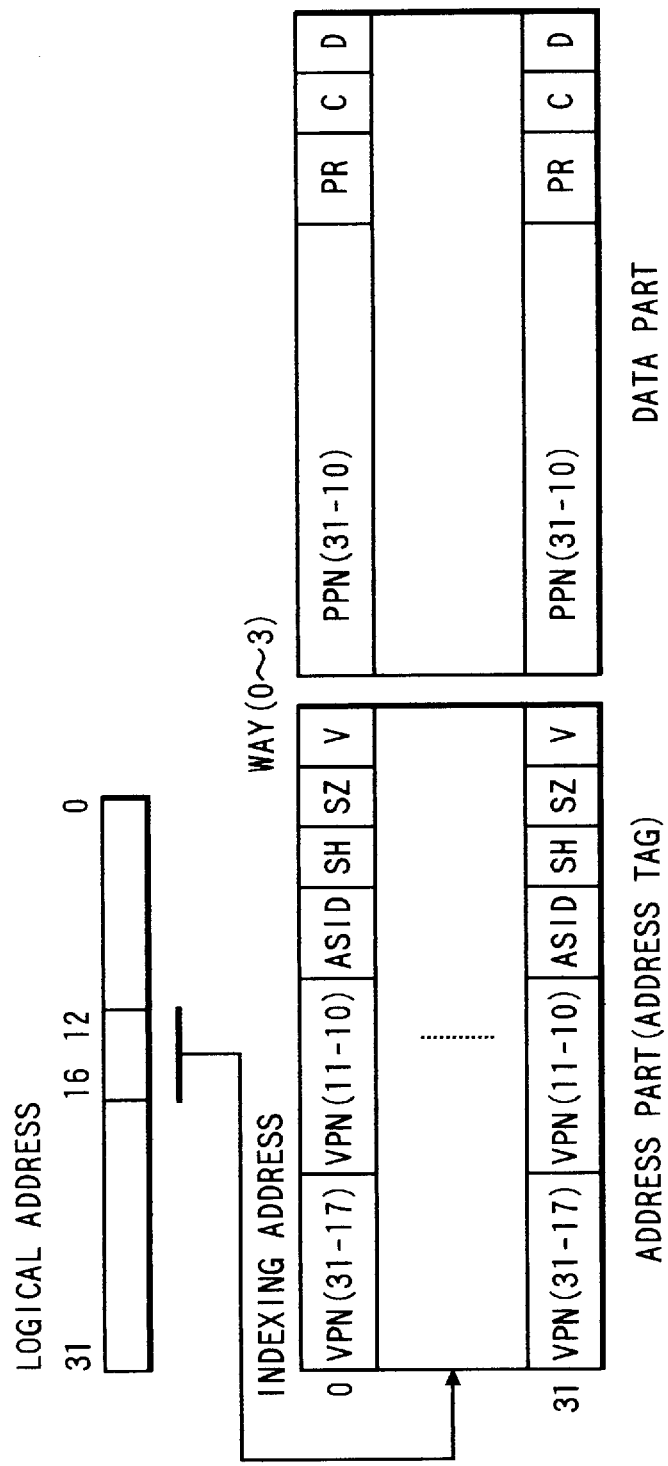
FIG. 16 is a schematic view indicating how an address translation buffer is indexed with part of a logical page address utilized unmodified.

As depicted in FIG. 19, the PTEH register 51 and PTEL register 52 each have a page table entry field in which to update or add an entry of the address translation buffer TLB at the time of a TLB miss. By executing an appropriate program, the central processing unit CPU sets the space number asid of the current process to the PTEH register 51. In the event of a TLB miss, The PTEH register 51 is capable of retaining that logical page address vpn of the TLB miss which is output by the central processing unit CPU. The offset of the logical address from the central processing unit CPU is held in a latch circuit, not shown, inside the control circuit CTRL 50. The TTB register 53 points to the base address of the current page table. The TEA register 54 accommodates the logical address relative to which a TLB exception or an address error exception has occurred. The MMUCR register 55 comprises an address translation bit AT designating whether or not address translation is to be enabled (1=enabled; 0=disabled), a TLB flush bit TF designating the flushing of the address translation buffer TLB, a two-bit random counter field RC, an index mode bit IX for designating index mode, and a single virtual bit SV (single virtual storage is selected when SV=1; multiple virtual storage is selected when SV=0). When the index mode bit IX is set to 1, the embodiment selects an indexing method that utilizes bits 0–4 of the current space number asid and bits 12–16 of the logical page number vpn, as shown in FIG. 17. When the index mode bit IX is set to 0, the embodiment selects another indexing method that employs bits 12–16 of the logical page number output by the central processing unit CPU, as depicted in FIG. 16. More specifically, the index address in effect when the index mode bit IX is 1 is the output of an exclusive-OR gate XOR. The exclusive-OR gate XOR ORs bits 0–4 of the space number asid held by the PTEH register 51 and bits 12–16 of the logical page number vpn output by the central processing unit CPU, as shown in FIG. 20. The selector 18 in FIG. 20 selects as the index address either the hashed output of the exclusive-OR gate XOR, or bits 16-12 of the logical page number vpn. The selection is controlled according to the value of the index mode bit IX and is triggered by a selection signal 550 from the control circuit CTRL 50.

Referring to FIG. 20, of bits 31-10 constituting the logical page number vpn of the logical address output by the central processing unit CPU, bits 12–16 (vpn) are used to generate an index address 2 common to the four banks BNK0 through BNK3 of the TLB. Since the logical page number is given in 5 bits as mentioned earlier, the common index address 2 causes one of 32 entries in each of the banks to be selected and read out. Each of the selected entries comprises VPN (bits 31-17), VPN (bits 11-10), ASID, SH, SZ, V, PPN (bits 31-10), PR, C and D. After being read out, the VPN field (bits 31-17) is compared by a comparator 151 with the vpn field (bits 31-17) of the logical address output by the central processing unit CPU; the VPN field (bits 11-10) is compared by a comparator 152 with the vpn field (bits 11-10) of the logical address from the CPU. The read-out process number ASID is compared by a comparator 153 with the current process number asid held in the PTEH register 51. After the compare operation, a control logic circuit 154 checks to see whether a miss or a hit has occurred in the bank BNK0 in consideration of the share status bit SH, page size bit SZ, single virtual bit SV and mode bit MD. The judgment of a miss or a hit in the bank BNK0 is represented by a hit signal hit1. The comparators 151 through 153 are provided in each of the banks NBK0 through BNK3. FIG. 20 shows in a representative manner the respective hit signals hit2 through hit4 for the banks BNK1 through BNK3. With the second embodiment, the level of the outputs from the comparators 151 through 513 is considered a match level when brought High. The hit signals hit1 through hit4 each attain a hit level when driven High. The control circuit 50 recognizes a TLB hit when any one of the hit signals hit1 through hit4 is brought to the hit level. Reference numeral 501 in FIG. 20 is a TLB hit signal used by the control circuit 50 to notify the central processing unit CPU of the result of the TLB hit-or-miss judgment. In the event of a TLB miss, the entry in the address translation buffer TLB is replaced. The content of the entry to be replaced is placed into the PTEH register 51 and PTEL register 52. In turn, the PTEH register 51 and PTEL register 52 supply replacing information to the address translation buffer TLB. The indexing method for selecting the entry to be replaced is the same as that for the read operation, except that the value RC (MMUCR.RC) in the MMCCR register 55 determines the bank (set) in which to store the entry in question.

Figure 33:
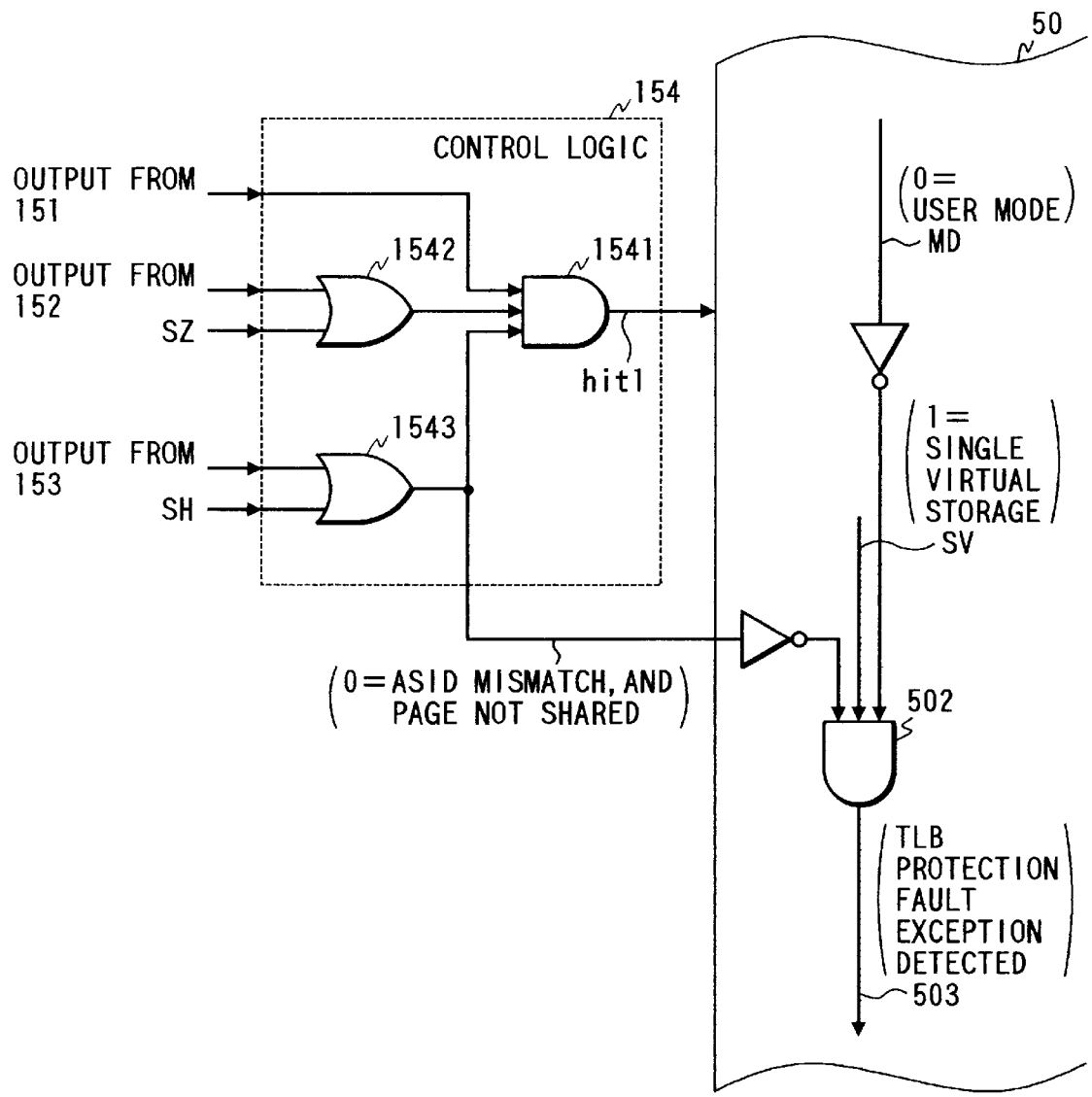
FIG. 33 is a circuit diagram of a logic circuit for controlling the result of an address compare operation to be reflected in the hit signal for each bank in an address translation buffer.

FIG. 33 is a circuit diagram of the control logic circuit 154. In FIG. 33, reference numeral 1541 is a three-input AND gate, 1542 is a two-input OR gate, and 1543 is another two-input OR gate. The OR gate 1542 admits the output of the comparator 152 and the size bit SZ from the indexed TLB entry, the comparator output being the result of having compared the VPN field (bits 11-10) in the indexed TLB entry (selected by the index address and then read out) with the vpn field (bits 11-10) included in the logical address. The size bit SZ designates the 4 KB logical page size when set to 1. Upon an address compare operation for a TLB miss-or-hit judgment with the 4 KB logical page size in effect, there is no need to compare the VPN field (bits 11-10) in the TLB entry with the vpn field (bits 11-10) from the central processing unit CPU. This means that with the size bit SZ set to 1, the result of the compare operation on address bits 11-10 is not reflected in the output signal hit1 of the AND gate 1541. On the other hand, the 1 KB logical page size is designated when the size bit SZ is set to 0. With the 1 KB logical page size in effect, a compare operation on address bits 11-10 is needed for the TLB miss-or-hit judgment. The result of the judgment is reflected in the signal hit1.

The OR gate 1543 admits the output of the comparator 153 and the share status bit SH in the index TLB entry, the comparator output being the result of having compared the process number ASID in the indexed TLB entry with the current process number asid (i.e., process number output from the PTEH register 51). When the share status bit SH is set to 1 (i.e., where a logical page is shared between processes), the address compare operation for the TLB miss-or-hit judgment has no need for comparing process numbers. It follows that with the share status bit SH set to 1, the result of the process number compare operation is not reflected in the output signal hit1 of the AND gate 1541. When the share status bit SH is set to 0 (i.e., where no logical page is shared between processes), the address compare operation for the TLB miss-or-hit judgment requires comparing process numbers. Thus with the share status bit SH set to 0, the result of the process number compare operation is reflected in the output signal hit1 of the AND gate 1541.

The process number ASID held in the TLB entry is utilized as memory protection information (domain number) in a single virtual storage setup. That is, the share status bit SH indicates whether or not the logical page is shared between processes regardless of single or multiple virtual storage being in effect. Where the nonsharing of the logical page is designated in a multiple virtual storage setup, a mismatch between the current process number asid and the process number ASID in the TLB entry is interpreted as a TLB miss. In contrast, with the nonsharing of the logical page in effect in a single virtual storage setup, a mismatch between the current process number asid and the process number ASID in the TLB entry is utilized for detection of a TLB protection fault exception. This feature is implemented by the control circuit 50 using an AND gate 502 in FIG. 33, the AND gate acting as a logical circuit for checking the access right. The AND gate 502 admits three inputs: the inverted output from the OR gate 1543, the single virtual bit SV from the MMUCR register, and the inverted signal of the mode bit MD from inside the status register of the central processing unit CPU. In response, the AND gate 502 outputs a TLB protection fault exception detection signal 503. The signal 503 indicates the detection of a TLB protection fault exception when driven High. A TLB protection fault exception is detected by use of the signal 503 on condition that there is a mismatch between process numbers, that the logical page is not shared between processes (i.e., when the output of the OR gate 1543 is Low), that single virtual storage is in effect (SV=1), and that the user mode bit MD is set to 0. That is, with single virtual storage in effect, a TLB miss is detected effectively in the event of a mismatch between process numbers and of the nonsharing of the logical page between processes. This state is regarded as a TLB protection fault exception to provide for memory protection. In the privileged mode designated by the mode bit MD being set to 1, the TLB protection fault exception is not detected. This is because logical pages assigned to other processes are also desired to be accessed from the current process in privileged mode.

Figure 22:
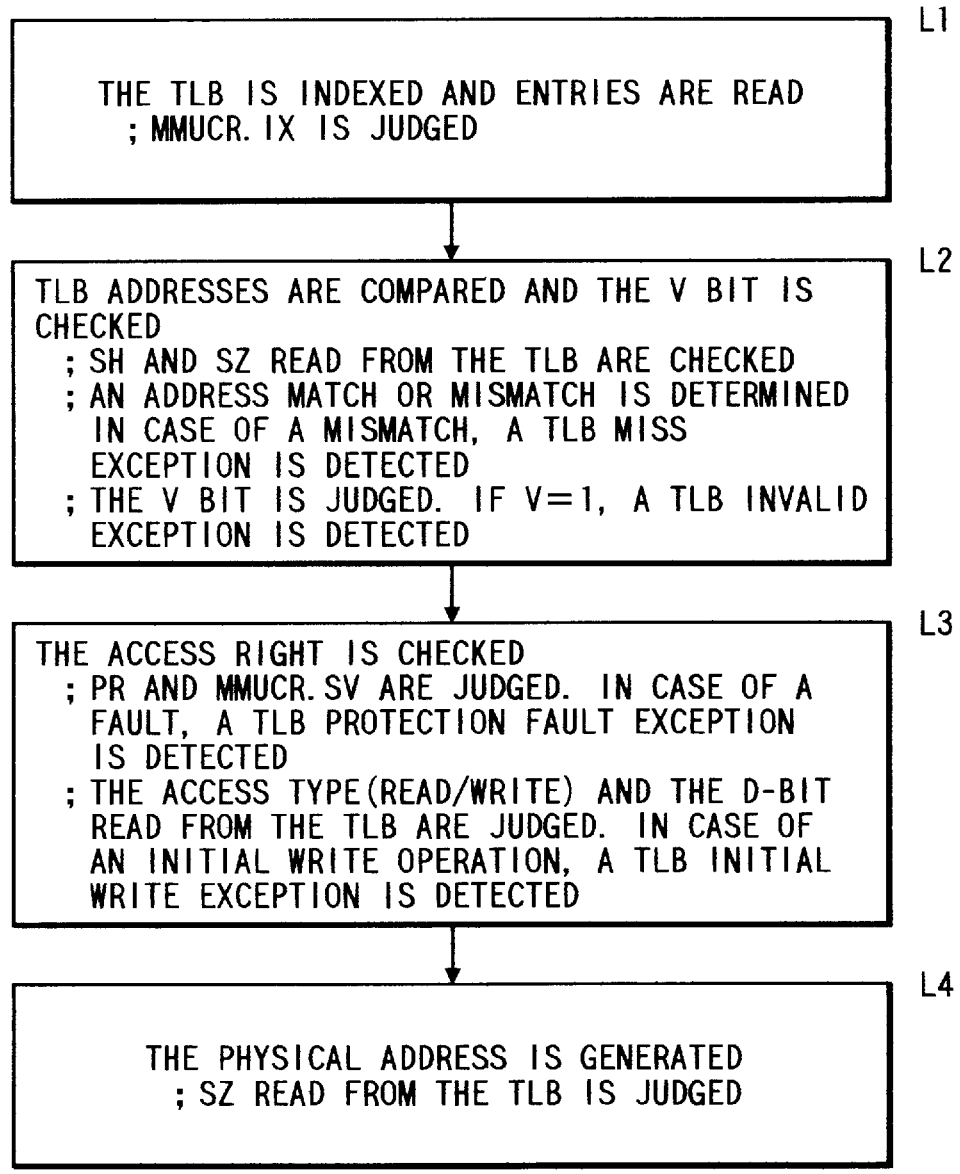
FIG. 22 is a main flowchart of address translation control.

FIG. 22 is a main flowchart of address translation control effected by the control circuit 50. The flow of control comprises four processing levels: level L1 for indexing the address translation buffer TLB, level L2 for comparing addresses and checking the V bit, level L3 for checking the access right, and level L4 for generating a physical address. These processes are controlled by the central processing unit CPU and by the controller 5.

At the processing level L1 where the address translation buffer TLB is indexed, the logical address to be used is provided by the vpn field (bits 16-12) regardless of the logical page size. The value IX in the MMUCR register 55

Figure 23:
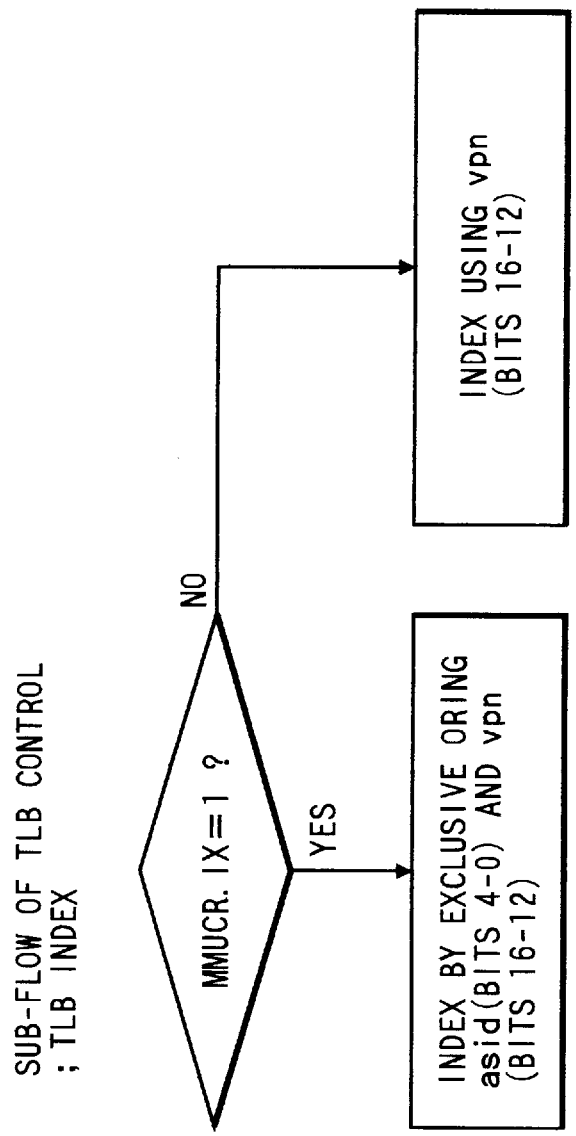
FIG. 23 is a flowchart of control over the selection of indexing techniques for an address translation buffer.

(MMUCR.IX) determines whether or not the index address is constituted by the logical address being hashed by an exclusive-OR gate XOR using a partial space number asid (bits 4-0). As shown in FIG. 23, when the value MMUCR.IX is set to 1, the logical address to be used is hashed by utilizing the asid field (bits 4-0) to make up the index address. When the value MMUCR.IX is set to 0, the vpn field (bits 16-12) is used unmodified as the index address. The first indexing method is depicted in FIG. 17, and the second indexing method is illustrated in FIG. 16. When the address translation buffer TLB is indexed, one of 32 entries in each of the banks BNK0 through BNK3 is selected and read out. Each of the selected entries comprises VPN (bits 31-12), VPN (bits 11-10), ASID, SH, SZ, V, PPN (bits 31-10), PR, C and D.

Figure 24:
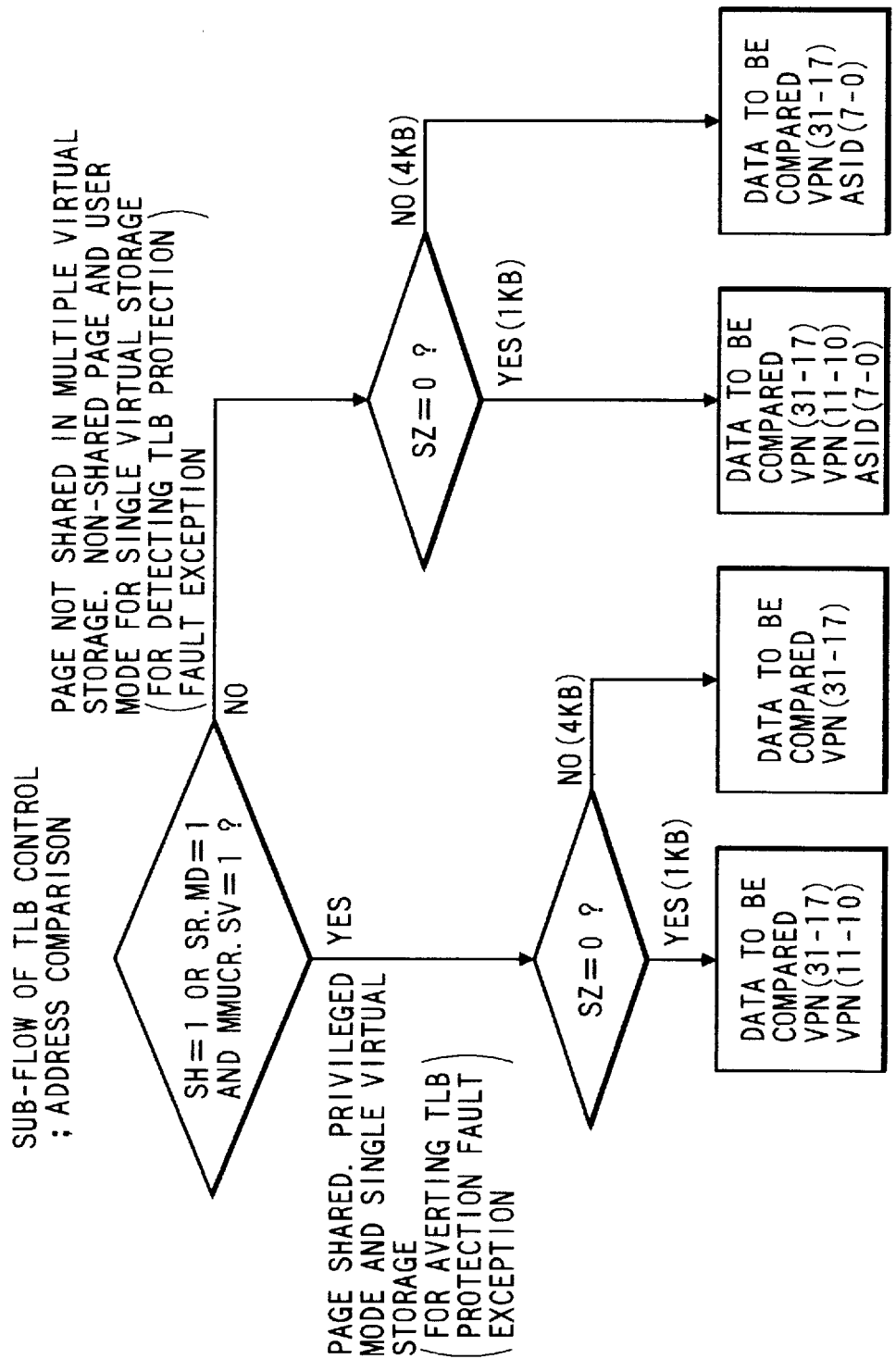
FIG. 24 is a flowchart of control over address compare operations comparing logical addresses with the tags indexed thereby.

At the processing level L2 where addresses are compared and the V bit is checked, the address compare operation is performed according to the procedure illustrated in FIG. 24. The procedure, based on the logic of the control logic circuit 154, also provides for detection of a TLB protection fault exception when the space number ASID is compared. Below is a description of how to determine the range of the address compare operation whose result is to be reflected in the hit signals hit1 through hit4. Whether the share status bit SH is set to 1 or 0 determines whether or not the space number is to be taken into account for the address compare operation. Whether the size bit SZ is set to 1 or 0 determines whether or not the VPN field (bits 11-10) is to be considered for the address compare operation. In particular, with single virtual storage in effect (SV=1), the data in the space number field ASID is used as memory protection information. However, if privileged mode is selected (MD=1) with single virtual storage in effect (SV=1), the space number field ASID is exempt from the address compare operation for a specific purpose: to let the current process gain access to logical pages assigned to other processes, i.e., to suppress detection of a TLB protection fault exception.

After the TLB entry is read by indexing the address translation buffer TLB, the share status bit SH in the read-out TLB entry is used as the basis for determining whether or not to consider the space number ASID for the address compare operation. When the share status bit SH is set to 1 (sharing state), the space number ASID is not considered for the address compare operation; when the share status bit SH is set to 0 (nonsharing state), the space number ASID is considered for the address compare operation. If privileged mode is designated by the mode bit MD of the status register SR (SR.MD) being set to 1 where single virtual storage is selected by the SV bit of the MMUCR register 55 (MMUCR.SV) being set to 1, the space number ASID is not considered for detection of a TLB protection fault exception. This is because the nature of privileged mode requires that the current process be allowed to access logical pages assigned to other processes.

With the second embodiment, either the 1 KB or the 4 KB logical page size is selected in accordance with the value of the size bit SZ in the TLB entry. When the 1 KB logical page size is selected, the information bits VPN (bits 31-17) and VPN (bits 11-10) in the indexed TLB entry of each bank are compared with the corresponding bits vpn (31-17) and vpn (bits 11-10) in the logical address. When the 4 KB logical page size is selected, the information bits VPN (bits 11-10) in the indexed TLB entry of each bank and the corresponding bits vpn (bits 11-10) in the logical address are exempt from the address compare operation.

The fields to be compared (VPN (bits 31-17, bits 11-10), vpn (bits 31-17, bits 11-10), ASID, asid) are determined as described above and are subjected to the address compare operation. If the compare operation results in a match in any bank, that bank outputs a hit signal (any one of hit1 through hit4) indicating a TLB hit. If no hit signal comes from any bank, i.e., in case of a mismatch in all banks, a TLB miss exception is detected. The result is also sent to the central processing unit CPU through the use of the signal 501. In response, the central processing unit CPU performs TLB miss exception handling, to be described later.

A check is made on the V bit in the indexed entry of each bank (i.e., on the V bit in the entry read out by indexing). Where the entry pertaining to a TLB hit has its V bit set to 1 (invalid), a TLB invalid exception is detected and is reported to the central processing unit CPU. What the CPU does in handling this exception will be described later. In the event of a TLB miss, the result of the check on the V bit is used for replacement of the entry pertaining to the miss, as will be described later.

Figure 25:
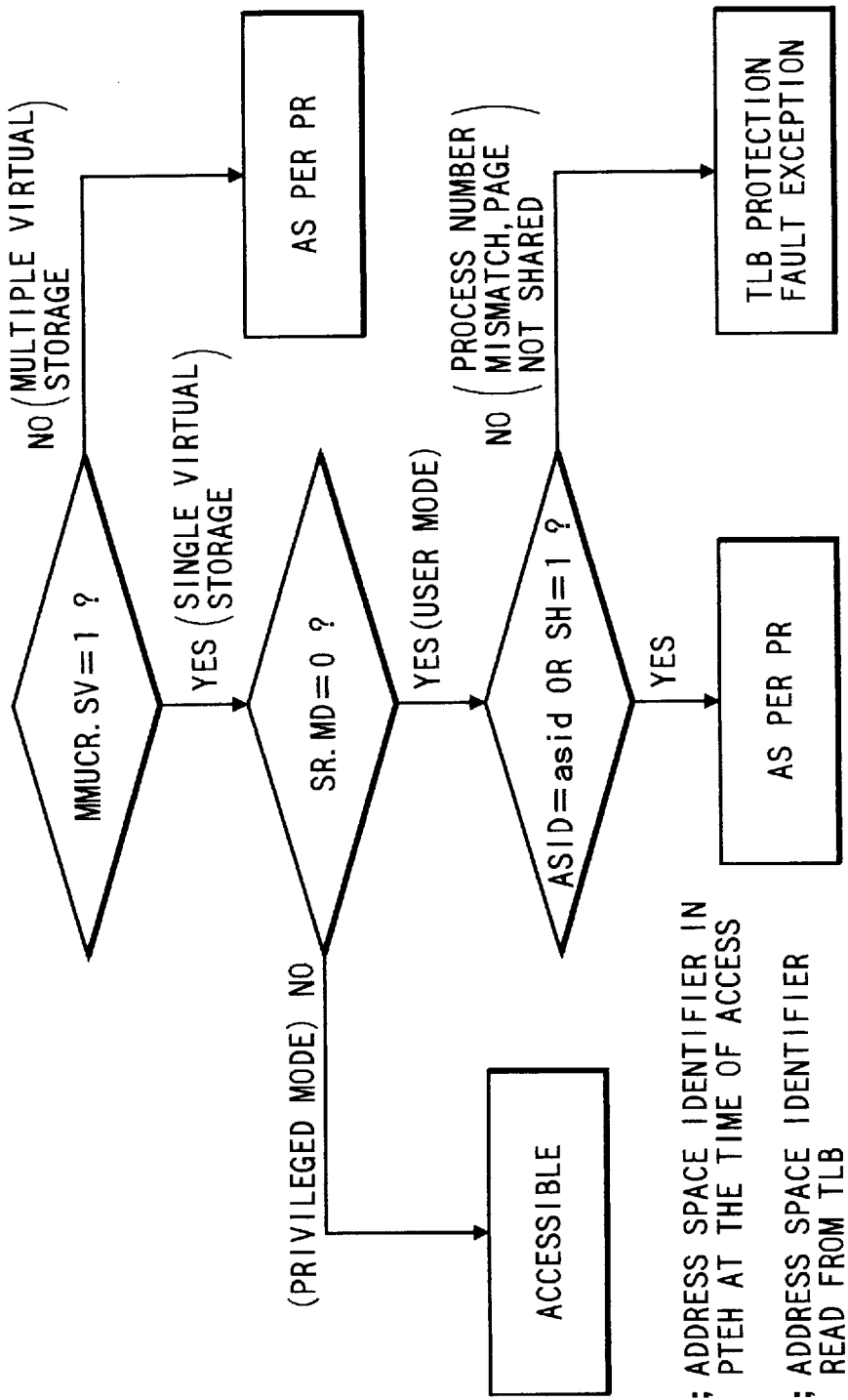
FIG. 25 is a partial flowchart of memory protection control involving the use of process numbers for memory protection in a single virtual storage setup.

At the processing level L3, the access right is checked in accordance with the content of the protection key field PR in the TLB entry read out by indexing and according to the bit MMUCR.SV in the MMUCR register. For example, as shown in FIG. 25, a check is first made to see if the bit MMUCR.SV in the MMUCR register is 1 (single virtual storage) or 0 (multiple virtual storage). If multiple virtual storage is found to be in effect (SV=0), the address space represented by the information in the TLB entry is protected in accordance with the content of the protection key field PR of FIG. 21. If single virtual storage is found to be selected (MMUCR.SV=1) with privileged mode in effect (bit SR.MD =1 in the status register), the address space denoted by the information in the TLB entry may be accessed unconditionally. Where user mode is selected (SR.MD=0) with single virtual storage in effect, the space number ASID and the share status bit SH are considered in checking the access right. That is, where there is a match between the space number asid in the PTEH register 51 at the time of access and the space number ASID read from the address translation buffer TLB, with the share status bit SH being 1 (sharing state), the address space represented by the information in the TLB entry is protected according to the protection key field PR. On the other hand, if there is a mismatch between the process numbers with the SH bit being 0 (nonsharing state), a TLB protection fault exception is detected. The content of this exception will be discussed later. Also at the access right checking level L3, a check is made on the type of the access (for reading or for writing) and a check is also made on the D bit of the entry read from the address translation buffer TLB. If the access is an initial write operation (i.e., initial write access following power-up or reset), a TLB initial page write exception is detected. In other words, a TLB initial page write exception is detected on condition that the dirty bit D in the TLB entry is found to be 0 following a TLB hit from comparing the logical address with the indexed TLB entry and that the access in question is a write access operation. How to handle the TLB initial page write exception will be described later.

Figure 26:
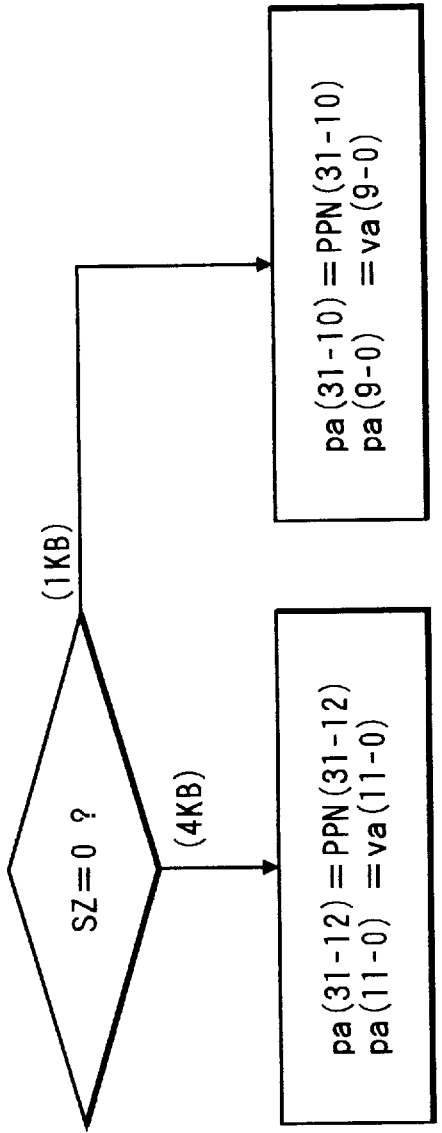
FIG. 26 is a flowchart of steps for generating physical addresses according to the page size.

At the processing level L4, a physical address is generated in accordance with the size bit SZ in the indexed TLB entry, as shown in FIG. 26. The offset va (bits 9-0) of the logical address va used to generate the physical address pa is held in a latch circuit, not shown, in the control circuit CTRL. When the size bit SZ is 0 (i.e., when the logical page size is 1 KB), the offset va (bits 9-0) of the logical address va from the central processing unit CPU is taken as the offset pa (bits 9-0) of the physical address pa. All bits PPN (bits 31-10) of the physical page number contained in the data part of the hit TLB entry is taken as the physical page address pa (bits 31-10). This physical page address is supplemented on its low-order side by the offset of address bits 9-0, whereby the physical address pa is generated. When the size bit SZ is 1 (i.e., when the logical page size is 4 KB), the offset va (bits 11-0) of the logical address va from the central processing unit CPU is taken as the offset pa (bits 11-0) of the physical address pa. Of the physical page number bits PPN contained in the data part of the hit TLB entry, the PPN bits 31-12 with the low-order two bits discarded are taken as the physical page address pa (bits 31-12). This physical page address is supplemented on its low-order side by the offset of address bits 11-0, whereby the physical address pa is generated.

Figure 27:
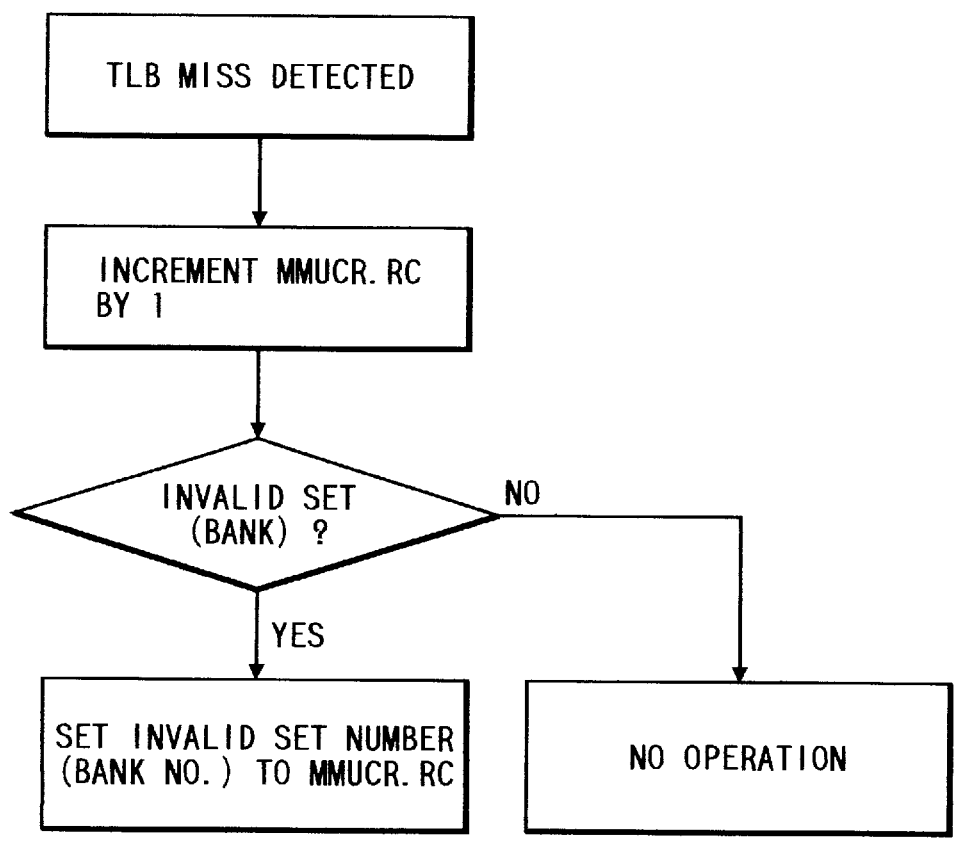
FIG. 27 is a flowchart of control showing how the bank for entry replacement in the TLB is designated on a hardware basis.

FIG. 27 is a flowchart of hardware-based control steps for designating the bank for entry replacement at the time of a TLB miss exception detected at the processing level L2 (for address comparison and V bit check). This type of control is effected uniquely by the control circuit 50 according to its logical constitution using the MMUCR.RC bits as a random counter field. The number of the MMUCR.RC bits multiplied by 2 is equal to the number of banks (=4) of the address translation buffer TLB. Where none of the hit signals hit1 through hit4 denotes a hit state, the control circuit 50 judges that entry replacement is needed in the address translation buffer TLB in connection with the TLB miss. After the judgment, the control circuit 50 increments the content of the MMUCR.RC field by 1. The control circuit 50 then checks the V bit in each of the four indexed entries to see if any of the entries is invalid. If a given entry is found to have its V bit set to 1 (meaning that the indexed entry of the bank retains valid data), the incremented result is taken as the number of the bank to be replaced, and no operation is performed on the MMUCR.RC field. If a given entry is found to have its V bit set to 0 (meaning that the indexed entry of the bank has no valid data), the bank number of the bank having the invalid entry is set to the MMUCR.RC field, and the bank whose bank number has been set is taken as the bank to be replaced. Each of the MMUCR.RC bits may be changed in value by the central processing unit CPU executing an appropriate program. This means that the bank number set as described in the MMUCR register may be altered by software. That is, any bank may be selected as the bank for replacement.

Figure 28:
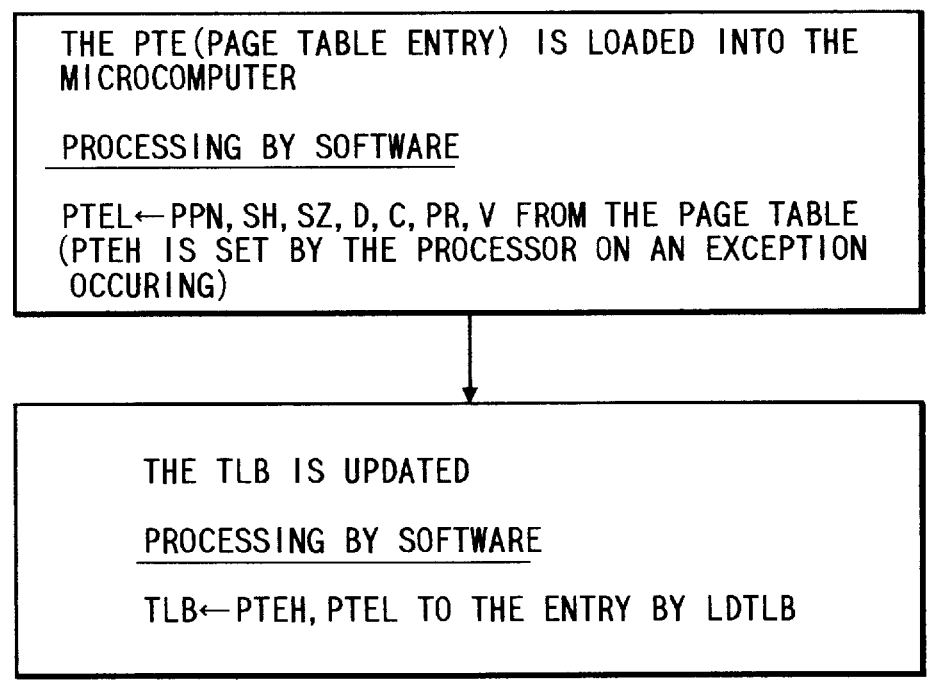
FIG. 28 is a flowchart of typical steps performed by a TLB miss handler in updating a TLB entry in the event of a TLB miss exception.

FIG. 28 shows typical steps performed by a TLB miss handler in updating a TLB entry in the event of a TLB miss exception. A load TLB instruction is employed to update the entry in the address translation buffer TLB. By executing the load TLB instruction (also denoted as LDTLB), the central processing unit CPU provides the following processing: the values of the PTEH and PTEL registers 51 and 52 are first written to an entry in the address translation buffer TLB. The entry to which to write the values is, but not limited to, one which exists within the bank designated by the bank number set in the MMUCR.RC field and which is designated by the index address made of the logical address (bits 12–16) held in the PTEH register 51. When the TLB miss exception is detected, part of the current logical address (bits 10–31) from the central processing unit CPU is retained in the PTEH register 51. Thus the entry to be replaced is designated by the index address having the same value as that in effect in the event of the TLB miss exception that occurred. The bank used for the replacement is determined by the bank number set in the MMUCR.RC field.

Figure 34:
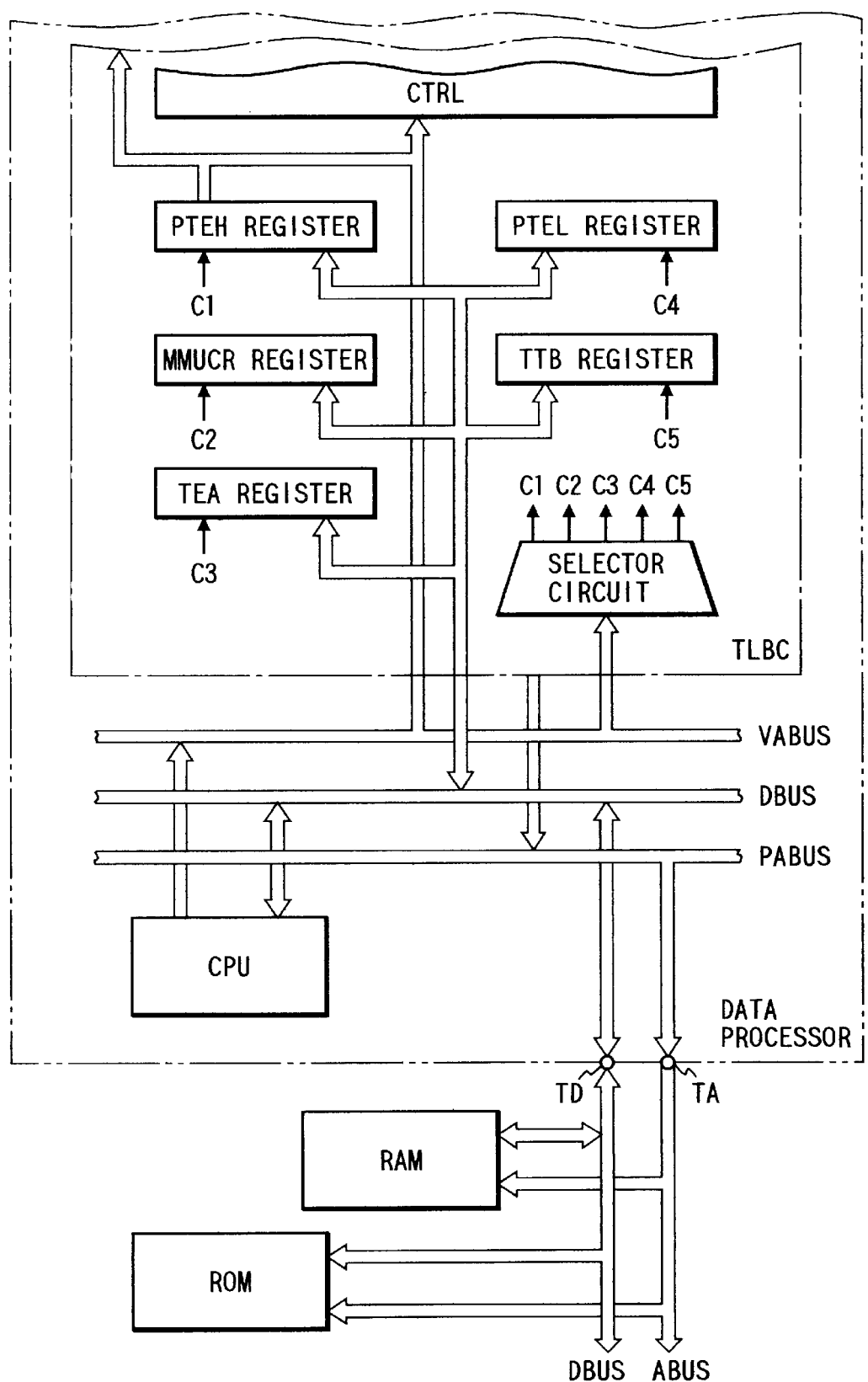
FIG. 34 is a block diagram showing a partially enlarged portion of the embodiment in FIG. 20.

In dealing with the TLB miss exception, the user prepares a page table in an external memory (RAM) such as one shown in FIG. 34. Illustratively, the page table contains in a predetermined manner a plurality of items of translation information (page table entries) corresponding to a plurality of logical addresses. A suitable address in the page table (e.g., the start address) is placed beforehand in the TTB register 53 as a base address. The page table illustratively arranges its multiple page table entries in correspondence with the multiple logical addresses in such a manner that any of the entries (each including the corresponding physical page number ppn, valid bit v, protection bit pr, size bit sz, cacheable bit c, dirty bit d, and share status bit sh) may be looked up given a logical address and with respect to the base address used as the start address.

The TLB miss handler is described by the user. When a TLB miss exception is detected, the central processing unit CPU starts the TLB miss handler. After getting started, the TLB miss handler places into the PTEH register 51 the logical address information vpn (bits 10–31) in effect at the time of the TLB miss that occurred. At this point, the PTEH register 51 may also accommodate the space number asid in effect at the time of the TLB miss. The central processing unit CPU searches through the page table in the external memory by use of the base address in the register TTB 53 and of the logical address in effect at the time of the TLB miss. When the search turns up the page table entry that corresponds to the logical address in effect at the time of the TLB miss, the content of the detected page table entry is loaded into the PTEL register 52. Then a load TLB instruction is issued. This causes the corresponding entry in the address translation buffer TLB to be updated by the values in the PTEH and PTEL registers 51 and 52. The information bits vpn and asid of the logical address in effect at the time of the TLB miss (those bits are retained in the PTEH register 51) are to be adopted as VPN and ASID, i.e., as part of the TLB entry. As discussed above, the entry to be replaced at this point is one which exists in the bank designated by the bank number set in the MMUCR.RC field and which is designated by the index address whose value is the same as that in effect at the time of the TLB miss that occurred.

The TLB invalid exception mentioned above occurs in the event of a page fault following a TLB hit. When this exception is recognized, the necessary page table entry is restored in the external memory and the V bit in that entry is set to a logical 1. Then the page table entry in question is loaded from the external memory into the PTEL register 52. With the load TLB instruction issued, the entry in question in the address translation buffer TLB is updated using the values in the PTEH and PTEL registers 51 and 52.

When the TLB initial page write exception mentioned above is detected, the D bit in the corresponding page table entry in the external memory is set to a logical 1. After the page table entry in question is loaded from the external memory into the PTEL register 52, the load TLB instruction is issued. This causes the entry in question in the address translation buffer TLB to be updated using the values in the PTEH and PTEL registers 51 and 52. The information bits vpn and asid of the logical address that caused the exception are retained in the PTEH register 51. The situation that requires setting the D bit to 1 takes place upon an initial write operation onto the physical page area in the main memory. At the time of page swapping in a virtual storage setup, data contents must be consistent between an auxiliary memory and the main memory (e.g., the external memory in FIG. 34). This requires checking to see if the content of the page to be swapped in the main memory is to be copied back to the auxiliary memory. The dirty bit D is used for this check.

When the TLB protection fault exception mentioned above is detected, the logical page number vpn of the logical address that caused the exception is written to the PTEH register 51, and the logical page is written to the TEA register 54. Thereafter, the appropriate handler is started to resolve the protection fault. Where the MMUCR.RC field is used as a counter as discussed above, that counter should preferably be incremented so as to permit the writing of an entry to a new bank in handling the TLB miss exception. On the other hand, it is preferable not to increment the MMU-CR.RC field in handling the TLB invalid exception, TLB initial page write exception and TLB protection fault exception. This is because the latter exceptions sometimes require simply changing the D or V bit, with the result that the TLB is used efficiently if the old bank is used to accommodate the change instead of making the change to a new bank. However, this scheme is not limitative of the invention and may be replaced by any other suitable method.

Figure 29:
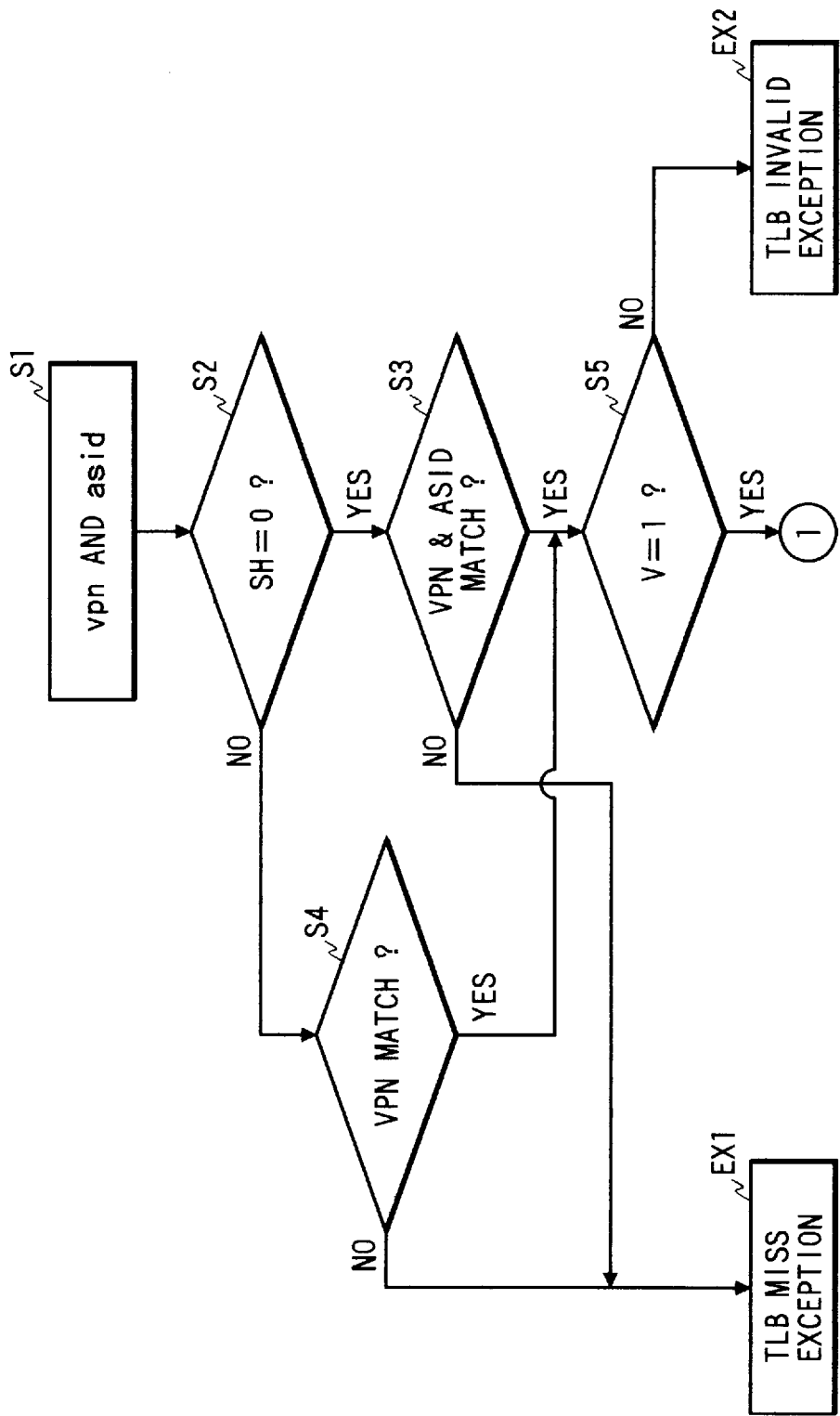
FIG. 29 is a flowchart depicting the first half of exception detection processing in an address translation buffer of single virtual storage.
Figure 30:
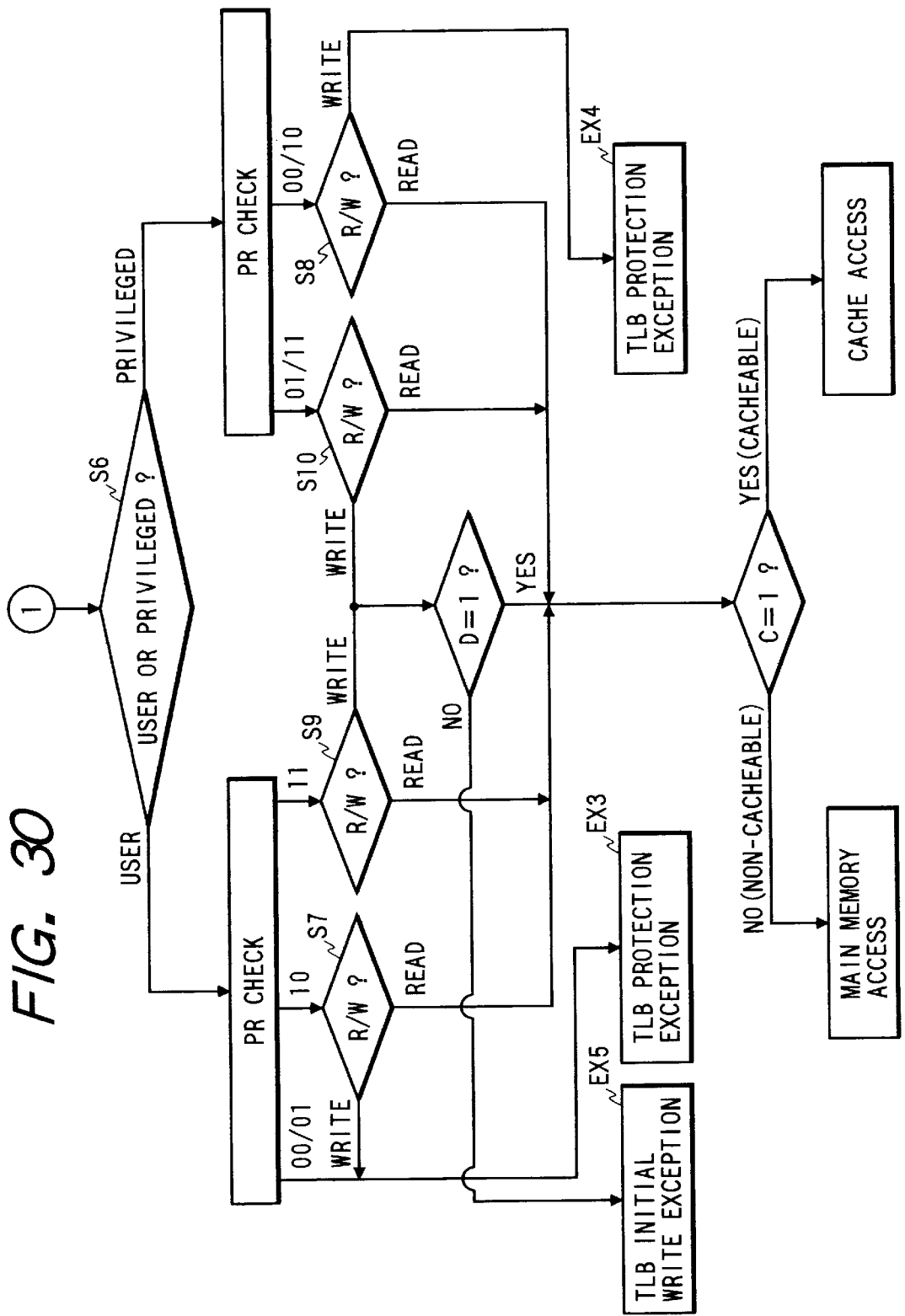
FIG. 30 is a flowchart indicating the second half of the exception detection processing in the address translation buffer of single virtual storage.

FIGS. 29 and 30 depict all steps for exception detection regarding the address translation buffer TLB in effect when the MMUCR.SV bit is 0 in the MMUCR register. Referring to FIG. 29, the address translation buffer TLB is first indexed in a suitable manner by use of the logical page number vpn of the logical address and the current space number asid (step 1). If the indexed entry is found to have its share status bit SH set to 0 (indicating nonsharing state, in step 2) and if the space number ASID or the virtual page number VPN fails to match (step 3), then a TLB miss exception is detected (EX1). If the indexed entry is found to have its share status bit SH set to 1 and if the virtual page number VPN fails to match (step 4), with ASID left uncompared, then a TLB miss exception is also detected (EX1). In the event of a TLB hit ("YES" in steps 3 and 4), a check is made to see if the V bit is 1 (step 5). If the V bit is found to be 0 (invalid), a TLB invalid exception is detected (EX2). If the V bit is 1 (valid), a check is made on the mode bit SR.MD in the status register to determine whether user mode or privileged mode is in effect (step 6), as shown in FIG. 30. With the central processing unit CPU found to operate in user mode, a check is made to see if the entry read by access from the CPU has its protection key field PR comprising information (PR=00 or 01) permitting access in privileged mode (i.e., access inhibited in user mode). If the PR field is found to contain 00 or 01, a TLB protection fault exception is detected (EX3). If the entry read by access in user mode is found to have its protection key field PR comprising 10, a further check is made to see if the access is for a read or for a write operation. As shown in FIG. 21, where the protection key field PR contains 10, the user is allowed to perform read access only. Thus if the user access turns out to be write access, the access type difference ("WRITE" in step 7) causes a TLB protection fault exception to be detected (EX3).

Where the CPU is found to operate in privileged mode, a check is made to see if the entry read by access from the CPU has its protection key field PR comprising information 00 or 10. If the PR field is found to have 00 or 10, another check is made to see if the current access type is consistent with the content of the PR field. If there is an inconsistency ("WRITE" in step 8), a TLB protection fault exception is detected (EX4). The type of access right permitted by the PR field differs depending on whether the central processing unit CPU operates in user mode or in privileged mode. In any case, if the attempted access is of a type other than that permitted by the PR field, a TLB protection fault exception is detected (EX3, EX4). If the access type is the write access ("WRITE" in step 9 or 10) permitted by the PR field and if the D bit in the entry is 0 (i.e., the page is yet to be written to), a TLB initial write exception (EX5) is detected. If the D bit in the entry is 1 and the C bit therein is 1, the cache unit CACHE is accessed; if the C bit is 0, the main memory (e.g., external memory RAM or ROM in FIG. 34) is accessed. If the access type is the read access ("READ" in steps 7 through 10) permitted by the PR field and if the C bit is 1, the cache unit CACHE is accessed; if the C bit is 0, the main memory is accessed.

FIG. 34 emphasizes how the registers shown in FIG. 20 are connected to the central processing unit CPU. Each of the registers is assigned its unique address. The logical address generated by the central processing unit CPU is sent over an internal logical address bus VABUS to a selector circuit in the TLB controller (TLB-C). The selector circuit decodes the received logical address. If the decoded logical address turns out to be one specific to any one of the registers, the selector circuit generates a selection signal by which to select that register. For example, if the logical address is found to be assigned to the PTEL register, the selector circuit generates a selection signal C4 to select the PTEL register. Other registers (PTEH, MMUCR, TEA, TTB) are each selected likewise. In other words, these registers are address-mapped. A write or read operation from the central processing unit CPU to or from the selected register is designated by the CPU using a read/write control signal sent over an internal control bus, not shown, to the register in question. As evident in FIG. 34, the registers and the central processing unit CPU are interconnected by way of an internal data bus DBUS. Although each of the registers is also connected to the control circuit 50 and TLB depicted in FIG. 20, these connections are not included in FIG. 34 to keep the figure from getting complicated. By executing an appropriate program, the central processing unit CPU may write data to any of the registers. Specifically, the appropriate program executed by the central processing unit causes the logical address assigned to the register in question to be output onto the bus VABUS and data to be output onto the bus DBUS. By having the read/write control signal designating a write operation, the central processing unit CPU may write data to the desired register. Likewise, the central processing unit CPU may read data from any of the registers by executing an appropriate program. That is, software execution makes it possible for the central processing unit CPU to perform the following write operations: writing to the PTEH register the logical space number and the logical address in effect in the event of a TLB miss; writing to the PTEL register the table entry for replacement; writing the base address to the TTB register; and writing to the TEA register the logical address in the event of a protection fault exception. In like manner, the CPU may also write to the MMUCR register various control data shown in FIG. 19 and may use specific bits as a counter.

The internal logical address bus VABUS is also connected to the control circuit CTRL and TLB. As mentioned earlier, the control circuit CTRL comprises a latch circuit for retaining the offset of the logical address that comes from the internal logical address bus VABUS. The CPU sends the logical address over the internal logical address bus VABUS to the TLB for use as the index address or search address. Alternatively, the latch circuit in the control circuit CTRL may accommodate not only the offset address but also the entire logical address.

FIG. 34 explicitly shows the TLB connected only to the PTEH register. The space number for the TLB miss-or-hit judgment is set in the PTEH register before being forwarded to the TLB. Where a TLB miss exception is handled, the PTEH register supplies the TLB with the logical address or its equivalent as described.

The internal data bus DBUS and internal physical address bus PABUS are connected to the external data bus DBUS and external address bus ABUS via external terminals TD and TA attached to the data processor. These external buses are connected illustratively to external memories RAM and ROM, as shown in FIG. 34. Typically, the external memory RAM may be a volatile memory in which various tables are formed as mentioned. The external memory ROM may illustratively be a nonvolatile memory where various programs (such as the handlers) are stored.

The effects and benefits of the above-described embodiments of the invention are recapitulated and itemized below.
(Memory Mapped TLB and Cache Memory)

The address array CA-ary of the cache memory CACHE-M is mapped in H'F0**** (H' means hexadecimal and an asterisk may be any number); the data array CD-ary of the cache memory is mapped in H'F1**; the address array TA-ary of the address translation buffer TLB is mapped in H'F2**; and the data array TD-ary of the TLB is mapped in H'F3****. The address format is determined so that the asterisk-filled part designates a line and a bank. With this address format in use, any line of any bank may be addressed as desired for any address array and data array in both the cache memory CACHE-M and the address translation buffer TLB. This scheme makes it possible for the cache memory CACHE-M and address translation buffer TLB to be accessed by use of common data transfer instructions such as the MOV instruction that is included in almost every instruction set. There is no need for dedicated instructions to access the address translation buffer TLB or cache memory CACHE-M for entry invalidation, U-bit read/write operation, etc. Therefore the types of instruction codes may be reduced and the instruction words may be shortened. In other words, with no need to adopt dedicated instructions to access the address translation buffer TLB, it is possible to suppress increases in the scale of logic circuits constituting the instruction decoder ID for decoding instructions inside the central processing unit CPU. It is also easy to deal with the architectural requirements of the microcomputer calling for a reduced instruction word length. For example, if the microcomputer MPU embodying the invention adopts 16-bit fixed length instructions, the instruction codes are regarded as a valuable resource because the codes are relatively short. Thus when the address translation buffer TLB is mapped in the address space and is made addressable, the scheme requires only limited changes in the hardware of the instruction decoder ID, with no need to add any new instruction code.

The above address format includes the association bit A designating an associative write operation if desired. The A bit makes it possible to determine whether or not to execute a write operation in the event of a match between the searched address information such as the address tag TAG and logical page number of the selected line on the one hand, and the corresponding search address information in the write data on the other. It is thus easy to deal with two different kinds of processing demands: for invalidating TLB entries that inherently require address compare operations, and for updating TLB entries with no need for address compare operations as in the case of device tests.
(Considering the Address Tag for Write Back Operations)

When the page size is smaller than the data storage capacity of a single bank in the cache memory, the embodiment utilizes the field of the address tag TAG large enough to accommodate all bits of the physical page corresponding to the page size in question. Physical address information is held in the field in excess of the number of the bits necessary for the address compare operation. This makes it possible to meet the requirements of both the address compare and the write back operation on the indexed cache entries. The feature is effective not only for the microcomputer capable of variably setting page sizes but also for a setup where a cache memory of a large data storage capacity needs to be incorporated.
(Supporting a Plurality of Page Sizes)

As shown in FIGS. 4 and 19, the page table entries and TLB entries each have the size bit SZ allowing the logical page size to be varied from one page to another. The four-way set associative address translation buffer TLB is shared between a plurality of logical page sizes that may be set variably. The microcomputer MPU embodying the invention supports two logical page sizes, 1 KB and 4 KB. The way to designate the index address for the address translation buffer TLB is common to the two logical page sizes. As illustrated in FIGS. 16 and 17, bits 12–16 (i.e., vpn) in the 32-bit logical address are used as the index to the address translation buffer TLB. The minimum logical page size is 1 KB, and the maximum logical page size is 4 KB (=2 multiplied by 2) which is also the number of banks (4 banks). Thus with the 1-KB page size, approximately as in the case of the 4-KB page size, the address translation buffer TLB as a whole may accommodate 128 entries of any logical page numbers.

As discussed with reference to FIG. 24, the number of bits for address compare operations for the hit-or-miss judgment must be varied in accordance with the logical page size. When the logical page size is 1 KB, the bits vpn (11-10) must be compared with the bits VPN (11-10), differently from the case of the logical page size being 4 KB. The address translation buffer TLB has the storage areas VPN (bits 31-17) and VPN (bits 11-10) covering all bits that may be compared, and also has a 22-bit storage area for accommodating the physical page number PPN. In the address translation buffer TLB, the data part of each entry has the size bit SZ indicating the logical page size supported. Depending on the value of the size bit SZ, the address translation buffer TLB varies the number of the bits used to perform address compare operations for the hit-or-miss judgment. As described with reference to FIG. 24, when the size bit SZ is set to 1 (logical page size =4 KB), the bits VPN (31-17) are compared with the corresponding bits in the logical address; when the size bit SZ is set to 0 (logical page size =1 KB), the bits VPN (31-17) and VPN (11-10) are compared with the corresponding bits in the logical address.

As outlined, where the total storage capacity of the real memory in the system is limited, the microcomputer selectively supporting a plurality of page sizes adopts a relatively small logical page size so as to readily meet the demand for boosting memory utilization factor in each process. In such cases, the maximum logical page size is determined by multiplying the minimum logical page size by 2 to the n-th power, and the number of banks for the set associative address translation buffer TLB is at least equal to the result of that multiply operation. With these conditions met, the address translation buffer TLB accommodates in principle the entries of any logical page numbers, whether or not the methods for designating the index address are unified into one for the maximum logical page size, and whether or not the selected logical page size is maximum or minimum. When the address translation buffer TLB supporting a plurality of page sizes is constituted by a set associative cache memory, the TLB thus implemented requires a chip area and a power consumption level about half as wide and half as high as the comparable buffer made of a CAM (content addressable memory).

(Supporting a Plurality of Indexing Methods)

Where a multiple virtual storage setup is supported to accommodate a plurality of processes each having its own address translation information and identified by a process number asid, there are two methods for designating the index address to the address translation buffer TLB. One method involves decoding only part of the logical address, as shown in FIG. 16. The other method involves decoding the result of getting an exclusive-OR gate XOR to qualify part of the logical address using part of the current process number asid, as depicted in FIG. 17. One of the two indexing methods is designated according to the logical value of the IX bit in the MMUCR register (MMUCR.IX). This makes it possible to select an optimum indexing method so as to minimize the lowering of the hit rate in the multiple virtual storage setup where many processes are activated in parallel. After part of the logical address is qualified by the process number asid of the process that utilizes the logical address in question, the qualified result is used to index the buffer memory of the multiple virtual storage setup. This minimizes the drop in the hit rate of the multiple virtual storage setup in which many processes are activated in parallel.

(Degree of Freedom of Replacement)

As described above, the address translation buffer TLB is built as a four-way set associative cache memory having banks BNK0 through BNK3 throughout which index addresses are made common. Where stored information in the multiple banks needs to be replaced illustratively in the event of a cache miss, the set to be replaced may be designated as needed by the central processing unit CPU executing an appropriate program. The RC field in the MMUCR register (MMUCR.RC) shown in FIG. 19 is a two-bit field in which to designate the desired bank. The value set in the RC field is decoded by the decoder 17 of FIG. 18, whereby a signal (one of BLS1 through BLS4) is generated to select one of the four banks BNK0 through BNK3. The signal thus generated selects one of the four banks BNK0 through BNK3 specified by the index address 2. The MMUCR.RC field is used as counting means such as a random counter. Multiplying the number of bits in the MMUCR.RC field by 2 to the n-th power equals the number of banks (=4) for the buffer memory. As discussed with reference to FIG. 27, the control circuit (CTRL) 50 increments by 1 the MMUCR.RC field when stored information in the address translation buffer TLB needs to be replaced (in the event of a TLB miss). The bank to be replaced is determined according to the following rules: if all banks have valid data in the indexed storage area (i.e., when each indexed entry has its V bit set to 1), the incremented result is regarded as the bank number of the bank to be replaced. If any one bank has no valid data in the indexed storage area (i.e., when any indexed entry has its V bit set to 0), the bank number of that bank is set to the MMUCR.RC field, and the bank whose bank number has thus been set is regarded as the bank to be replaced. At this point, the value of each bit in the MMUCR.RC field may be varied as needed by the central processing unit CPU executing an appropriate program. That is, the MMUCR.RC field is not limited functionally to the incrementing by 1 in the event of a TLB miss. The MMUCR.RC field may be updated in such a way that excludes a certain value. Furthermore, the central processing unit CPU may execute suitable algorithms to replace entries in a number of ways: randomly, on an FIFO (first-in, first-out) basis whereby the first loaded entry is the first to be replaced, or on an LRU (least recently used) basis whereby the last referenced entry is the first to be replaced. Thus a high degree of freedom is guaranteed in replacing entries through the update of the MMUCR.RC field.

Algorithms are thus not fixed for the replacement of entries in the address translation buffer TLB. The bank to be replaced may be determined as desired by program execution. Under this formula, it is easy to meet two typical needs: one for permanently keeping specific logical-physical address translation pairs in the address translation buffer TLB, the other for protecting certain entries from being replaced.

(Supporting Single and Multiple Virtual Storage)

The microcomputer embodying the invention allows one of two virtual storage types, multiple virtual storage and single virtual storage, to be selected. Multiple virtual storage involves qualifying or extending each logical address with a process number asid where each of a plurality of processes has individual address translation information covering the entire logical space. In contrast, single virtual storage involves not qualifying or extending each logical address with the process number asid where a plurality of processes are each assigned exclusively part of the logical address space and where each process has address translation information about the logical address space assigned thereto. One of the two virtual storage types is designated by the value of the MMUCR.SV bit shown in FIG. 19. The value of the MMUCR.SV bit is set as desired by the central processing unit CPU executing an appropriate program. The conceptual difference between single and multiple virtual storage was discussed earlier with reference to FIG. 32. Major points of difference between the two virtual storage types are illustrated in FIG. 31. As shown in FIG. 4, the address translation table TLB has each of its entries comprising not only the logical page number VPN and physical page number PPN but also the process number ASID in a dedicated field. The value of this field is used for a different purpose depending on whether single or multiple virtual storage is in effect. When the logical page corresponding to the process number held in a given TLB entry is banned from being shared by other processes, that process number ASID is used for the TLB hit-or-miss judgment of the address translation buffer TLB, as discussed with reference to FIG. 29. Thus a TLB hit is recognized only if the logical page number VPN in an entry of the address translation buffer TLB matches the logical page address vpn and if the process number ASID of the entry in question matches the current process number asid. In the single virtual storage setup, the process number ASID is used as memory protection information (domain information). If, in user mode, another process attempts to access the current page that is banned from being shared, a TLB protection fault exception is detected and handled by an appropriate handler.

Single and multiple virtual storage are selectively supported by having the value of the MMUCR.SV bit suitably set by the central processing unit CPU. This arrangement makes the address translation feature more convenient to use. Because the process number ASID for multiple virtual storage is used as memory protection information in the case of single virtual storage, complete memory protection is readily implemented for the single virtual storage setup.

Although the description above contains many specificities, these should not be construed as limiting the scope of the invention but as merely providing illustrations of the presently preferred embodiments of this invention. For example, the number of ways (i.e., banks) for the address translation buffer and cache memory may be greater than 5 (e.g., 8). The size of the address space supported by the microcomputer is not limited to 4 GB. The number of bits constituting the logical address may be determined correspondingly. Any page sizes may be supported, and the number of types of page sizes may be changed as needed. The logical page number VPN retained as a TLB entry is not limited structurally to one which excludes the bits for use as the index, as in the case of the above-described embodiments. Alternatively, all bits of the logical page number may be retained as a TLB entry.

The foregoing description has concentrated primarily on the single-chip microcomputer, an application which incorporates both the address translation buffer and the cache memory and which belongs to the inventors' technical field. However, this application is not limitative of the invention; the invention is applied extensively to any data processors having at least one of these two memory arrangements in addition to the central processing unit.

To sum up, the major advantages of the invention are as follows:

The cache memory and address translation buffer are accessed by use of common data transfer instructions such as the MOV instruction that is included in almost every instruction set. There is no need for dedicated instructions to access the address translation buffer or cache memory for entry invalidation and related operations. Therefore the types of instruction codes may be reduced and the instruction words may be shortened. With no need to adopt dedicated instructions to access the address translation buffer or cache memory, it is possible to suppress increases in the scale of logic circuits constituting the instruction decoder for decoding instructions inside the central processing unit.

It is also easy to deal with the architectural requirements of the microcomputer calling for a reduced instruction word length. Where the microcomputer embodying the invention adopts fixed length instructions made of a relatively small number of bits, the instruction codes are regarded as a valuable resource because the codes are relatively short. Thus when the address translation buffer or cache memory is mapped in the address space and is made addressable, the scheme requires only limited changes in the hardware of the instruction decoder, with no need to add any new instruction code.

The associative write operation is supported. That is, write operations are carried out in accordance with searched address information which is not considered if addressing is the only purpose. This arrangement guarantees an error-free entry invalidation operation.

The associative write operation may be banned from getting selected. This makes it possible to deal with device tests on the associative memory, i.e., tests for writing pre-determined logical value data to the memory under test and then verifying whether or not the same logical value data can be read from the memory.

When the page size is smaller than the data storage capacity of a single bank in the cache memory, the embodiment utilizes the field of the address tag TAG large enough to accommodate all bits of the physical page corresponding to the page size in question. Physical address information is held in the field in excess of the number of the bits necessary for the address compare operation. The arrangement meets the need, in the write back setup, to generate the entry write destination address using the address tag information of the entry in question (one to be replaced by a new entry), although there is no need to include the entire physical page address in the address tag from the viewpoint of associative operations on the cache memory. This makes it possible to accomplish both the address compare and the write back operation on the indexed cache entries in the face of growing data storage capacities and varying logical page sizes in the cache memory.

What is claimed is:

1. A data processor comprising:

a central processing unit generating addresses in an address space; and an address translation unit including an address translation buffer and a controller, wherein the address translation buffer includes a plurality of entries for address translation and is addressable in the address space of the central processing unit, wherein the controller is supplied with data and an address having an association bit from the central processing unit and the controller controls associative writing, and wherein the controller enables data to be written to a predetermined bit in an entry designated by an address from the central processing unit if a searched address information in an entry of the address translation buffer corresponds to information in the address from the central processing unit, and the controller inhibits data to be written to the predetermined bit in the entry designated by the address from the central processing unit if the searched address information in the entry of the address translation buffer does not correspond to the information in the address from the central processing unit, when an association bit of an address is in a first state.

2. The data processor according to claim 1, wherein the controller enables data to be written to the predetermined bit in the entry designated by the address from the central processing unit independent of whether the searched address information in the entry of the address translation buffer corresponds to information in the address from the central processing unit, when the association bit of the address is in a second state.

3. The data processor according to claim 2, wherein the predetermined bit comprises a bit for indicating whether the entry is valid.

4. The data processor according to claim 3, wherein the address translation unit includes a comparator that compares searched address information in the entry of the address translation buffer with information in the address from the central processing unit and outputs a hit signal when the searched address information in the entry of the address translation buffer corresponds to the information in the address from the central processing unit, wherein the controller includes a write control circuit supplying data to be written to the address translation buffer and a logic circuit supplied with the association bit and the hit signal and outputting either a first control signal or a second control signal to the write control circuit, wherein the logic circuit outputs the first control signal to the write control circuit when the association bit of the second state is supplied to the logic circuit, and the logic circuit outputs the first control signal to the write control circuit when the association bit of the first state and the hit signal are supplied to the logic circuit, and wherein the write control circuit supplies data to be written to the valid bit in the entry designated by the address from the central processing unit when the write control circuit is supplied with the first control signal, wherein the valid bit is rewritten by the data.

5. The data processor according to claim 4, wherein the logic circuit outputs the second control signal to the write control circuit when the association bit of the first state is supplied to the logic circuit if the hit signal is not supplied to the logic circuit, and wherein the write control circuit does not supply data to be written to the valid bit in the entry designated by the address from the central processing unit when the write control circuit is supplied with the second control signal, wherein the valid bit is not rewritten by the data.

6. The data processor according to claim 5, wherein the first state of the association bit comprises a logic "1", and the second state of the association bit comprises a logic "0".

7. The data processor according to claim 6, wherein first and second registers are designated by a MOVE instruction executed by the central processing unit, wherein the first register stores an address of one of the plurality of entries and the association bit, wherein the second register stores data to be written in the one of the plurality of entries.

8. The data processor according to claim 7, wherein the address translation unit comprises a set associative address translation unit.

9. A data processor comprising:

a central processing unit generating addresses in an address space and operable in a privileged mode and a user mode, wherein the central processing unit can execute a set of instructions in the privileged mode, wherein the central processing unit can execute only a subset of the set of instructions in the user mode; and an address translation unit including an address translation buffer and a controller, wherein the address translation buffer includes a plurality of entries for address translation and is addressable in the address space of the central processing unit, wherein the controller is supplied with data and an address having an association bit from the central processing unit and the controller controls associative writing in response to the central processing unit executing an instruction of the subset of instructions in the user mode, wherein the controller enables data to be written to a predetermined bit in an entry designated by an address from the central processing unit if a searched address information in an entry of the address translation buffer corresponds to information in the address from the central processing unit, and the controller inhibits data to be written to the predetermined bit in the entry designated by the address from the central processing unit if the searched address information in the entry of the address translation buffer does not correspond to the information in the address from the central processing unit, when an association bit of an address is in a first state.

10. The data processor according to claim 9, wherein the controller enables data to be written to the predetermined bit in the entry designated by the address from the central processing unit independent of whether the searched address information in the entry of the address translation buffer corresponds to information in the address from the central processing unit, when the association bit of the address is in a second state.

11. The data processor according to claim 10, wherein the predetermined bit comprises a bit for indicating whether the entry is valid.

12. The data processor according to claim 11, wherein the address translation unit includes a comparator that compares a searched address information in the entry of the address translation buffer with information in the address from the central processing unit and outputs a hit signal when the searched address information in the entry of the address translation buffer corresponds to the information in the address from the central processing unit, wherein the controller includes a write control circuit supplying data to be written to the address translation buffer and a logic circuit supplied with the association bit and the hit signal and outputting either a first control signal or a second control signal to the write control circuit, wherein the logic circuit outputs the first control signal to the write control circuit when the association bit of the second state is supplied to the logic circuit, and the logic circuit outputs the first control signal to the write control circuit when the association bit of the first state and the hit signal are supplied to the logic circuit, and wherein the write control circuit supplies data to be written to the valid bit in the entry designated by the address from the central processing unit when the write control circuit is supplied with the first control signal, wherein the valid bit is rewritten by the data.

13. The data processor according to claim 12, wherein the logic circuit outputs the second control signal to the write control circuit when the association bit of the first state is supplied to the logic circuit if the hit signal is not supplied to the logic circuit, wherein the write control circuit does not supply data to be written to the valid bit in the entry designated by the address from the central processing unit when the write control circuit is supplied with the second control signal, wherein the valid bit is not rewritten by the data.

14. The data processor according to claim 13, wherein the first state of the association bit comprises a logic "1", and the second state of the association bit comprises a logic "0".

15. The data processor according to claim 14, wherein the instruction of the subset of instructions executed by the central processing unit in the user mode is a MOVE instruction for instructing data transfer.

16. The data processor according to claim 15, wherein first and second registers are designated by the MOVE instruction, wherein the first register stores an address of one of the plurality of entries for address translation and the association bit, wherein the second register stores data to be written in the one of the plurality of entries for address translation.

17. The data processor according to claim 16, wherein the address translation unit comprises a set associative address translation unit.

18. A data processor comprising:

a central processing unit generating addresses in an address space and including a plurality of registers; and an address translation unit including an address translation buffer and a controller, wherein the address translation buffer includes a plurality of entries for address translation and is addressable in the address space of the central processing unit, wherein the controller is supplied with data stored in a first register of the plurality of registers and is supplied with an address including an association bit stored in a second register of the plurality of registers, wherein the controller controls associative writing in response to the central processing unit executing an instruction, and wherein the controller enables data stored in the first register to be written to a predetermined bit in an entry designated by the address stored in the second register if a searched address information in an entry of the address translation buffer corresponds to information in the address stored in the second register, and the controller inhibits data stored in the first register to be written to the predetermined bit in the entry of the address translation buffer if the searched address information in the entry of the address translation buffer does not correspond to the information in the address stored in the second register, when an association bit of an address is in a first state.

19. The data processor according to claim 18, wherein the controller enables data stored in the first register to be written to the predetermined bit in the entry designated by the address stored in the second register independent of whether the searched address information in the entry of the address translation buffer corresponds to information in the address stored in the second register, when the association bit of the address is in a second state.

20. The data processor according to claim 19,
wherein the predetermined bit comprises a bit for indicating whether the entry is valid.

21. The data processor according to claim 20,
wherein the address translation unit includes a comparator that compares a searched address information in the entry of the address translation buffer with information in the address stored in the second register and outputs a hit signal when the searched address information in the entry of the address translation buffer corresponds to the information in the address stored in the second register, wherein the controller includes a write control circuit supplying data to be written to the address translation buffer and a logic circuit supplied with the association bit and the hit signal and outputting either a first control signal or a second control signal to the write control circuit, wherein the logic circuit outputs the first control signal to the write control circuit when the association bit of the second state is supplied to the logic circuit, and the logic circuit outputs the first control signal to the write control circuit when the association bit of the first state and the hit signal are supplied to the logic circuit, and wherein the write control circuit supplies data to be written to the valid bit in the entry designated by the address stored in the second register when the write control circuit is supplied with the first control signal, wherein the valid bit is rewritten by the data.

22. The data processor according to claim 21,
wherein the logic circuit outputs the second control signal to the write control circuit when the association bit of the first state is supplied to the logic circuit if the hit signal is not supplied to the logic circuit, wherein the write control circuit does not supply data to be written to the valid bit in the entry designated by the address stored in the second register when the write control circuit is supplied with the second control signal, wherein the valid bit is not rewritten by the data.

23. The data processor according to claim 22,
wherein the first state of the association bit comprises a logic "1", and the second state of the association bit comprises a logic "0".

24. The data processor according to claim 23,
wherein the instruction executed by the central processing unit comprises a MOVE instruction for instructing data transfer.

25. The data processor according to claim 24,
wherein the address translation unit comprises a set associative address translation unit.

26. A data processor comprising:

a central processing unit generating addresses in an address space and including a plurality of registers; and an address translation unit including an address translation buffer and a controller, wherein the address translation buffer includes a plurality of entries for address translation and is addressable in the address space of the central processing unit, wherein the controller is supplied with data stored in a first register of the plurality of registers and is supplied with an address including an association bit stored in a second register of the plurality of registers, wherein the controller controls associative writing in response to the central processing unit executing a MOVE instruction for instructing data transfer, and wherein the controller enables the data stored in the first register to be written to a predetermined bit in an entry designated by the address stored in the second register if a searched address information in an entry of the address translation buffer corresponds to information in the address stored in the second register, and the controller inhibits the data stored in the first register to be written to the predetermined bit in the entry if the searched address information in the entry of the address translation buffer does not correspond to the information in the address stored in the second register, when an association bit of an address is in a first state.

27. The data processor according to claim 26, wherein the controller enables data stored in the first register to be written to the predetermined bit in the entry designated by the address stored in the second register independent of whether the searched address information in the entry of the address translation buffer corresponds to information in the address stored in the second register, when the association bit of the address is in a second state.

28. The data processor according to claim 22,
wherein the predetermined bit comprises a valid bit for indicating whether the entry is valid.

29. The data processor according to claim 28,
wherein the address translation unit includes a comparator that compares a searched address information in the entry of the address translation buffer with information in the address stored in the second register and outputs a hit signal when the searched address information in the entry of the address translation buffer corresponds to the information in the address stored in the second register, wherein the controller includes a write control circuit supplying data to be written to the address translation buffer and a logic circuit supplied with the association bit and the hit signal and outputting either a first control signal or a second control signal to the write control circuit, wherein the logic circuit outputs the first control signal to the write control circuit when the association bit of the second state is supplied to the logic circuit, and the logic circuit outputs the first control signal to the write control circuit when the association bit of the first state and the hit signal are supplied to the logic circuit, and wherein the write control circuit supplies data to be written to the valid bit in the entry designated by the address stored in the second register when the write control circuit is supplied with the first control signal, wherein the valid bit is rewritten by the data.

30. The data processor according to claim 29, wherein the logic circuit outputs the second control signal to the write control circuit when the association bit of the first state is supplied to the logic circuit if the hit signal is not supplied to the logic circuit, wherein the write control circuit does not supply data to be written to the valid bit in the entry designated by the address stored in second register when the write control circuit is supplied with the second control signal, wherein the valid bit is not rewritten by the data.

31. The data processor according to claim 30, wherein the first state of the association bit comprises a logic "1", and the second state of the association bit comprises a logic "0".

32. The data processor according to claim 31, wherein the address translation unit comprises a set associative address translation unit.

* * * * *

UNITED STATES PATENT AND TRADEMARK OFFICE
CERTIFICATE OF CORRECTION

PATENT NO.   : 5,835,963
DATED        : November 10, 1998
INVENTOR(S)  : Yoshioka, et al.

It is certified that error appears in the above-identified patent and that said Letters Patent is hereby corrected as shown below:

Title Page,
The Attorney, Agent or Firm should be -- Loudermilk -- instead of "Loudermille";

Column 38,
Line 25, first and second occurrence, delete "an" and insert -- the --;

Column 39,
Line 52 and 53, delete "an" and insert -- the --;

Column 41,
Line 15, first and second occurrence, delete "an" and insert -- the --;

Column 42,
Line 35, first and second occurrence, delete "an" and insert -- the --;

Column 42,
Line 44, delete "22" and insert -- 27 --.

Signed and Sealed this

Ninth Day of October, 2001

*Attest:*

NICHOLAS P. GODICI
*Attesting Officer*    *Acting Director of the United States Patent and Trademark Office*